US012550787B2

(12) United States Patent
Ishikawa et al.

(10) Patent No.: US 12,550,787 B2
(45) Date of Patent: Feb. 10, 2026

(54) BONDED ASSEMBLY CONTAINING BONDING PADS WITH METAL OXIDE BARRIERS AND METHODS FOR FORMING THE SAME

(71) Applicant: SANDISK TECHNOLOGIES LLC, Addison, TX (US)

(72) Inventors: Kensuke Ishikawa, Yokkaichi (JP); Fumitaka Amano, Yokkaichi (JP); Shingo Totani, Yokkaichi (JP); Linghan Chen, Nagoya (JP)

(73) Assignee: Sandisk Technologies, Inc., Milpitas, CA (US)

( * ) Notice: Subject to any disclaimer, the term of this patent is extended or adjusted under 35 U.S.C. 154(b) by 550 days.

(21) Appl. No.: 17/930,858

(22) Filed: Sep. 9, 2022

(65) Prior Publication Data

US 2023/0361069 A1  Nov. 9, 2023

Related U.S. Application Data

(63) Continuation-in-part of application No. 17/662,501, filed on May 9, 2022, now Pat. No. 12,456,699.

(51) Int. Cl.
*H01L 23/00* (2006.01)
*H01L 25/18* (2023.01)

(52) U.S. Cl.
CPC .............. *H01L 24/08* (2013.01); *H01L 24/05* (2013.01); *H01L 24/80* (2013.01); *H01L 25/18* (2013.01);
(Continued)

(58) Field of Classification Search
CPC ......... H01L 24/03; H01L 24/08; H01L 24/05; H01L 24/13; H01L 24/80; H01L 25/0657;
(Continued)

(56) References Cited

U.S. PATENT DOCUMENTS 10,088,076 B2  10/2018  Jaeb
10,847,408 B2  11/2020  Makala et al.
(Continued)

FOREIGN PATENT DOCUMENTS

CN  114078890 A  2/2022
TW  I792838 B  2/2023

OTHER PUBLICATIONS

USPTO Office Communication, Non-Final Office Action for U.S. Appl. No. 17/662,501, mailed on Dec. 18, 2024, 33 pages.
(Continued)

*Primary Examiner* — Jay C Kim
*Assistant Examiner* — Joshua Scott Wyatt
(74) *Attorney, Agent, or Firm* — THE MARBURY LAW GROUP PLLC

(57) ABSTRACT

A bonded assembly includes a first semiconductor die containing first semiconductor devices and a first bonding pad embedded within a first silicon oxide layer, where the first bonding pad includes a first copper containing portion, a second semiconductor die containing second semiconductor devices and a second bonding pad that is embedded within a second silicon oxide layer and is bonded to the first bonding pad via metal-to-metal bonding, where the second bonding pad includes a second copper containing portion, and at least one metal silicon oxide layer interposed between the first bonding pad and the second silicon oxide layer. In one embodiment, the at least one metal silicon oxide layer is a manganese silicon oxide layer.

20 Claims, 53 Drawing Sheets

(52) U.S. Cl.
CPC .... *H01L 24/13* (2013.01); *H01L 2224/05647* (2013.01); *H01L 2224/05649* (2013.01); *H01L 2224/08145* (2013.01); *H01L 2224/131* (2013.01); *H01L 2224/80379* (2013.01); *H01L 2224/80895* (2013.01); *H01L 2224/80896* (2013.01)

(58) Field of Classification Search
CPC ............... H01L 25/18; H01L 25/50; H01L 2224/05647; H01L 2224/05649; H01L 2224/08145; H01L 2224/131; H01L 2224/80379; H01L 2224/80894; H01L 2224/80895; H01L 2224/80896; H01L 2225/06527; H01L 2225/06541; H01L 2225/06544

See application file for complete search history.

(56) References Cited

U.S. PATENT DOCUMENTS

| | | | |
|---|---|---|---|
| 11,088,116 | B2 | 8/2021 | Wu et al. |
| 11,094,653 | B2 | 8/2021 | Wu et al. |
| 11,114,406 | B2 | 9/2021 | Kanakamedala et al. |
| 11,139,272 | B2 | 10/2021 | Makala et al. |
| 11,145,628 | B1 | 10/2021 | Sharangpani et al. |
| 11,201,139 | B2 | 12/2021 | Sharangpani et al. |
| 2017/0200756 | A1 | 7/2017 | Kao et al. |
| 2020/0395350 | A1* | 12/2020 | Wu ................... H01L 21/76224 |
| 2021/0028135 | A1 | 1/2021 | Said et al. |
| 2021/0028149 | A1 | 1/2021 | Makala et al. |
| 2021/0143115 | A1 | 5/2021 | Wu et al. |
| 2021/0159215 | A1 | 5/2021 | Wu et al. |
| 2021/0217716 | A1 | 7/2021 | Wu et al. |
| 2021/0296269 | A1 | 9/2021 | Sharangpani et al. |
| 2021/0296284 | A1 | 9/2021 | Sharangpani et al. |
| 2021/0296285 | A1 | 9/2021 | Sharangpani et al. |
| 2021/0320075 | A1 | 10/2021 | Hou et al. |
| 2021/0366855 | A1 | 11/2021 | Okina |
| 2021/0375790 | A1 | 12/2021 | Oda et al. |
| 2021/0375791 | A1 | 12/2021 | Oda et al. |

OTHER PUBLICATIONS

USPTO Office Communication, Non-Final Office Action for U.S. Appl. No. 17/662,493, dated on Apr. 18, 2025, 39 pages.
USPTO Office Communication, Final Office Action for U.S. Appl. No. 17/662,501, dated May 29, 2025, 20 pages.
Brongersma, S.H. et al. "Grain Growth, Stress, and Impurities in Electroplated Copper," Journal of Materials Research 17, 582-589 (2002). https://doi.org/10.1557/JMR.2002.0082.
Chen, Y. et al., "Chapter 5 -Post-CMP Cleaning," Handbook of Silicon Wafer Cleaning Technology (Third Edition), 2018, pp. 253-301, William Andrew Publishing. DOI.org/10.1016/B978-0-323-51084-4.00005-8.
Oliver, M.R.: Chemical-Mechanical Planarization of Semiconductor Materials (Springer Science & Business Media, Berlin, 2013), 5 Parts.
ISR—Notification of Transmittal of The International Search Report and Written Opinion of the International Searching Authority for International Patent Application No. PCT/US2023/016683, mailed Oct. 19, 2023, 14 pages.
Invitation to Pay Additional Fees and, Where Applicable, Protest Fee and Annex to Form PCT/ISA/206 Communication Relating to the Results of the Partial International Search for International Patent Application No. PCT/US2023/016683, mailed Sep. 11, 2023, 4 pages.
Patlolla, R. et al., "CMP Development for Ru Liner Structures Beyond 14nm," ECS J. Solid State Sci. & Technol., vol. 7, No. 8, pp. 397-401, (2018); DOI:10.1149/2.0181808jss.
Usui, T. et al., "Highly reliable copper dual-damascene interconnects with self-formed $MnSi_xO_y$ barrier Layer,". Electron Devices, IEEE Transactions, vol. 53, No. 10, pp. 2492-2499, (2006); http://hdl.handle.net/10097/34906.
Usui, T. et al., "Low resistive and highly reliable Cu dual-damascene interconnect technology using self-formed $MnSi_xO_y$ barrier layer," Proceedings of the IEEE 2005 International Interconnect Technology Conference, IITC, pp. 188-190, published Dec. 7, 2005.
U.S. Appl. No. 17/094,543, filed Nov. 10, 2020, SANDISK TECHNOLOGIES LLC.
U.S. Appl. No. 17/106,884, filed Nov. 30, 2020, SANDISK TECHNOLOGIES LLC.
U.S. Appl. No. 17/167,161, filed Feb. 4, 2021, SANDISK TECHNOLOGIES LLC.
U.S. Appl. No. 17/244,387, filed Apr. 29, 2021, SANDISK TECHNOLOGIES LLC.
U.S. Appl. No. 17/662,493, filed May 9, 2022, SANDISK TECHNOLOGIES LLC.
U.S. Appl. No. 17/662,501, filed May 9, 2022, SANDISK TECHNOLOGIES LLC.
U.S. Appl. No. 17/667,238, filed Feb. 8, 2022, SANDISK TECHNOLOGIES LLC.
Kamibayashi, T. et al., Study of 1um pitch Cu-Cu direct bonding structure with robust connectivity against bonding misalignment, in Proceedings of Advanced Metallization Conference 2021, 30th Asian Session.

* cited by examiner

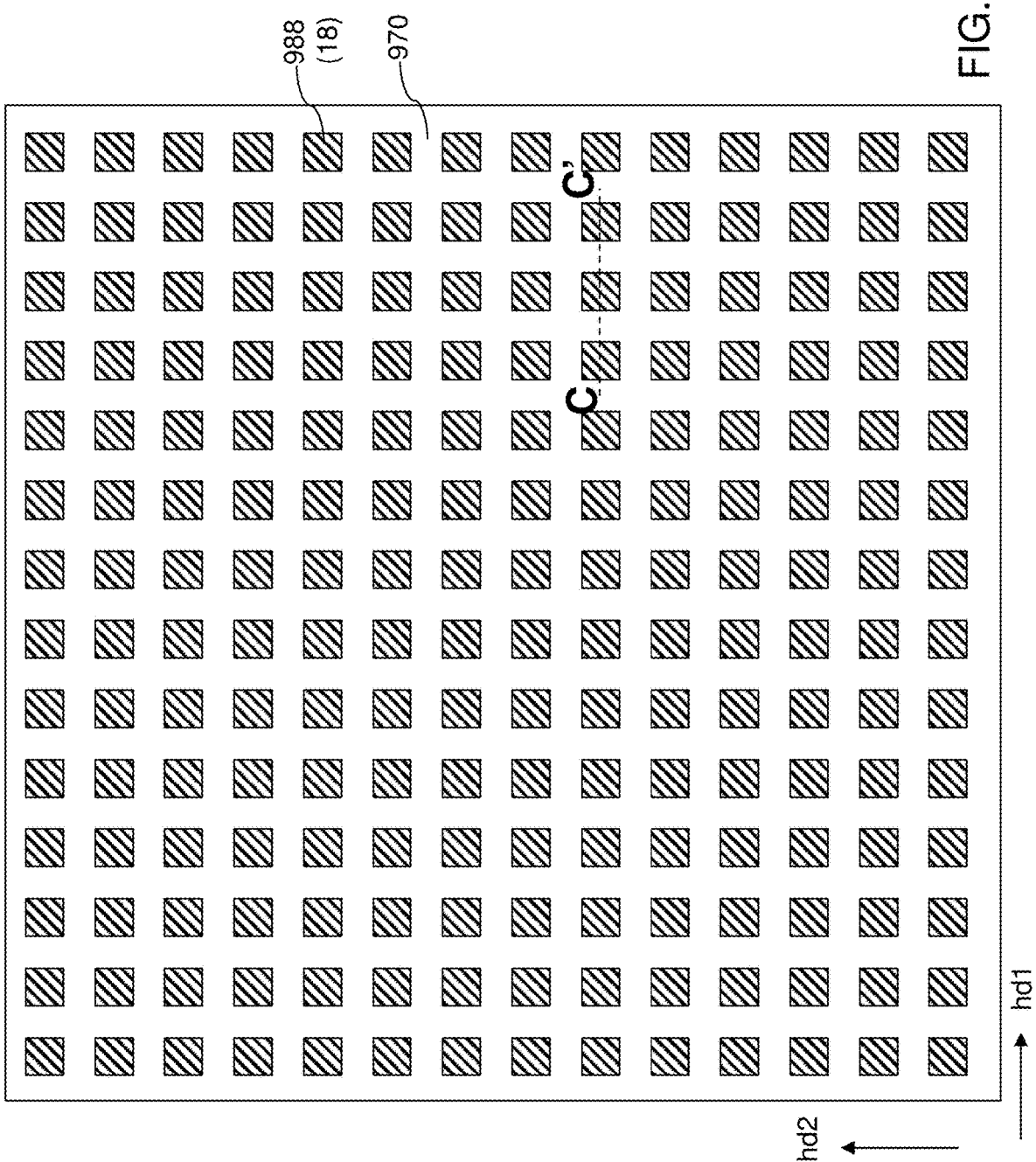

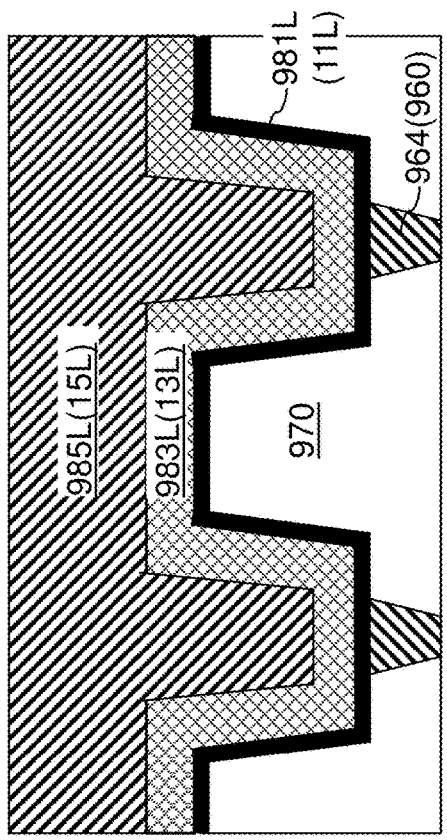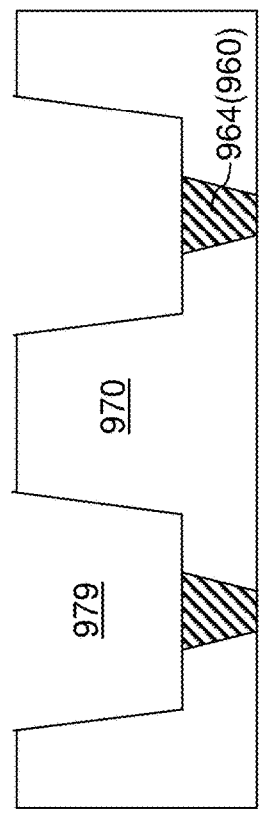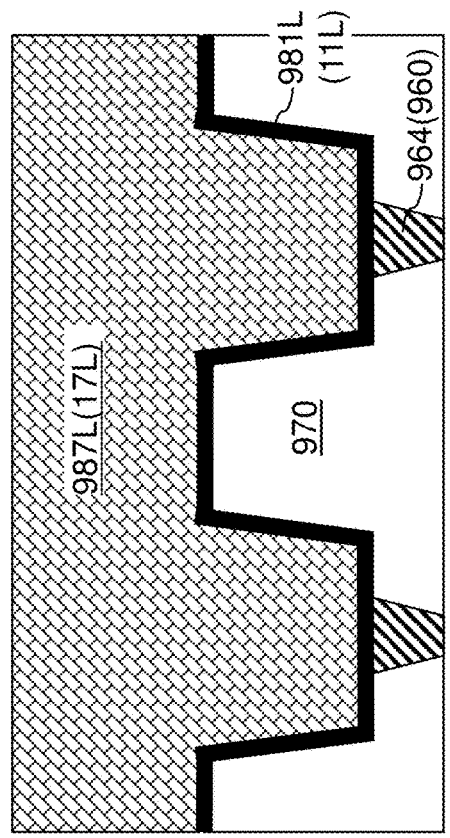

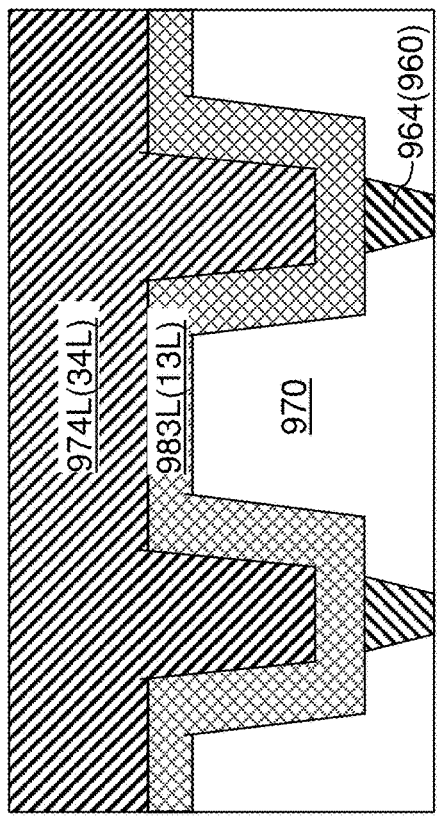
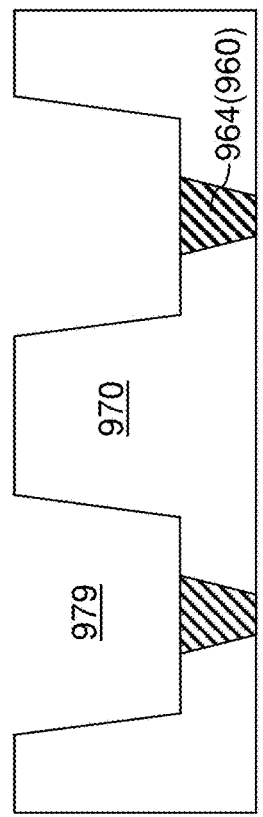
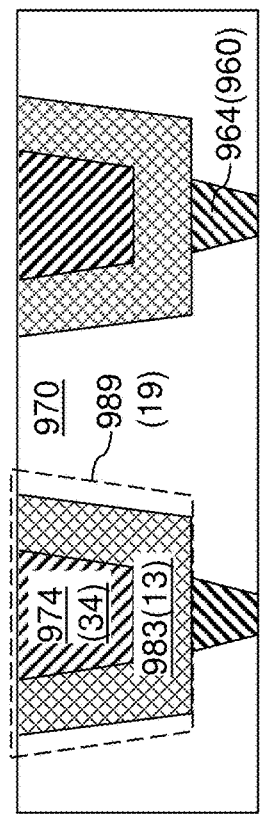
FIG. 21B
FIG. 21A
FIG. 21C

BONDED ASSEMBLY CONTAINING BONDING PADS WITH METAL OXIDE BARRIERS AND METHODS FOR FORMING THE SAME

RELATED APPLICATIONS

This application is a continuation-in-part (CIP) application of U.S. application Ser. No. 17/662,501 filed on May 9, 2022, the entire contents of which are incorporated herein by reference.

FIELD

The present disclosure relates generally to the field of semiconductor devices, and particularly to a semiconductor structure including a bonded assembly of semiconductor dies that are bonded via metal-to-metal bonding and methods for forming the same.

BACKGROUND

Process reliability and yield of copper-to-copper bonding between mating pairs of copper pads becomes more challenging as the dimensions of the copper pads decrease in advanced semiconductor technology generations. Reducing volumes of cavities between mating pairs of copper pads is desirable to improve copper-to-copper bonding during chip bonding.

SUMMARY

According to an aspect of the present disclosure, a bonded assembly includes a first semiconductor die containing first semiconductor devices and a first bonding pad embedded within a first silicon oxide layer, where the first bonding pad includes a first copper containing portion, a second semiconductor die containing second semiconductor devices and a second bonding pad that is embedded within a second silicon oxide layer and is bonded to the first bonding pad via metal-to-metal bonding, where the second bonding pad includes a second copper containing portion, and at least one metal silicon oxide layer interposed between the first bonding pad and the second silicon oxide layer. In one embodiment, the at least one metal silicon oxide layer is a manganese silicon oxide layer.

According to another aspect of the present disclosure, a method of forming a bonded assembly is provided, which comprises: providing a first semiconductor die comprising first semiconductor devices and a first bonding pad embedded within a first silicon oxide layer, wherein the first bonding pad comprises a first copper-manganese alloy portion; providing a second semiconductor die comprising second semiconductor devices and a second bonding pad that is embedded within a second silicon oxide layer, wherein the second bonding pad comprises a second copper-manganese alloy portion; and bonding the second bonding pad to the first bonding pad via metal-to-metal bonding while inducing outdiffusion of manganese atoms from at least one of the first copper-manganese alloy portion and the second copper-manganese alloy portion into at least one of the first silicon oxide layer and the second silicon oxide layer to form at least one manganese silicon oxide layer between at least the first bonding pad and the second silicon oxide layer.

According to an aspect of the present disclosure, a bonded assembly comprises a first semiconductor die comprising first semiconductor devices and a first bonding pad, wherein the first bonding pad comprises a first copper material portion and a first conductive barrier layer comprising a first conductive barrier material having a higher electrochemical potential than copper located between the first semiconductor devices and the first copper material portion, and a second semiconductor die comprising second semiconductor devices and a second bonding pad, wherein the second bonding pad comprises a second copper material portion and a second conductive barrier layer comprising a second conductive barrier material having a lower electrochemical potential than copper located between the second semiconductor devices and the second copper material portion. The second bonding pad is bonded to the first bonding pad.

According to another aspect of the present disclosure, a method of forming a bonded assembly is provided, which comprises: providing a first semiconductor die comprising first semiconductor devices, first metal interconnect structures embedded in first dielectric material layers and electrically connected to the first semiconductor devices, and a first bonding pad embedded in a first bonding-level dielectric layer and electrically connected to one of the first metal interconnect structures, wherein the first bonding pad comprises a first conductive barrier layer comprising a first conductive barrier material having a higher electrochemical potential than copper and a first copper material portion at least partially laterally surrounded by the first conductive barrier layer; providing a second semiconductor die comprising second semiconductor devices, second metal interconnect structures embedded in second dielectric material layers and electrically connected to the second semiconductor devices, and a second bonding pad embedded in a second bonding-level dielectric layer and electrically connected to one of the second metal interconnect structures, wherein the second bonding pad comprises a second conductive barrier layer comprising a second conductive barrier material having a lower electrochemical potential than copper and a second copper material portion at least partially laterally surrounded by the second conductive barrier layer; and bonding the second bonding pad to the first bonding pad by inducing copper-to-copper bonding between the second copper material portion and the first copper material portion.

According to an aspect of the present disclosure, a bonded assembly comprises a first semiconductor die comprising first semiconductor devices and a first bonding pad, wherein the first bonding pad comprises a first copper material portion containing (200) copper grains at a volume fraction of at least 10% and a first conductive barrier layer located between the first semiconductor devices and the first copper material portion, and a second semiconductor die comprising second semiconductor devices and a second bonding pad, wherein the second bonding pad comprises a second copper material portion and a second conductive barrier layer located between the second semiconductor devices and the second copper material portion. The second bonding pad is bonded to the first bonding pad.

According to another aspect of the present disclosure, a bonded assembly is provided, which comprises: a first semiconductor die comprising first semiconductor devices, first metal interconnect structures embedded in first dielectric material layers and electrically connected to the first semiconductor devices, and a first bonding pad embedded in a first bonding-level dielectric layer and electrically connected to one of the first metal interconnect structures, wherein the first bonding pad comprises a first conductive barrier layer and a first copper material portion at least partially laterally surrounded by the first conductive barrier layer and including (200) copper grains at a volume fraction of at least 10%; and a second semiconductor die comprising second semiconductor devices, second metal interconnect structures embedded in second dielectric material layers and electrically connected to the second semiconductor devices, and a second bonding pad embedded in a second bonding-level dielectric layer and electrically connected to one of the second metal interconnect structures, wherein the second bonding pad comprises a second conductive barrier layer and a second copper material portion at least partially laterally surrounded by the second conductive barrier layer and including (200) copper grains at a volume fraction not less than 10%, wherein the second bonding pad is bonded to the first bonding pad.

According to yet another aspect of the present disclosure, a method of forming a bonded assembly is provided, which comprises: providing a first semiconductor die comprising first semiconductor devices, first metal interconnect structures embedded in first dielectric material layers and electrically connected to the first semiconductor devices, and a first bonding pad embedded in a first bonding-level dielectric layer and electrically connected to one of the first metal interconnect structures, wherein the first bonding pad comprises a first conductive barrier layer and a first copper material portion laterally surrounded by the first conductive barrier layer and including (200) copper grains at a volume fraction not less than 10%; providing a second semiconductor die comprising second semiconductor devices, second metal interconnect structures embedded in second dielectric material layers and electrically connected to the second semiconductor devices, and a second bonding pad embedded in a second bonding-level dielectric layer and electrically connected to one of the second metal interconnect structures, wherein the second bonding pad comprises a second conductive barrier layer and a second copper material portion laterally surrounded by the second conductive barrier layer; and bonding the second bonding pad is bonded to the first bonding pad by inducing copper-to-copper bonding between the second copper material portion and the first copper material portion.

BRIEF DESCRIPTION OF THE DRAWINGS

FIG. 1D is a schematic top-down view of the first configuration of the memory die after formation of the memory-side bonding pads according to the first embodiment of the present disclosure.

FIGS. 18A-18E are sequential vertical cross-sectional views of a region around memory-side pad cavities during formation of memory-side bonding pads and formation of a second configuration of the third exemplary structure including a bonded assembly according to the third embodiment of the present disclosure.

FIGS. 21A-21E are sequential vertical cross-sectional views of a region around memory-side pad cavities during formation of memory-side bonding pads and formation of a first configuration of a fourth exemplary structure including a bonded assembly according to the fourth embodiment of the present disclosure.

DETAILED DESCRIPTION

Figure 1A:
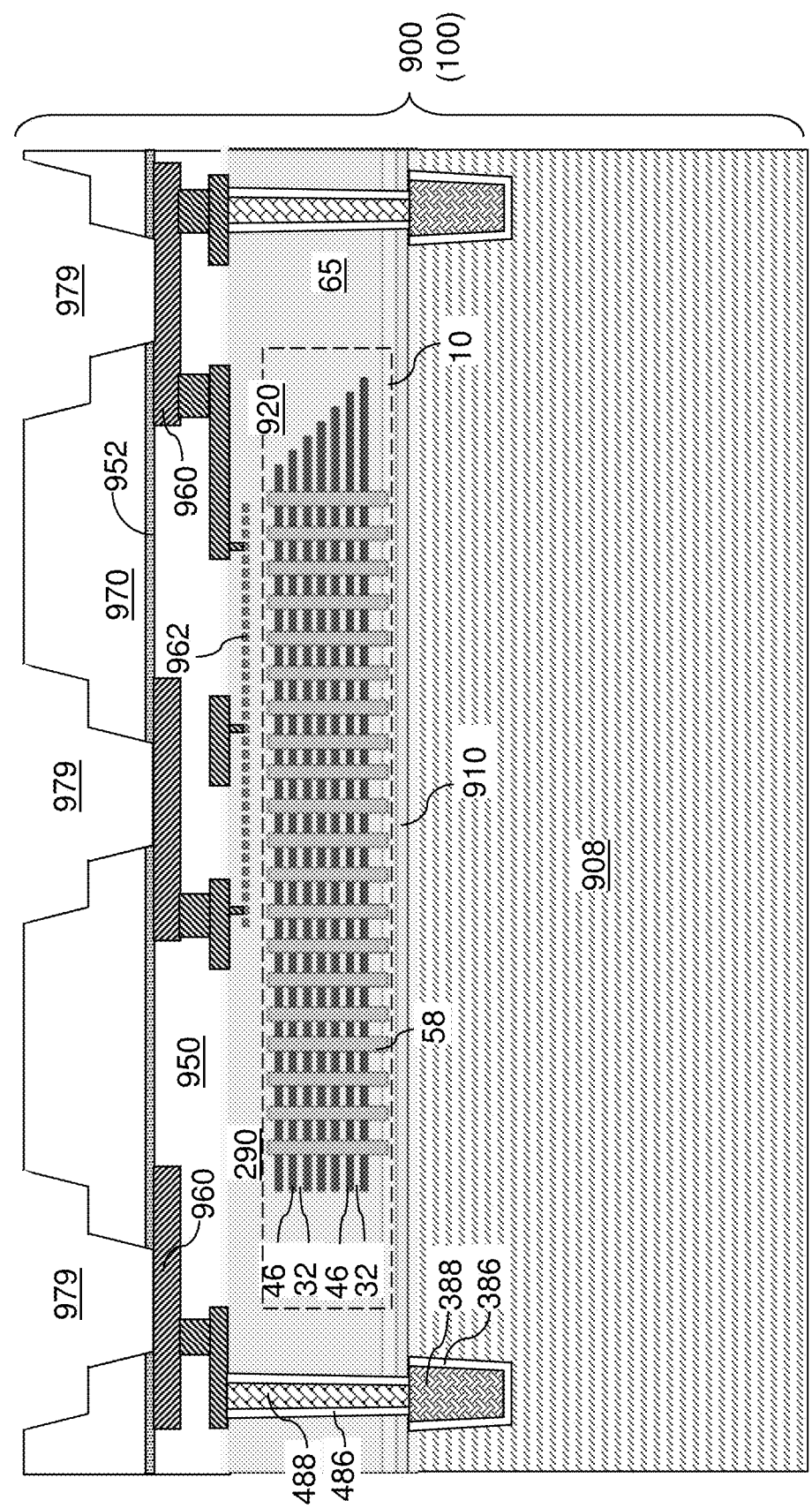
FIG. 1A is a schematic vertical cross-sectional view of a first configuration of a memory die after formation of memory-side pad cavities according to a first embodiment of the present disclosure.

The embodiments of the present disclosure are directed to a semiconductor structure including a bonded assembly of semiconductor dies that are bonded via metal-to-metal bonding and methods for forming the same. The different conductive barrier layers may be used in various embodiments to increase copper bonding yield for the bonded. The various aspects of embodiments of the present disclosure are described in detail herebelow.

The drawings are not drawn to scale. Multiple instances of an element may be duplicated where a single instance of the element is illustrated, unless absence of duplication of elements is expressly described or clearly indicated otherwise. Ordinals such as "first," "second," and "third" are used merely to identify similar elements, and different ordinals may be used across the specification and the claims of the instant disclosure. The term "at least one" element refers to all possibilities including the possibility of a single element and the possibility of multiple elements.

The same reference numerals refer to the same element or similar element. Unless otherwise indicated, elements having the same reference numerals are presumed to have the same composition and the same function. Unless otherwise indicated, a "contact" between elements refers to a direct contact between elements that provides an edge or a surface shared by the elements. If two or more elements are not in direct contact with each other or among one another, the two elements are "disjoined from" each other or "disjoined among" one another. As used herein, a first element located "on" a second element can be located on the exterior side of a surface of the second element or on the interior side of the second element. As used herein, a first element is located "directly on" a second element if there exist a physical contact between a surface of the first element and a surface of the second element. As used herein, a first element is "electrically connected to" a second element if there exists a conductive path consisting of at least one conductive material between the first element and the second element. As used herein, a "prototype" structure or an "in-process" structure refers to a transient structure that is subsequently modified in the shape or composition of at least one component therein.

As used herein, a "layer" refers to a material portion including a region having a thickness. A layer may extend over the entirety of an underlying or overlying structure, or may have an extent less than the extent of an underlying or overlying structure. Further, a layer may be a region of a homogeneous or inhomogeneous continuous structure that has a thickness less than the thickness of the continuous structure. For example, a layer may be located between any pair of horizontal planes between, or at, a top surface and a bottom surface of the continuous structure. A layer may extend horizontally, vertically, and/or along a tapered surface. A substrate may be a layer, may include one or more layers therein, or may have one or more layer thereupon, thereabove, and/or therebelow.

As used herein, a first surface and a second surface are "vertically coincident" with each other if the second surface overlies or underlies the first surface and there exists a vertical plane or a substantially vertical plane that includes the first surface and the second surface. A substantially vertical plane is a plane that extends straight along a direction that deviates from a vertical direction by an angle less than 5 degrees. A vertical plane or a substantially vertical plane is straight along a vertical direction or a substantially vertical direction, and may, or may not, include a curvature along a direction that is perpendicular to the vertical direction or the substantially vertical direction.

As used herein, a "memory level" or a "memory array level" refers to the level corresponding to a general region between a first horizontal plane (i.e., a plane parallel to the top surface of the substrate) including topmost surfaces of an array of memory elements and a second horizontal plane including bottommost surfaces of the array of memory elements. As used herein, a "through-stack" element refers to an element that vertically extends through a memory level.

As used herein, a "semiconducting material" refers to a material having electrical conductivity in the range from $1.0 \times 10^{-5}$ S/m to $1.0 \times 10^{5}$ S/m. As used herein, a "semiconductor material" refers to a material having electrical conductivity in the range from $1.0 \times 10^{-5}$ S/m to 1.0 S/m in the absence of electrical dopants therein, and is capable of producing a doped material having electrical conductivity in a range from 1.0 S/m to $1.0 \times 10^{5}$ S/m upon suitable doping with an electrical dopant. As used herein, an "electrical dopant" refers to a p-type dopant that adds a hole to a valence band within a band structure, or an n-type dopant that adds an electron to a conduction band within a band structure. As used herein, a "conductive material" refers to a material having electrical conductivity greater than $1.0 \times 10^{5}$ S/m. As used herein, an "insulator material" or a "dielectric material" refers to a material having electrical conductivity less than $1.0 \times 10^{-5}$ S/m. As used herein, a "heavily doped semiconductor material" refers to a semiconductor material that is doped with electrical dopant at a sufficiently high atomic concentration to become a conductive material either as formed as a crystalline material or if converted into a crystalline material through an anneal process (for example, from an initial amorphous state), i.e., to have electrical conductivity greater than $1.0 \times 10^{5}$ S/m. A "doped semiconductor material" may be a heavily doped semiconductor material, or may be a semiconductor material that includes electrical dopants (i.e., p-type dopants and/or n-type dopants) at a concentration that provides electrical conductivity in the range from $1.0 \times 10^{-5}$ S/m to $1.0 \times 10^{5}$ S/m. An "intrinsic semiconductor material" refers to a semiconductor material that is not doped with electrical dopants. Thus, a semiconductor material may be semiconducting or conductive, and may be an intrinsic semiconductor material or a doped semiconductor material. A doped semiconductor material may be semiconducting or conductive depending on the atomic concentration of electrical dopants therein. As used herein, a "metallic material" refers to a conductive material including at least one metallic element therein. All measurements for electrical conductivities are made at the standard condition.

Generally, a semiconductor package (or a "package") refers to a unit semiconductor device that may be attached to a circuit board through a set of pins or solder balls. A semiconductor package may include a semiconductor chip (or a "chip") or a plurality of semiconductor chips that are bonded throughout, for example, by flip-chip bonding or another chip-to-chip bonding. A package or a chip may include a single semiconductor die (or a "die") or a plurality of semiconductor dies. A die is the smallest unit that may independently execute external commands or report status. Typically, a package or a chip with multiple dies is capable of simultaneously executing as many external commands as the total number of planes therein. Each die includes one or more planes. Identical concurrent operations may be executed in each plane within a same die, although there may be some restrictions. In case a die is a memory die, i.e., a die including memory elements, concurrent read operations, concurrent write operations, or concurrent erase operations may be performed in each plane within a same memory die. In a memory die, each plane contains a number of memory blocks (or "blocks"), which are the smallest unit that may be erased by in a single erase operation. Each memory block contains a number of pages, which are the smallest units that may be selected for programming. A page is also the smallest unit that may be selected to a read operation.

Referring to FIG. 1A, a memory die 900 is illustrated. First-type bonding pads, which are also referred to as first bonding pads, can be subsequently formed on the memory die 900. In this case, the memory die 900 can be referred to as a first-type semiconductor die, or as a first semiconductor die 100. The memory die 900 includes a memory-side substrate 908, memory-side semiconductor devices 920 overlying the memory-side substrate 908, memory-side dielectric material layers (290, 950) located on the memory-side semiconductor devices, and memory-side metal interconnect structures 960 embedded in the memory-side dielectric material layers (290, 950). In one embodiment, the memory-side substrate 908 may be a portion of a commercially available silicon wafer having a thickness in a range from 500 microns to 1 mm. In one embodiment, a plurality of first semiconductor dies 100 can be provided on the memory-side substrate 908, which may be a single crystal silicon wafer, or another suitable substrate.

Optional discrete substrate recess cavities can be formed in an upper portion of the memory-side substrate 908 by applying a photoresist layer over the top surface of the memory-side substrate 908, lithographically patterning the photoresist layer to form an array of discrete openings, and transferring the pattern of the array of discrete openings into the upper portion of the memory-side substrate by performing an anisotropic etch process. The photoresist layer can be subsequently removed, for example, by ashing. The depth of each discrete substrate recess cavity can be in a range from 500 nm to 10,000, although lesser and greater depths can also be employed. Optional through-substrate liner 386 and optional through-substrate via structure 388 can be formed within each discrete substrate recess cavity.

Generally, the memory-side semiconductor devices 920 may comprise any semiconductor device known in the art. In one embodiment, the memory die 900 comprises a memory die, and may include memory devices, such as a three-dimensional NAND memory device. In an illustrative example, the memory-side semiconductor devices 920 may include a vertically alternating stack of insulating layers 32 and electrically conductive layers 46, and a two-dimensional array of memory openings vertically extending through the vertically alternating stack (32, 46). The electrically conductive layers 46 may comprise word lines of the three-dimensional NAND memory device.

A memory opening fill structure 58 may be formed within each memory opening. A memory opening fill structure 58 may include a memory film and a vertical semiconductor channel contacting the memory film. The memory film may include a blocking dielectric, a tunneling dielectric and a charge storage material located between the blocking and tunneling dielectric. The charge storage material may comprise charge trapping layer, such as a silicon nitride layer, or a plurality of discrete charge trapping regions, such as floating gates or discrete portions of a charge trapping layer. In this case, each memory opening fill structure 58 and adjacent portions of the electrically conductive layers 46 constitute a vertical NAND string. Alternatively, the memory opening fill structures 58 may include any type of non-volatile memory elements such as resistive memory elements, ferroelectric memory elements, phase change memory elements, etc. The memory device may include an optional horizontal semiconductor channel layer 10 connected to the bottom end of each vertical semiconductor channel, and an optional dielectric spacer layer 910 that provides electrical isolation between the memory-side substrate 908 and the horizontal semiconductor channel layer 10.

The electrically conductive layers 46 may be patterned to provide a terrace region in which each overlying electrically conductive layer 46 has a lesser lateral extent than any underlying electrically conductive layer 46. Contact via structures (not shown) may be formed on the electrically conductive layers 46 in the terrace region to provide electrical connection to the electrically conductive layers 46. Dielectric material portions 65 may be formed around each vertically alternating stack (32, 46) to provide electrical isolation between neighboring vertically alternating stacks (32, 46).

Through-memory-level via cavities can be formed through the dielectric material portions 65, the optional dielectric spacer layer 910, and the horizontal semiconductor channel layer 10. An optional through-memory-level dielectric liner 486 and a through-memory-level via structure 488 can be formed within each through-memory-level via cavity. Each through-memory-level dielectric liner 486 includes a dielectric material such as silicon oxide. Each through-memory-level via structure 488 can be formed directly on a respective one of the through-substrate via structure 388.

The memory-side dielectric material layers (290, 950) may include memory-side proximal dielectric material layers 290 embedding contact via structures and bit lines 962 and memory-side distal dielectric material layers 950 that embed a subset of the memory-side metal interconnect structures 960 located above the memory-side proximal dielectric material layers 290. As used herein, a "proximal" surface refers to a surface that is close to a substrate, and a "distal" surface refers to a surface that is distal from the substrate. In the memory die 900, a proximal surface refers to a surface that is close to the memory-side substrate 908, and a distal surface refers to a surface that is distal from the memory-side substrate 908.

The bit lines 962 may electrically contact drain regions located above the semiconductor channel at the top of the memory opening fill structures 58. The contact via structures contact various nodes of the memory-side semiconductor devices, such as the electrically conductive layers 46 (e.g., word lines and select gate electrodes). Generally, the memory-side metal interconnect structures 960 can be electrically connected to the memory-side semiconductor devices 920.

Each of the memory-side proximal dielectric material layers 290 and the memory-side distal dielectric material layers 950 may include a dielectric material such as undoped silicate glass, a doped silicate glass, organosilicate glass, silicon nitride, a dielectric metal oxide, or a combination thereof. The memory-side distal dielectric material layers 950 may include one or more dielectric diffusion barrier layers (not expressly shown). In this case, each dielectric diffusion barrier layer embedded in the memory-side distal dielectric material layers 950 may include silicon carbon nitride (i.e., silicon carbonitride "SiCN", which is also referred to silicon carbide nitride), silicon nitride ($Si_3N_4$), silicon oxynitride, or any other dielectric material that is effective in blocking diffusion of copper. In one embodiment, each dielectric diffusion barrier layer embedded in the memory-side distal dielectric material layers 950 may include a dielectric material having a dielectric constant less than 5, such as SiCN having a dielectric constant of about 3.8, to reduce RC delay of the memory-side metal interconnect structures 960. Each dielectric diffusion barrier layer may have a thickness in a range from 10 nm to 30 nm.

An optional memory-side dielectric diffusion barrier layer 952 can be formed over the memory-side dielectric material layers (290, 950). The memory-side dielectric diffusion barrier layer 952 can include a dielectric material that blocks copper diffusion. In one embodiment, the memory-side dielectric diffusion barrier layer 952 can include silicon nitride, silicon carbon nitride, silicon oxynitride, or a stack thereof. The thickness of the memory-side dielectric diffusion barrier layer 952 can be in a range from 5 nm to 50 nm, although lesser and greater thicknesses can also be employed.

A memory-side bonding-level dielectric layer 970 can be formed over the memory-side dielectric diffusion barrier layer 952. In case first bonding pads are subsequently formed in the memory-side bonding-level dielectric layer 970, the memory-side bonding-level dielectric layer 970 is herein referred to as a first bonding-level dielectric layer. Optionally, the memory-side bonding-level dielectric layer 970 may include a dielectric material that permits dielectric-to-dielectric bonding. The memory-side bonding-level dielectric layer 970 may include, and/or consist essentially of, undoped silicate glass (i.e., silicon oxide), a doped silicate glass, organosilicate glass, silicon nitride, or a dielectric metal oxide. The thickness of the memory-side bonding-level dielectric layer 970 may be in a range from 300 nm to 3,000 nm, although lesser and greater thicknesses may also be employed. The memory-side bonding-level dielectric layer 970 may have a planar top surface.

A photoresist layer (not shown) can be applied over the memory-side bonding-level dielectric layer 970, and can be lithographically patterned to form discrete openings in each area in which first bonding pads are to be subsequently formed. In one embodiment, the first bonding pads may have shape similar to a mushroom including a lower via (e.g., stem) portion and an upper plate (e.g., cap) portion having a greater lateral dimension than the lower via portion. In this case, discrete opening in the photoresist layer can have shapes of the lower via portions of the first bonding pads. A first anisotropic etch process can be performed to transfer the pattern of the openings in the photoresist layer into an upper portion of the memory-side bonding-level dielectric layer 970. Recess cavities can be formed within unmasked areas in the upper portion of the memory-side bonding-level dielectric layer 970. The photoresist layer may be subsequently isotropically trimmed to increase the size of each opening in the photoresist layer. Alternatively, the photoresist layer may be removed and a new photoresist layer may be applied and patterned over the memory-side bonding-level dielectric layer 970 to form larger openings having peripheries that are laterally offset outward from a periphery of a respective recess cavity in the upper portion of the memory-side bonding-level dielectric layer 970. A second anisotropic etch process can be performed to etch portions of the memory-side bonding-level dielectric layer 970 that are not covered by the photoresist layer. Memory-side pad cavities 979 are formed through the memory-side bonding-level dielectric layer 970 underneath discrete openings in the photoresist layer. The photoresist layer may be subsequently removed, for example, by ashing.

Yet alternatively, the first bonding pads may be formed with a respective straight sidewall that vertically extends from a top surface of the memory-side bonding-level dielectric layer 970 to a bottom surface of the memory-side bonding-level dielectric layer 970. In this case, the memory-side pad cavities 979 may be formed by applying and patterning a photoresist layer, and by removing portions of the memory-side bonding-level dielectric layer 970 by performing an anisotropic etch process. In other words, a combination of a single lithographic patterning process and a single anisotropic etch process may be employed to form the memory-side pad cavities 979 with straight sidewall(s). In one embodiment, a lateral dimension (such as a diameter or a lateral distance between facing sides of a periphery) of each opening in the photoresist layer may be in a range from 200 nm to 30 microns, such as from 400 nm to 20 microns, although lesser and greater dimensions may also be employed.

A top surface of a respective memory-side metal interconnect structure 960 can be physically exposed at the bottom of each memory-side pad cavity 979. In one embodiment, each memory-side pad cavity 979 can have a top periphery having a horizontal cross-sectional shape of a rectangle or a rounded rectangle. A maximum lateral dimension of each memory-side pad cavity 979 may be in a range from 200 nm to 30 microns, such as from 400 nm to 10 microns, although lesser and greater dimensions may also be employed. Sidewalls of the memory-side pad cavities 979 may be vertical, or may have a taper angle greater than 0 degree and less than 30 degrees (such as a taper angle in a range from 3 degrees to 10 degrees) with respect to the vertical direction. In case first bonding pads (e.g., first-type bonding pads) are subsequently formed in the memory-side pad cavities 979, the memory-side pad cavities 979 are herein referred to as first pad cavities.

Figure 1B:
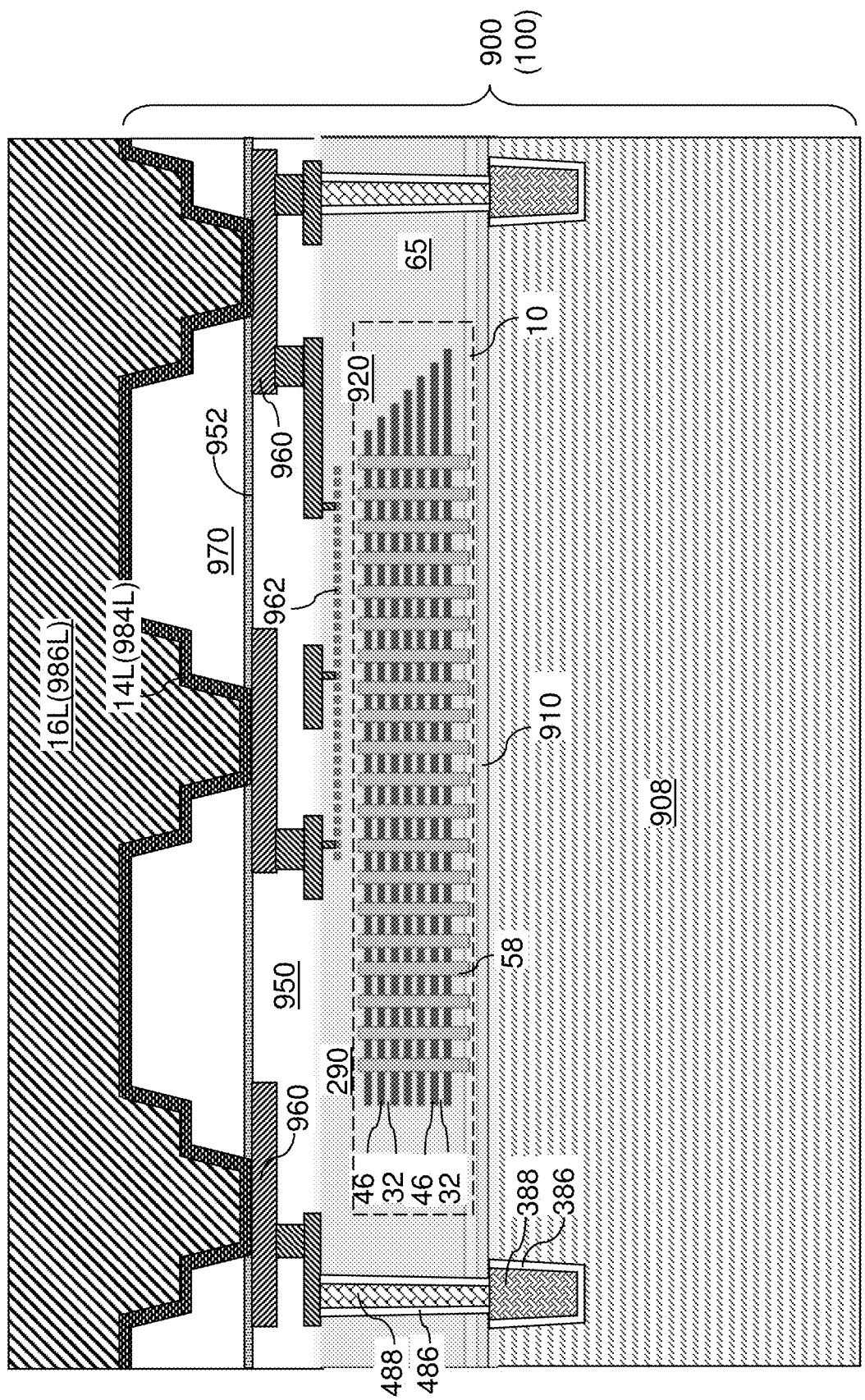
FIG. 1B is a schematic vertical cross-sectional view of the first configuration of the memory die after formation of a memory-side conductive barrier layer and a memory-side copper layer according to the first embodiment of the present disclosure.

Referring to FIG. 1B, a memory-side conductive (i.e., electrically conductive) barrier layer 984L and a memory-side copper layer 986L can be sequentially deposited in the memory-side pad cavities 979. In one embodiment, the memory-side conductive barrier layer 984L may be formed as a first-type conductive barrier layer, which is herein referred to as a first conductive barrier layer 14L. In this case, the memory-side copper layer 986L is formed on the first conductive barrier layer 14L, and is herein referred to as a first copper layer 16L.

According to an aspect of the present disclosure, the first conductive barrier layer 14L comprises, and/or consists essentially of, a first conductive barrier material having a higher electrochemical potential than copper. Electrochemical potential is the mechanical work done in bringing 1 mole of an ion from a standard state to a specified concentration and electrical potential. International Union of Pure and Applied Chemistry defines the electrochemical potential as the partial molar Gibbs energy of a substance at the specified electric potential, where the substance is in a specified phase. In the present disclosure, all electric potentials are zero, and all materials are in a solid phase for the purpose of calculation of electrochemical potential. Generally, electrochemical potential can be expressed as:

$$\bar{\mu}_i = \mu_i + z_i F \Phi$$

in which $\bar{\mu}_i$ is the electrochemical potential of species i, in J/mol, $\mu_i$ is the chemical potential of the species i, in J/mol, $z_i$ is the valency (charge) of the ion i, a dimensionless integer, F is the Faraday constant, in C/mol, $\Phi$ is the local electrostatic potential, in V. In the special case of an uncharged atom, $z_i=0$, and so $\bar{\mu}_i=\mu_i$, which is the case for all materials under discussion in the present disclosure. In other words, the electrochemical potential for all material portions of the present disclosure is the chemical potential of a respective material portion for the purpose of the present disclosure because all material portions are at an equipotential state.

Non-limiting examples of electrically conductive materials that provide higher electrochemical potential than copper and provide suitable adhesion strength to a dielectric material (such as silicon oxide) of the first bonding-level dielectric layer (such as the memory-side bonding-level dielectric layer 970) comprise cobalt, tantalum, or tantalum nitride. In one embodiment, the first conductive barrier layer 14 consists essentially of a material selected from cobalt, tantalum, or tantalum nitride. The thickness of the first conductive barrier layer 14L (e.g., the memory-side conductive barrier layer 984L) may be in a range from 3 nm to 30 nm, such as from 6 nm to 20 nm, although lesser and greater thicknesses can also be employed.

The first copper layer 16L (e.g., memory-side copper layer 986L) may consist essentially of copper. The first copper layer 16L may be formed by depositing a copper seed layer (which is a lower surface portion of the first copper layer 16L) employing a physical vapor deposition process, and by depositing a copper fill material layer employing electroplating. The thickness of the copper seed layer may be in a range from 10 nm to 100 nm, and the thickness of the copper fill material layer, and measured over the top surface of the first bonding-level dielectric layer, may be in a range from 300 nm to 6,000 nm, although lesser and greater thicknesses may also be employed.

Figure 1C:
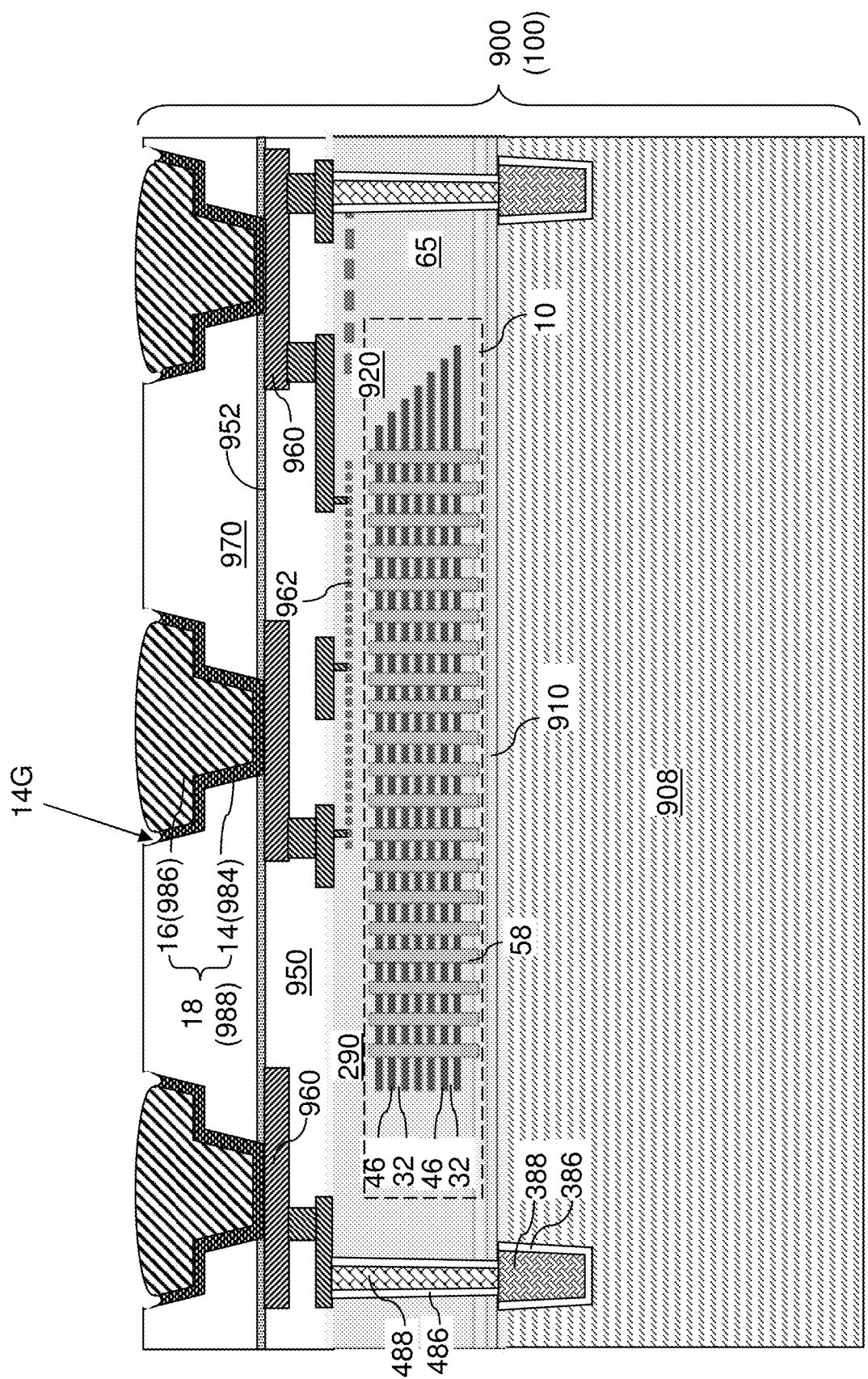
FIG. 1C is a schematic vertical cross-sectional view of the first configuration of the memory die along plane C-C' in FIG. 1D after formation of memory-side bonding pads according to the first embodiment of the present disclosure.

Referring to FIGS. 1C and 1D, a first chemical mechanical polishing (CMP) process can be performed to remove portions of the first copper layer 16L (e.g., the memory-side copper layer 986L) and the first conductive barrier layer 14L (e.g., the memory-side conductive barrier layer 984L) from above the top surface of the first bonding-level dielectric layer (e.g., the memory-side bonding-level dielectric layer 970). Each remaining portion of the first copper layer 16L comprises the first copper material portion 16. Each remaining portion of the first conductive barrier layer 14L comprises a first conductive barrier layer 14. Each first copper material portion 16 in this embodiment is a memory-side copper material portion 986. Each first conductive barrier layer 14L in this embodiment is a memory-side conductive barrier layer 984 embedded within the memory-side bonding dielectric layer 970. Each contiguous combination of a first conductive barrier layer 14 and a first copper material portion 16 constitutes a first bonding pad 18, which in this embodiment is a memory-side bonding pad 988.

Generally, first bonding pads 18 embedded in a first bonding-level dielectric layer (such as the memory-side bonding-level dielectric layer 970) and electrically connected to a respective one of the first metal interconnect structures (such as the memory-side metal interconnect structures 960) are formed. Each of the first bonding pads 18 comprises a first conductive barrier layer 14 including, and/or consisting essentially of, a first conductive barrier material having a higher electrochemical potential than copper. Each of the first bonding pads 18 comprises a first copper material portion 16 laterally surrounded by the first conductive barrier layer 14.

The first chemical mechanical polishing process proceeds under a condition in which the first conductive barrier material of the first conductive barrier layer 14 has a higher electrochemical potential than copper of the first copper material portion 16 within each first bonding pad 18. Generally, dissimilar metals and alloys have different electrode potentials due to the differences in electrochemical potentials. When two or more conductors having different electrochemical potentials come into contact in an electrolyte, such as a slurry in a chemical mechanical polishing process, the more reactive conductor acts as anode and the less reactive conductor acts as cathode for a galvanic reaction. During the first chemical mechanical polishing process, the first conductive barrier layer 14 functions as an anode, and the first copper material portion 16 functions as a cathode. Electrons flow (i.e., current flows) from the first conductive barrier layer 14 to the first copper material portion 16 within each first bonding pad 18. The first conductive barrier layer 14 is positively charged, and surface portions of the first conductive barrier layer 14 in contact with the slurry generate positive ions of the metal within the first conductive barrier layer 14. As a consequence, metal ions at the surface of the first conductive barrier layer 14 that contact the slurry dissociate from the first conductive barrier layer 14, and diffuse into the slurry during the first chemical mechanical polishing process. A moat-shaped groove region 14G, which is also referred to as a "fang region," can be formed in an upper portion of each first conductive barrier layer 14 that is physically exposed to the slurry during the first chemical mechanical polishing process.

A concave top surface of the first conductive barrier layer 14 is vertically recessed relative to a periphery of a top surface of and adjoining portion of the first copper material portion 16 within each moat-shaped groove 14G. The moat-shaped groove 14G is formed around the first copper material portion 16 such that the moat-shaped groove 14G encircles the periphery of an upper region of the first copper material portion 16. The depth of each moat-shaped groove 14G, as measured along the vertical direction from the horizontal plane including the top surface of the first bonding-level dielectric layer to the deepest point in the moat-shaped groove 14G, may be in a range from 1 nm to 20 nm, such as from 2 nm to 10 nm, although lesser and greater depths may also be employed.

In one embodiment, a top surface of each first copper material portion 16 may be formed with a convex vertical cross-sectional profile such that a center region of the top surface protrudes farther outward from the horizontal plane including the bottom surface of the first bonding-level dielectric layer than a peripheral region of the top surface of first copper material portion 16. The loss of material from the first conductive barrier layer 14 within each first bonding pad 18 causes the generally convex profile of the top surface of the first copper material portion 16. In one embodiment, at least 50% of the area of the top surface of each first copper material portion 16 may protrude outward from the horizontal plane including the top surface of the first bonding-level dielectric layer (such as the memory-level dielectric material layer 970).

Generally, a first semiconductor die 100 comprises first semiconductor devices, first metal interconnect structures embedded in first dielectric material layers and electrically connected to the first semiconductor devices, and at least one first bonding pad 18 embedded in a first bonding-level dielectric layer and electrically connected to one of the first metal interconnect structures. Each of the at least one first bonding pad 18 comprises a first conductive barrier layer 14 comprising a first conductive barrier material having a higher electrochemical potential than copper and a first copper material portion 16 laterally surrounded by the first conductive barrier layer 14. Optionally, a suitable pre-anneal bonding process may be performed, for example, at a temperature of about 150 degrees Celsius.

Figure 2A:
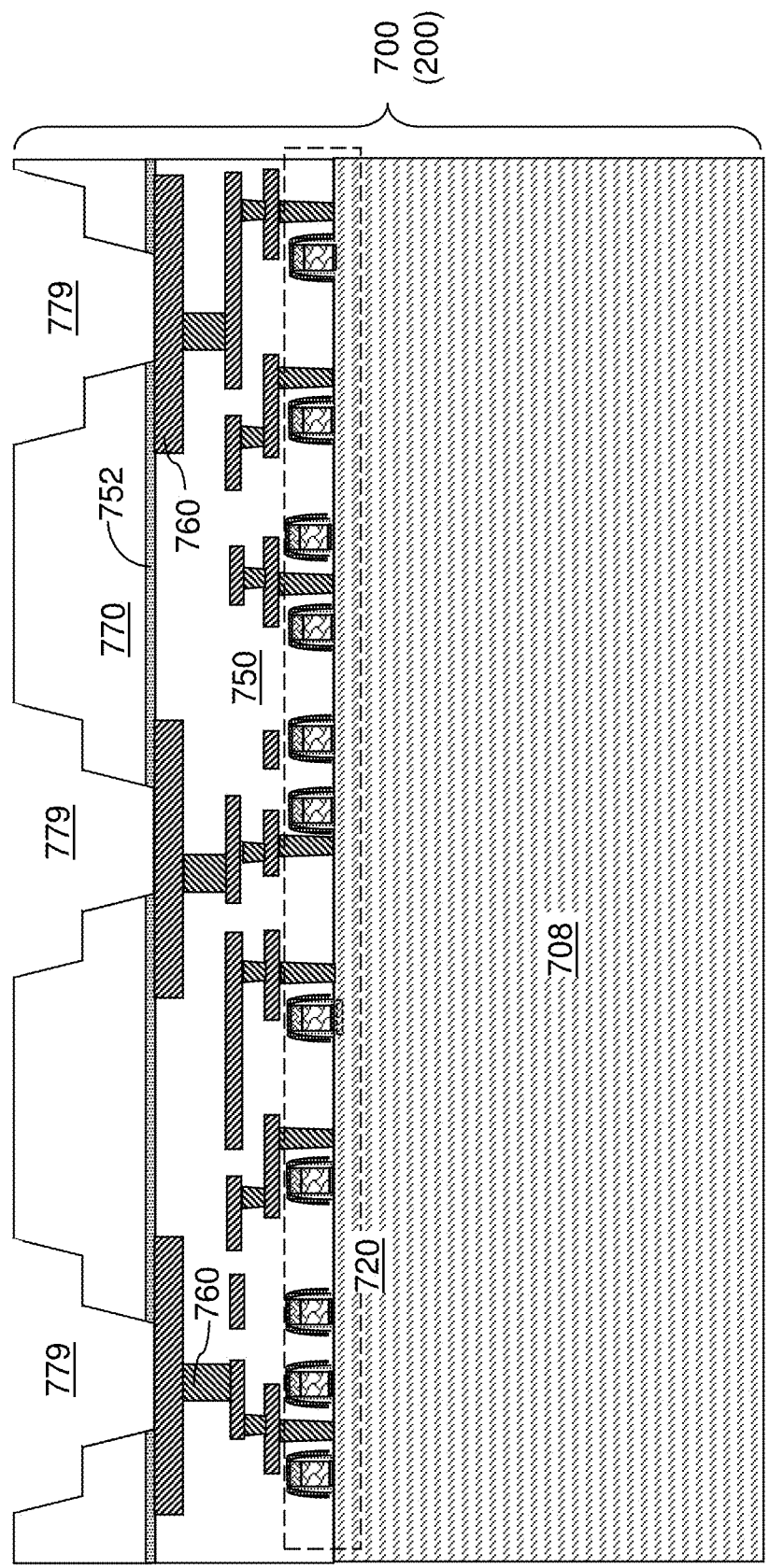
FIG. 2A is a schematic vertical cross-sectional view of a second configuration of a logic die after formation of logic-side pad cavities according to the first embodiment of the present disclosure.

Referring to FIG. 2A, a first configuration of a logic die 700 according to the first embodiment of the present disclosure is illustrated. Second-type bonding pads, which are also referred to as second bonding pads, can be subsequently formed on the logic die 700. In this case, the logic die 700 can be referred to as a second-type semiconductor die, or as a second semiconductor die 200. The logic die 700 includes a logic-side substrate 708, logic-side semiconductor devices 720 overlying the logic-side substrate 708, logic-side dielectric material layers 750 located on the logic-side semiconductor devices, and logic-side metal interconnect structures 760 embedded in the logic-side dielectric material layers 750. In one embodiment, the logic-side substrate 708 may be a commercially available single crystal silicon wafer. In one embodiment, a plurality of second semiconductor dies 200 may be provided on the logic-side substrate 708.

Generally, the logic-side semiconductor devices may comprise any semiconductor devices, such as field effect transistors in a CMOS configuration, that may be operated in conjunction with the memory-side semiconductor devices in the memory die 900 to provide enhanced functionality. In one embodiment, the logic die 700 comprises a support circuitry (i.e., a driver/peripheral circuitry) for operation of memory devices (such as a three-dimensional array of memory elements) 920 within the memory die 900. In one embodiment, the memory die 900 may include a three-dimensional memory device 920 including a three-dimensional array of memory elements, word lines (that may comprise a subset of the electrically conductive layers 46), and bit lines 962, and the logic-side semiconductor devices 720 of the logic die 700 may include a peripheral circuitry for operation of the three-dimensional array of memory elements. The peripheral circuitry may include one or more word line driver circuits that drive the word lines of the three-dimensional array of memory elements of the memory die 900, one or more bit line driver circuits that drive the bit lines 962 of the memory die 900, one or more word line decoder circuits that decode the addresses for the word lines, one or more bit line decoder circuits that decode the addresses for the bit lines 962, one or more sense amplifier circuits that sense the states of memory elements within the memory opening fill structures 58 of the memory die 900, a source power supply circuit that provides power to the horizontal semiconductor channel layer 10 in the memory die 900, a data buffer and/or latch, and/or any other semiconductor circuit that may be used to operate three-dimensional memory device of the memory die 900.

The logic-side dielectric material layers 750 may include a dielectric material such as undoped silicate glass, a doped silicate glass, organosilicate glass, silicon nitride, a dielectric metal oxide, or a combination thereof. The logic-side dielectric material layers 750 may include one or more dielectric diffusion barrier layers (not expressly shown). In this case, each dielectric diffusion barrier layer embedded in the logic-side distal dielectric material layers 750 may include silicon carbon nitride (i.e., silicon carbonitride "SiCN", which is also referred to silicon carbide nitride), silicon nitride ($Si_3N_4$), silicon oxynitride, or any other dielectric material that is effective in blocking diffusion of copper. In one embodiment, each dielectric diffusion barrier layer embedded in the logic-side distal dielectric material layers 750 may include a dielectric material having a dielectric constant less than 5, such as SiCN having a dielectric constant of about 3.8, to reduce RC delay of the logic-side metal interconnect structures 760. Each dielectric diffusion barrier layer may have a thickness in a range from 20 nm to 30 nm.

An optional logic-side dielectric diffusion barrier layer 752 can be formed over the logic-side dielectric material layers 750. The logic-side dielectric diffusion barrier layer 752 can include a dielectric material that blocks copper diffusion. In one embodiment, the logic-side dielectric diffusion barrier layer 752 can include silicon nitride, silicon carbon nitride, silicon oxynitride, or a stack thereof. The thickness of the logic-side dielectric diffusion barrier layer 752 can be in a range from 5 nm to 50 nm, although lesser and greater thicknesses can also be employed.

A logic-side bonding-level dielectric layer 770 can be formed over the logic-side dielectric diffusion barrier layer 752. In case second bonding pads are subsequently formed in the logic-side bonding-level dielectric layer 770, the logic-side bonding-level dielectric layer 770 is herein referred to as a second bonding-level dielectric layer. In one embodiment, the logic-side bonding-level dielectric layer 770 may include a dielectric material that permits dielectric-to-dielectric bonding. The logic-side bonding-level dielectric layer 770 may include, and/or consist essentially of, undoped silicate glass (i.e., silicon oxide), a doped silicate glass, organosilicate glass, silicon nitride, or a dielectric metal oxide. The thickness of the logic-side bonding-level dielectric layer 770 may be in a range from 300 nm to 3,000 nm, although lesser and greater thicknesses may also be employed. The logic-side bonding-level dielectric layer 770 may have a planar top surface.

A photoresist layer (not shown) can be applied over the logic-side bonding-level dielectric layer 770, and can be lithographically patterned to form discrete openings in each area in which second bonding pads are to be subsequently formed. In one embodiment, the second bonding pads may have shape similar to a mushroom including a lower via (e.g., stem) portion and an upper plate (e.g., cap) portion having a greater lateral dimension than the lower via portion. In this case, discrete opening in the photoresist layer can have shapes of the lower via portions of the second bonding pads. A first anisotropic etch process can be performed to transfer the pattern of the openings in the photoresist layer into an upper portion of the logic-side bonding-level dielectric layer 770. Recess cavities can be formed within unmasked areas in the upper portion of the logic-side bonding-level dielectric layer 770. The photoresist layer may be subsequently isotropically trimmed to increase the size of each opening in the photoresist layer. Alternatively, the photoresist layer may be removed and a new photoresist layer may be applied and patterned over the logic-side bonding-level dielectric layer 770 to form larger openings having peripheries that are laterally offset outward from a periphery of a respective recess cavity in the upper portion of the logic-side bonding-level dielectric layer 770. A second anisotropic etch process can be performed to etch portions of the logic-side bonding-level dielectric layer 770 that are not covered by the photoresist layer. Logic-side pad cavities 779 are formed through the logic-side bonding-level dielectric layer 770 underneath discrete openings in the photoresist layer. The photoresist layer may be subsequently removed, for example, by ashing.

Yet alternatively, the second bonding pads may be formed with a respective straight sidewall that vertically extend from a top surface of the logic-side bonding-level dielectric layer 770 to a bottom surface of the logic-side bonding-level dielectric layer 770. In this case, the logic-side pad cavities 779 may be formed by applying and patterning a photoresist layer, and by removing portions of the logic-side bonding-level dielectric layer 770 by performing an anisotropic etch process. In other words, a combination of a single lithographic patterning process and a single anisotropic etch process may be employed to form the logic-side pad cavities 779 with straight sidewall(s). In one embodiment, a lateral dimension (such as a diameter or a lateral distance between facing sides of a periphery) of each opening in the photoresist layer may be in a range from 200 nm to 30 microns, such as from 400 nm to 20 microns, although lesser and greater dimensions may also be employed.

A top surface of a respective logic-side metal interconnect structure 760 can be physically exposed at the bottom of each logic-side pad cavity 779. In one embodiment, each logic-side pad cavity 779 can have a top periphery having a horizontal cross-sectional shape of a rectangle or a rounded rectangle. A maximum lateral dimension of each logic-side pad cavity 779 may be in a range from 200 nm to 30 microns, such as from 400 nm to 20 microns, although lesser and greater dimensions may also be employed. Sidewalls of the logic-side pad cavities 779 may be vertical, or may have a taper angle greater than 0 degree and less than 30 degrees (such as a taper angle in a range from 3 degrees to 20 degrees) with respect to the vertical direction. In case second bonding pads (i.e., second-type bonding pads) are subsequently formed in the logic-side pad cavities 779, the logic-side pad cavities 779 are herein referred to as second pad cavities.

Figure 2B:
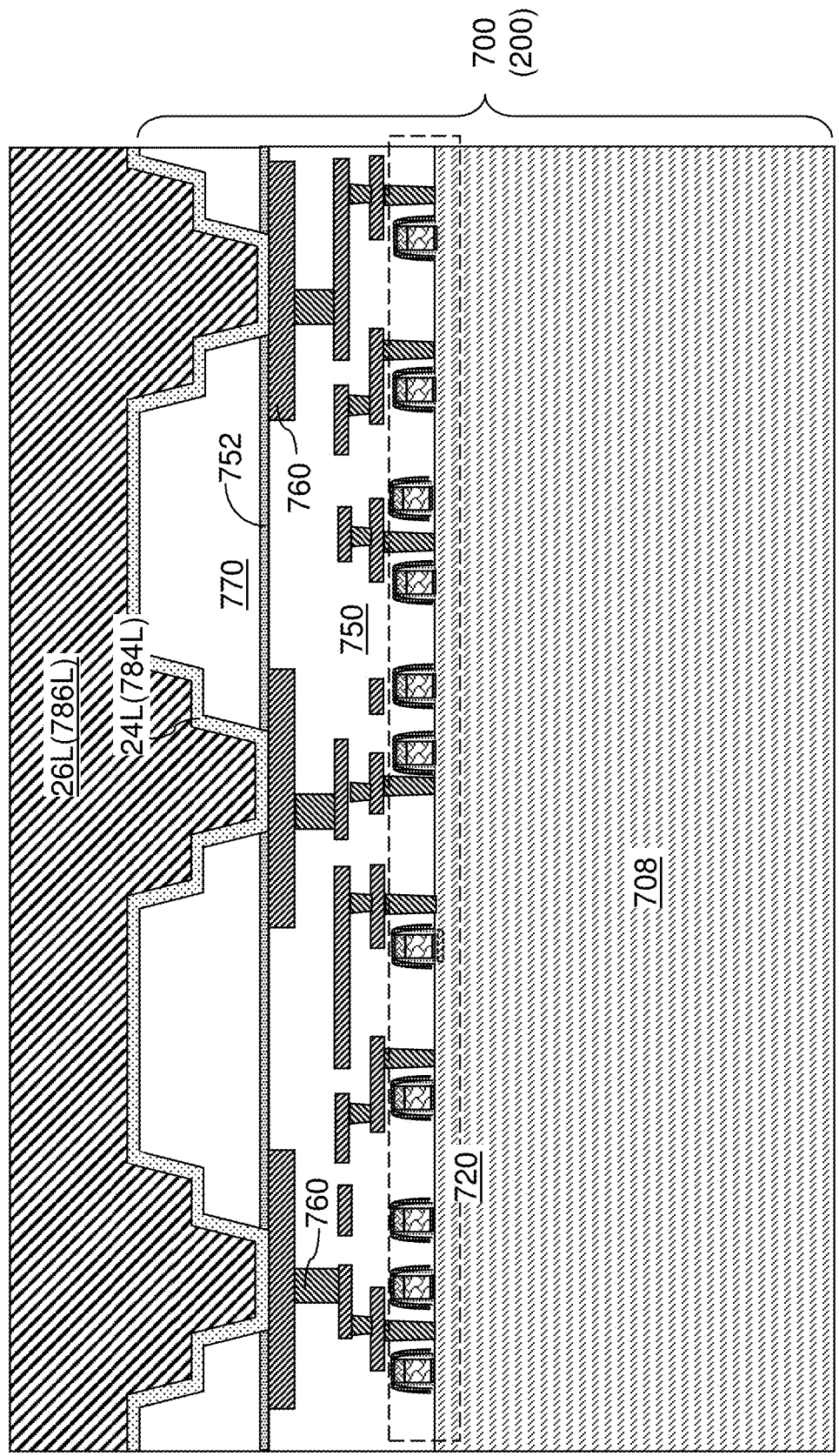
FIG. 2B is a schematic vertical cross-sectional view of the second configuration of the logic die after formation of a logic-side conductive barrier layer and a logic-side copper layer according to the first embodiment of the present disclosure.

Referring to FIG. 2B, a logic-side conductive barrier layer 784L and a logic-side copper layer 786L can be sequentially deposited in the logic-side pad cavities 779. In one embodiment, the logic-side conductive barrier layer 784L may be formed as a second-type conductive barrier layer, which is herein referred to as a second conductive barrier layer 24L. In this case, the logic-side copper layer 786L is formed on the second conductive barrier layer 24L, and is herein referred to as a second copper layer 26L.

According to an aspect of the present disclosure, the second conductive barrier layer 24L comprises, and/or consists essentially of, a second conductive barrier material having a lower electrochemical potential than copper. Non-limiting examples of metallic materials that provide a lower electrochemical potential than copper and provide suitable adhesion strength to a dielectric material (such as silicon oxide) of the second bonding-level dielectric layer (such as the logic-side bonding-level dielectric layer 770) comprise ruthenium, titanium, or titanium nitride. In one embodiment, the second conductive barrier layer 24 consists essentially of a material selected from ruthenium, titanium, or titanium nitride. The thickness of the second conductive barrier layer 24L (which comprises the logic-side conductive barrier layer 784L) may be in a range from 3 nm to 30 nm, such as from 6 nm to 20 nm, although lesser and greater thicknesses can also be employed.

The second copper layer 26L (which comprises the logic-side copper layer 786L) may consist essentially of copper. The second copper layer 26L may be formed by depositing a copper seed layer (which is a lower surface portion of the second copper layer 26L) employing a physical vapor deposition process, and by depositing a copper fill material layer employing electroplating. The thickness of the copper seed layer may be in a range from 20 nm to 200 nm, and the thickness of the copper fill material layer, and measured over the top surface of the second bonding-level dielectric layer, may be in a range from 300 nm to 6,000 nm, although lesser and greater thicknesses may also be employed.

Figure 2C:
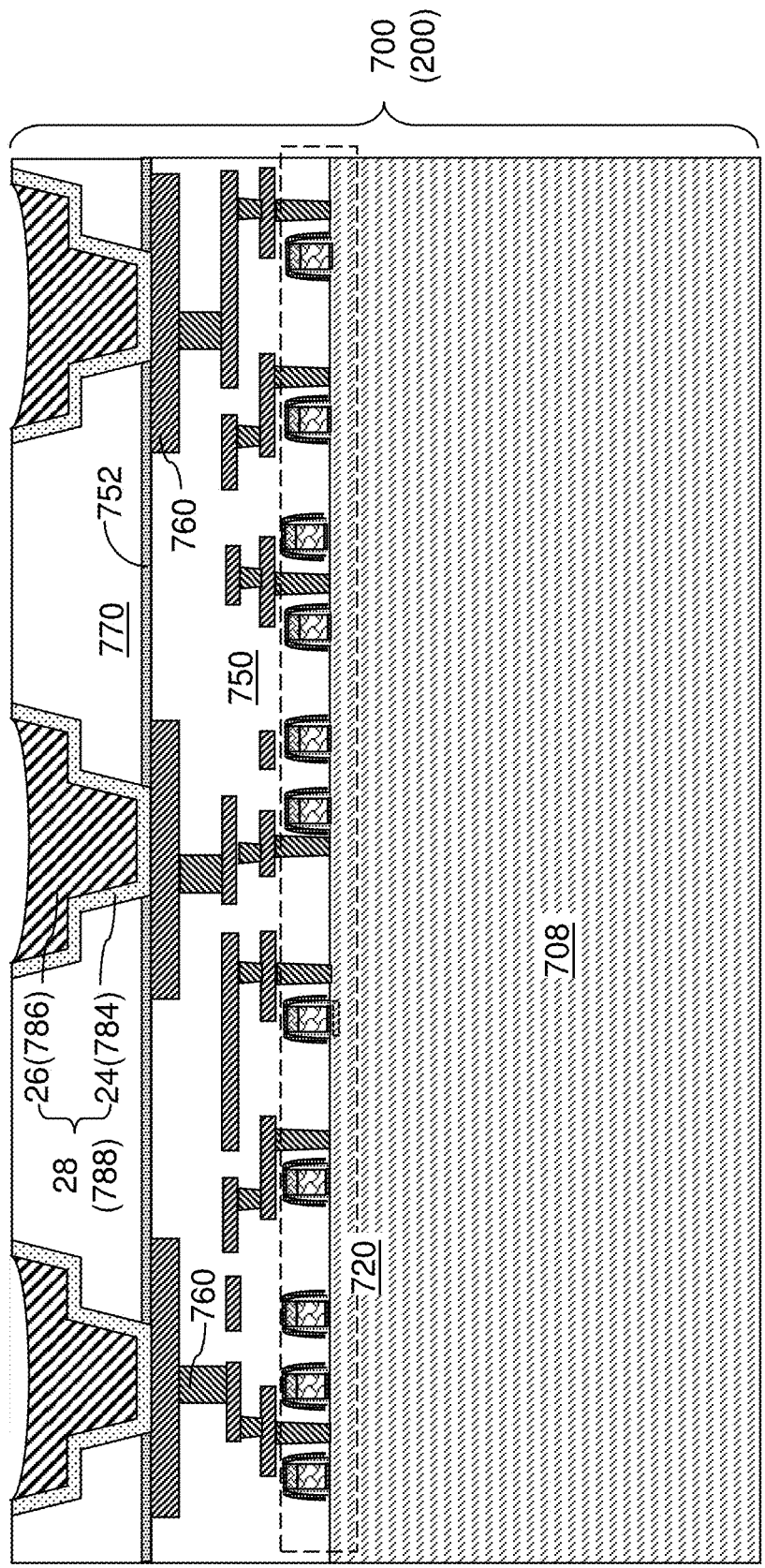
FIG. 2C is a schematic vertical cross-sectional view of the second configuration of the logic die after formation of logic-side bonding pads according to the first embodiment of the present disclosure.
Figure 2D:
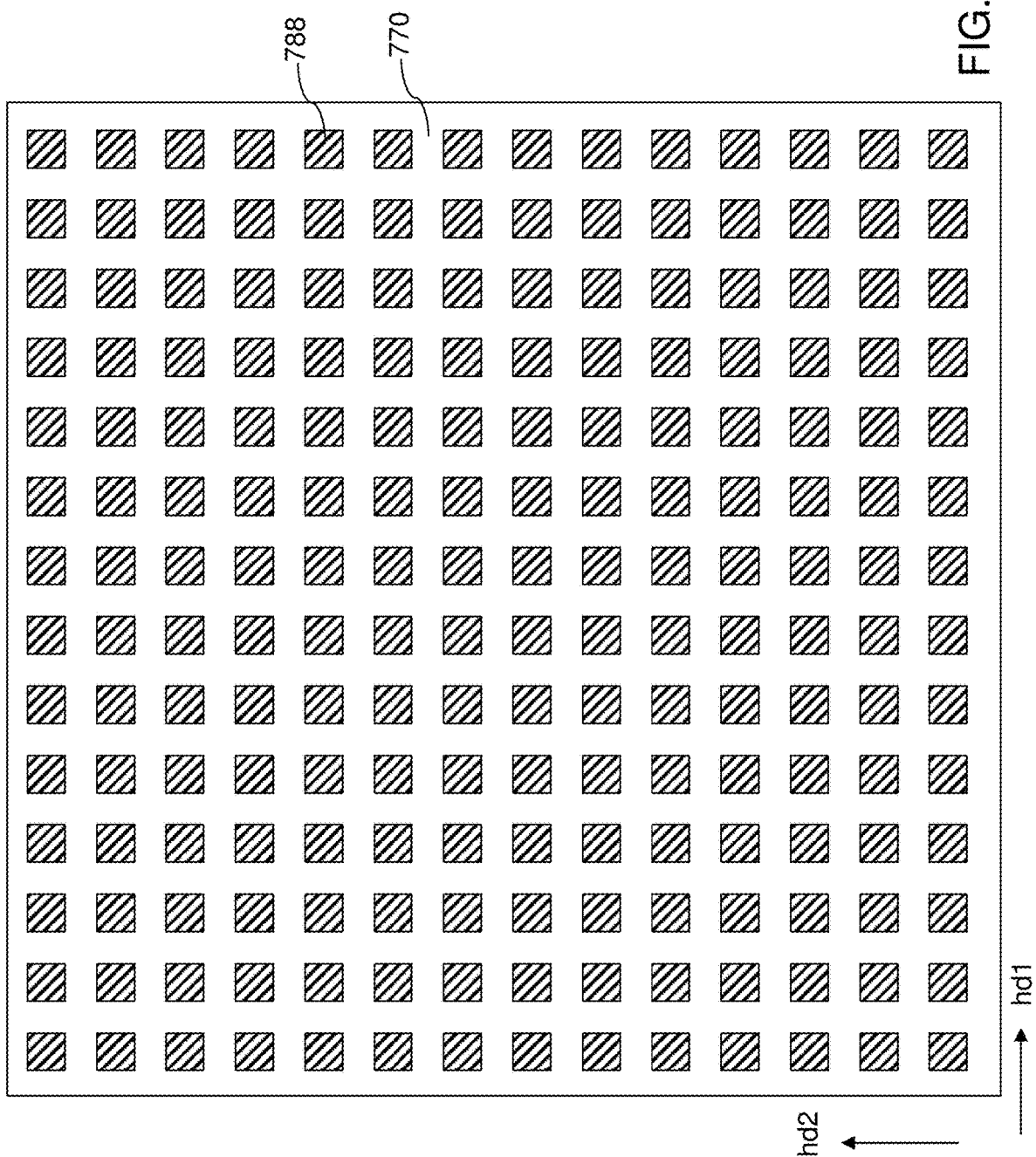
FIG. 2D is a schematic top-down view of the second configuration of the logic die after formation of the logic-side bonding pads according to the first embodiment of the present disclosure.

Referring to FIGS. 2C and 2D, a second chemical mechanical polishing (CMP) process can be performed to remove portions of the second copper layer 26L (comprising the logic-side copper layer 786L) and the second conductive barrier layer 24L (comprising the logic-side conductive barrier layer 784L) from above the top surface of the second bonding-level dielectric layer (comprising the logic-side bonding-level dielectric layer 770). Each remaining portion of the second copper layer 26L comprises the second copper material portion 26. Each remaining portion of the second conductive barrier layer 24L comprises a second conductive barrier layer 24. Each second copper material portion 26 is a logic-side copper material portion 786. Each second conductive barrier layer 24 is a logic-side conductive barrier layer 784 embedded within the logic-side bonding dielectric layer 770. Each contiguous combination of a second conductive barrier layer 24 and a second copper material portion 26 constitutes a second bonding pad 28, which in this embodiment is a logic-side bonding pad 788.

Generally, second bonding pads 28 embedded in a second bonding-level dielectric layer (such as the logic-side bonding-level dielectric layer 770) and electrically connected to a respective one of the second metal interconnect structures (such as the logic-side metal interconnect structures 760) are formed. Each of the second bonding pads 28 comprises a second conductive barrier layer 24 including and/or consisting essentially of a second conductive barrier material having a lower electrochemical potential than copper. Each of the second bonding pads 28 comprises a second copper material portion 26 laterally surrounded by the second conductive barrier layer 24.

The second chemical mechanical polishing process proceeds under a condition in which the second conductive barrier material of the second conductive barrier layer 24 has a lower electrochemical potential than copper of the second copper material portion 26 within each second bonding pad 28. During the second chemical mechanical polishing process of the present disclosure, the second conductive barrier layer 26 functions as a cathode, and the second copper material portion 26 functions as an anode. Electrons flow (i.e., current flows) from the second copper material portion 26 to the second conductive barrier layer 24 within each first bonding pad 18. The second copper material portion 26 is positively charged, and surface portions of the second copper portion 26 in contact with the slurry generate positive copper ions. As a consequence, the copper ions at the surface of the second copper material portion 26 that contact the slurry dissociate from the second copper portion 26, and diffuse into the slurry during the second chemical mechanical polishing process, which results in dishing. Dishing leads to a concave upper surface in the second copper portion 26.

In one embodiment, the top surface of each second conductive barrier layer 24 may be formed within a horizontal plane including the top surface of the second bonding-level dielectric layer (which comprises the logic-side bonding-level dielectric layer 770). In one embodiment, each second conductive barrier layer 24 may comprise a respective top surface having an inner periphery and an outer periphery within the horizontal plane including the top surface of the second bonding-level dielectric layer.

In one embodiment, the entirety or a major portion of each second copper material portion 26 may be located at or below the horizontal plane including the top surface of the second bonding-level dielectric layer. In one embodiment, the middle of each second copper material portion 26 is recessed farther than its edges. Thus, for each second bonding pad 28 located within a respective second pad cavity, a vertical distance between a concave top surface of the second copper material portion 26 and the horizontal plane increases with a lateral distance from a respective most proximal point within a periphery of the pad cavity that is located within the horizontal plane, i.e., with a lateral distance from a top periphery of the second pad cavity. In other words, the farther a point within a concave top surface of a second copper material portion 26 is laterally from the periphery of the second pad cavity, the farther the point is vertically from the horizontal plane.

The maximum dishing depth, i.e., the maximum distance between the concave top surface of each second copper material portion 26 from the horizontal plane including the top surface of the second bonding-level dielectric layer, may be in a range from 1 nm to 30 nm, such as from 2 nm to 10 nm, although lesser and greater maximum dishing depths may also be employed. In one embodiment, at least 50%, such as from 80% to 100%, of the area of the top surface of each second copper material portion 26 may be recessed below the horizontal plane including the top surface of the second bonding-level dielectric layer (which comprises the logic-level dielectric material layer 770).

Generally, the second semiconductor die 200 comprises second semiconductor devices, second metal interconnect structures embedded in second dielectric material layers and electrically connected to the second semiconductor devices, and at least one second bonding pad 28 embedded in a second bonding-level dielectric layer and electrically connected to one of the second metal interconnect structures.

The second bonding pad 28 comprises a second conductive barrier layer 24 comprising a second conductive barrier material having a lower electrochemical potential than copper and a second copper material portion 26 laterally surrounded by the second conductive barrier layer 24. Optionally, a suitable pre-anneal bonding process may be performed, for example, at a temperature of about 150 degrees Celsius.

Figure 3A:
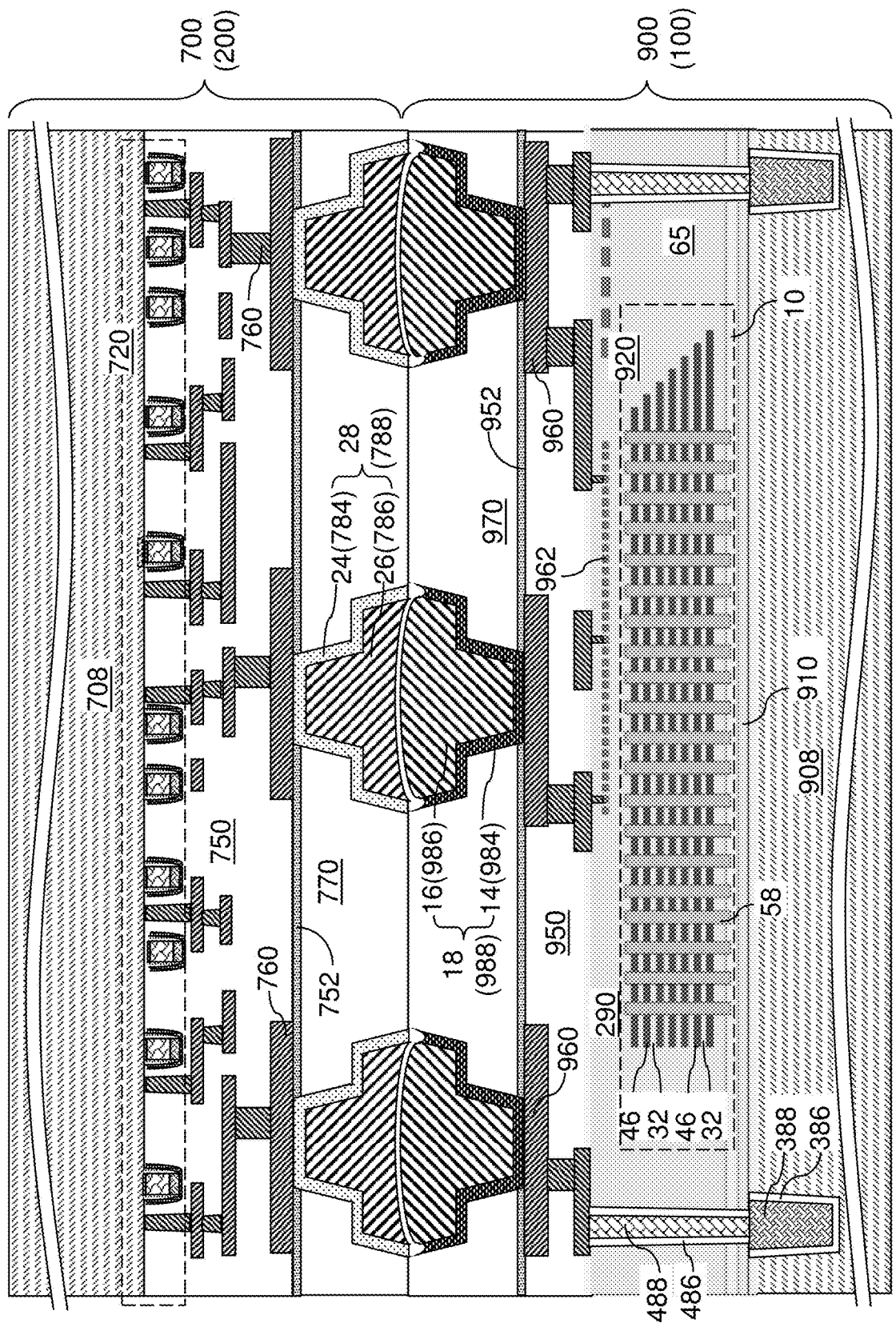
FIG. 3A is a schematic vertical cross-sectional view of a first configuration of a first exemplary structure after the logic die is disposed on the memory die for bonding according to the first embodiment of the present disclosure.

Referring to FIG. 3A, the first substrate including the plurality of first semiconductor dies 100 and the second substrate including the plurality of second semiconductor dies 200 can be aligned to each other for bonding. In this case, the first bonding pads 18 and the second bonding pads 28 can face each other. In the illustrated example, the first semiconductor dies 100 can be memory dies 900, the second semiconductor dies 200 can be logic dies 700, the first bonding pads 18 can be memory-side bonding pads 988, and the second bonding pads 28 can be logic-side bonding pads 788.

The first bonding-level dielectric layer is brought into contact with the second bonding-level dielectric layer while each mating pair of a first bonding pad 18 and a second bonding pad 28 remains aligned to each other. Thus, the convex first bonding pads 18 having respective convex first copper material portions 16 are aligned to respective concave second bonding pads having respective concave second copper material portions 26. A cavity, which is herein referred to as a bonding cavity, may be formed between each mating pair of a first bonding pad 18 and a second bonding pad 28.

In one embodiment, the volume of each bonding cavity may be in a range from 0.01% to 0.5%, such as from 0.03% 0.3% of the combined volume of the mating pair of a first copper material portion 16 and a second copper material portion 26. Generally, each cavity may include a volume of a moat-shaped groove 14G and a volume between a convex surface of a first copper material portion 16 and a concave surface of a second copper material portion 26.

Figure 3B:
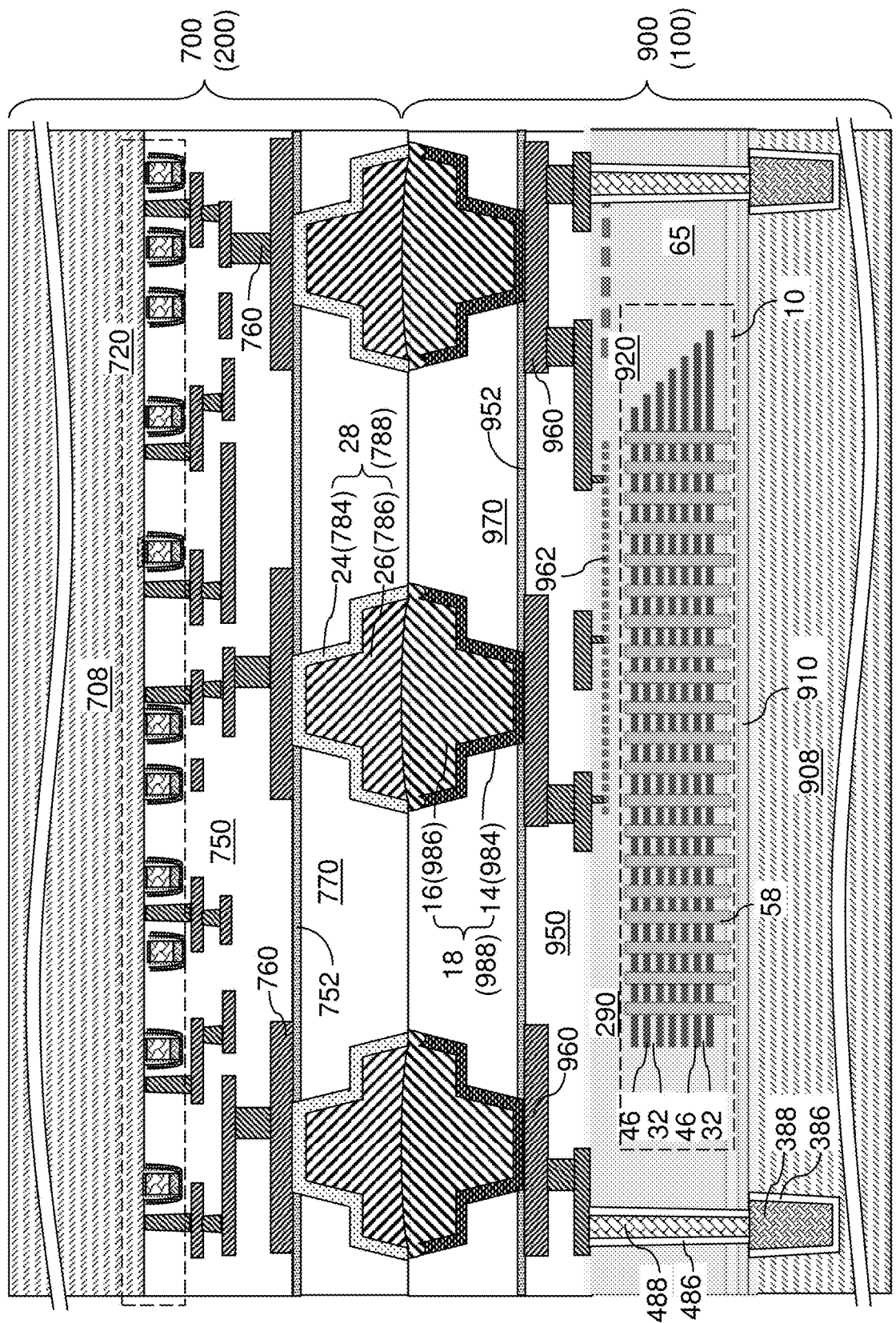
FIG. 3B is a schematic vertical cross-sectional view of the first configuration of the first exemplary structure after bonding the logic die to the memory die according to the first embodiment of the present disclosure.

Referring to FIG. 3B, an anneal process can be performed at an elevated temperature to induce copper-to-copper bonding between each mating pair of a first bonding pad 18 and a second bonding pad 28. The elevated temperature of the anneal process may be in a range from 300 degrees Celsius to 450 degrees Celsius, such as from 350 degrees Celsius to 425 degrees Celsius.

The first copper material portions 16 and the second copper material portions 26 expand in volume during the anneal process, and are bonded to a respective mating copper material portion. In one embodiment, a wafer-to-wafer bonding process may be performed to bond an array of first semiconductor dies 100 on the first substrate 108 to an array of second semiconductor dies 200 on the second substrate 208.

Generally, copper-to-copper bonding can be induced between the second copper material portions 26 and the first copper material portions 16 such that each second bonding pad 28 can be bonded to a respective one of the first bonding pad 18, and each first bonding pad 18 can be bonded to a respective one of the second bonding pads 28. In one embodiment, at least 80%, such from 85% to 100%, and/or from 90% to 99%, of a bonding interface between the first bonding pad 18 and the second bonding pad 28 within each bonded pair of a first bonding pad 18 and a second bonding pad 28 may be formed on a side of the second semiconductor die 200 relative to a horizontal plane including an interface between the first bonding dielectric layer and the second bonding dielectric layer after bonding the second bonding pads 28 to the first bonding pad 18.

In one embodiment, a bonding interface between the first bonding pads 18 and the second bonding pads 28 between each bonded pair of a first bonding pad 18 and a second bonding pad 28 comprises a non-planar (i.e., curved) interface at which a convex surface of the first copper material portion 16 contacts a concave surface of the second copper material portion 26. In one embodiment, the entirety of a periphery of the convex surface of the first copper material portion 16 in a bonded pair of a first bonding pad 18 and a second bonding pad 28 may be adjoined to a surface of the first bonding-level dielectric layer (970 or 770).

In one embodiment, the first conductive barrier layer 14 in a bonded pair of a first bonding pad 18 and a second bonding pad 28 may be vertically spaced from the second bonding pad 28 by a peripheral portion of the first copper material portion 16 that contacts a sidewall of the first bonding-level dielectric layer (which comprises the memory-side bonding-level dielectric layer 970 in the illustrated example). The peripheral portion of the first copper material portion 16 may fill the volume of the moat-shaped groove 14G in the first conductive barrier layer 14. Thus, the bonding pads 18 and 28 of the first embodiment form a good bond, even in the case of partial lateral misalignment.

In contrast, in prior art bonded assemblies containing opposing convex bonding pads surrounded by respective moat-shaped grooves, there may be insufficient contact between the bonding pads in case of the partial lateral misalignment of the opposing bonding pads. In other words, if only the moat-shaped grooves overlap each other, then there may not be sufficient copper filling of both grooves to form a sufficient bond. Likewise, in other prior art bonded assemblies containing opposing concave bonding pads, there may be insufficient copper filling in the middle of the bonding pads which forms a void in the middle of the bonding interface between opposing convex bonding pads. The void degrades the quality of the bond.

In one embodiment, the first conductive barrier layer 14 comprises a vertically-extending portion contacting a sidewall of the first bonding-level dielectric layer (such as the memory-side bonding-level dielectric layer 970) and having a contoured top surface that continuously extends around the first copper material portion 16 and having a concave vertical cross-sectional profile (i.e., the vertical cross-sectional profile of a mot-shaped groove 14G). In one embodiment, a point of the concave top surface laterally midway between an inner sidewall and an outer sidewall of the concave top surface is more distal from a horizontal plane at which the first bonding-level dielectric layer contacts the second bonding-level dielectric layer than a point of the inner sidewall that is mot proximal to the horizontal plane, and than a point of the outer sidewall that is most proximal to the horizontal plane. This is due to the "U-shaped"

vertical cross-sectional profile of the moat-shaped groove 14G overlying the annular top surface of the first conductive barrier layer 14.

In one embodiment, a vertically extending portion of the first conductive barrier layer 14 in a bonded pair of a first bonding pad 18 and a second bonding pad 28 comprises a moat-shaped groove 14G that laterally surrounds the first copper material portion 16 and having a concave profile. A peripheral portion of the first copper material portion 16 fills the moat-shaped groove 14G, and is disposed between the first conductive barrier layer 14 and the second bonding pad 28.

In one embodiment, at least 80%, such as from 85% to 100%, and/or from 90% to 99%, of the bonding interface between the first bonding pads 18 and the second bonding pads 28 may be located on a side of the second semiconductor die 200 with respect to a horizontal plane including an interface between the first bonding-level dielectric layer and the second bonding-level dielectric layer.

In one embodiment, the first conductive barrier layer 14 in a bonded pair of a first bonding pad 18 and a second bonding pad 28 is vertically spaced from the second bonding pad 28 by the first copper material portion 16, and the second conductive barrier layer 24 is in direct contact with the first copper material portion 16.

In one embodiment, the first conductive barrier layer 14 consists essentially of a material selected from cobalt, tantalum, or tantalum nitride. In one embodiment, the second conductive barrier layer 24 consists essentially of a material selected from ruthenium, titanium, or titanium nitride.

In one embodiment, the second bonding-level dielectric layer is in direct contact with the first bonding-level dielectric layer at a horizontal plane, and a horizontal surface of a vertically-extending portion of the second conductive barrier layer 24 is located within the horizontal plane. In one embodiment, an annular surface of a vertically-extending portion of the first conductive barrier layer 14 that faces the second semiconductor die 200 and is most proximal to the second semiconductor die 200 is vertically spaced from the horizontal plane by a peripheral portion of the first copper material portion 16, i.e., by a sub-portion of the first copper material portion 16 that fills a moat-shaped groove 14G. In one embodiment, the annular surface comprises a non-planar grooved surface having a concave vertical cross-sectional profile, and the non-planar grooved surface is contacted entirely by the first copper material portion 16.

Figure 3C:
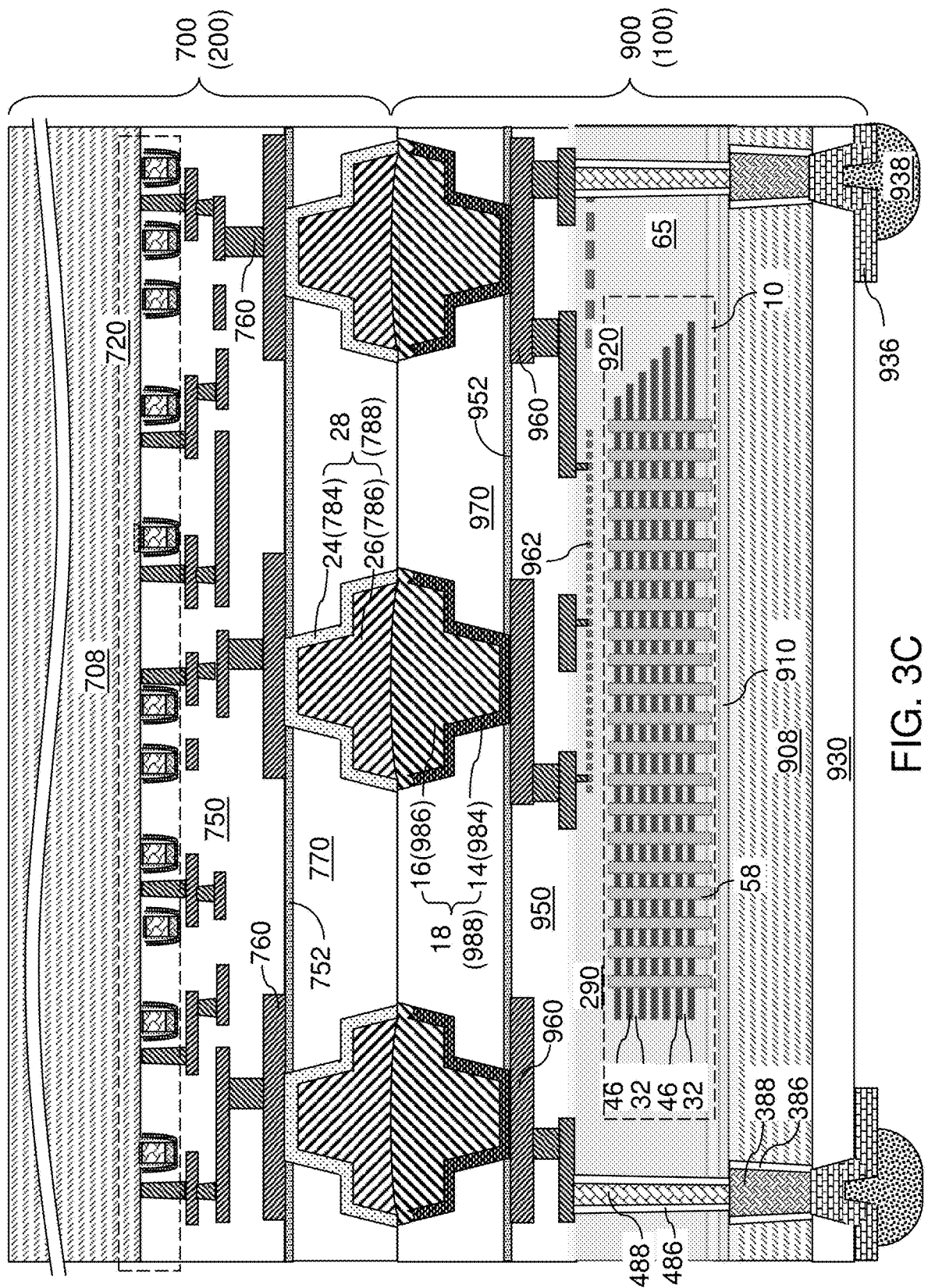
FIGS. 3C and 3D are schematic vertical cross-sectional views of alternative first configurations of the first exemplary structure after thinning the memory die according to the first embodiment of the present disclosure.

Referring to FIG. 3C, the memory-side substrate 908 may optionally be thinned from the backside by grinding, polishing, an anisotropic etch, or an isotropic etch. The thinning process can continue until horizontal portions of the through-substrate liners 386 are removed, and horizontal surfaces of the through-substrate via structures (if present) 388 are physically exposed. Generally, end surfaces of the through-substrate via structures 388 can be physically exposed by thinning the backside of the memory-side substrate 908, which may be the substrate of a memory die. The thickness of the memory-side substrate 908 after thinning may be in a range from 1 micron to 30 microns, such as from 2 microns to 15 microns, although lesser and greater thicknesses can also be employed.

An optional backside insulating layer 930 may be formed on the backside of the memory-side substrate 908. The backside insulating layer 930 includes an insulating material such as silicon oxide. The thickness of the backside insulating layer 930 can be in a range from 50 nm to 500 nm, although lesser and greater thicknesses can also be employed. A photoresist layer (not shown) may be applied over the backside insulating layer 930, and may be lithographically patterned to form opening over areas of the through-substrate via structures 388. An etch process can be performed to form via cavities through the backside insulating layer 930 underneath each opening in the photoresist layer. A top surface of a through-substrate via structure 388 can be physically exposed at the bottom of each via cavity through the backside insulating layer 930.

At least optional one metallic material can be deposited into the openings through the backside insulating layer 930 and over the planar surface of the backside insulating layer 930 to form a metallic material layer. The at least one metallic material can include copper, aluminum, ruthenium, cobalt, molybdenum, and/or any other metallic material that may be deposited by physical vapor deposition, chemical vapor deposition, electroplating, vacuum evaporation, or other deposition methods. For example, a metallic nitride liner material (such as TiN, TaN, or WN) may be deposited directly on the physically exposed surfaces of the through-substrate via structures 388, on sidewalls of the openings through the backside insulating layer 930, and over the physically exposed planar surface of the backside insulating layer 930. The thickness of the metallic nitride liner material can be in a range from 10 nm to 100 nm, although lesser and greater thicknesses can also be employed. At least one metallic fill material such as copper or aluminum can be deposited over the metallic nitride liner material. In one embodiment, the at least one metallic fill material can include a stack of a high-electrical-conductivity metal layer (such as a copper layer or an aluminum layer) and an underbump metallization (UBM) layer stack for bonding a solder ball thereupon. Exemplary UBM layer stacks include, but are not limited to, an Al/Ni/Au stack, an Al/Ni/Cu stack, a Cu/Ni/Au stack, a Cu/Ni/Pd stack, a Ti/Ni/Au stack, a Ti/Cu/Ni/Au stack, a Ti—W/Cu stack, a Cr/Cu stack, and a Cr/Cu/Ni stack. The thickness of the metallic material layer over the planar horizontal surface of the backside insulating layer 930 can be in a range from 0.5 microns to 10 microns, such as from 1 micron to 5 microns, although lesser and greater thicknesses can also be employed.

The at least one metallic fill material and the metallic material layer can be subsequently patterned to form discrete backside bonding pads 936 contacting a respective one of the through-substrate via structures 388. The backside bonding pads 936 can function as external bonding pads that can be employed to electrically connect various nodes of within the memory die 900 and the logic die 700 to external nodes, such as bonding pads on a packaging substrate or C4 bonding pads of another semiconductor die. For example, solder material portions 938 can be formed on the backside bonding pads 936, and a C4 bonding process or a wire bonding process can be performed to electrically connect the backside bonding pads 936 to external electrically active nodes.

Generally, backside bonding pads 936 can be formed on a backside surface of the memory die 900 (which may be a memory die) that is located on an opposite side of the bonding interfaces with the logic die 700. Through-substrate via structures 388 can vertically extend through the memory die 900, and can provide electrical connection between the backside bonding pads 936 and a subset of the bonding pads (18, 28).

Figure 3D:
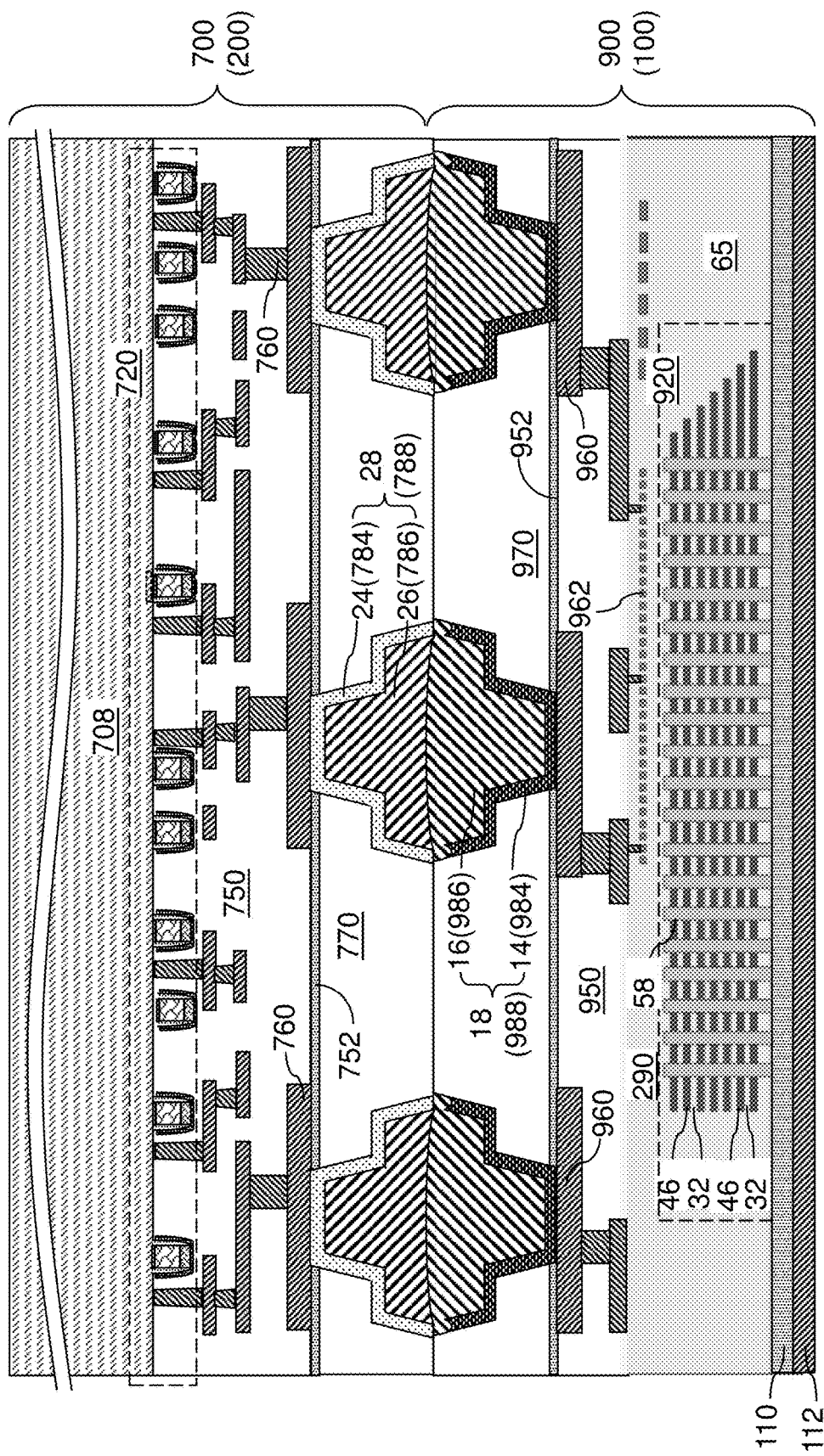

In an alternative aspect of the first embodiment shown in FIG. 3D, the horizontal semiconductor channel layer 10, the through-substrate liners 386, the through-substrate via structures 388, the through-memory-level dielectric liner 486 and/or the through-memory-level via structure 488 may be omitted. In this alternative configuration, the entire first substrate 108 is removed rather than thinned to expose the tips of the memory opening fill structures 58. After removing the first substrate 108, the memory films at the exposed tips of the memory opening fill structures 58 are removed by selective etching to expose the tips of the semiconductor channels in the memory opening fill structures 58. A doped semiconductor source layer 110 is formed in contact with the exposed tips of the semiconductor channels. A conductive source line (e.g., source contact) 112 is then formed on the doped semiconductor source layer 110.

Figure 4A:
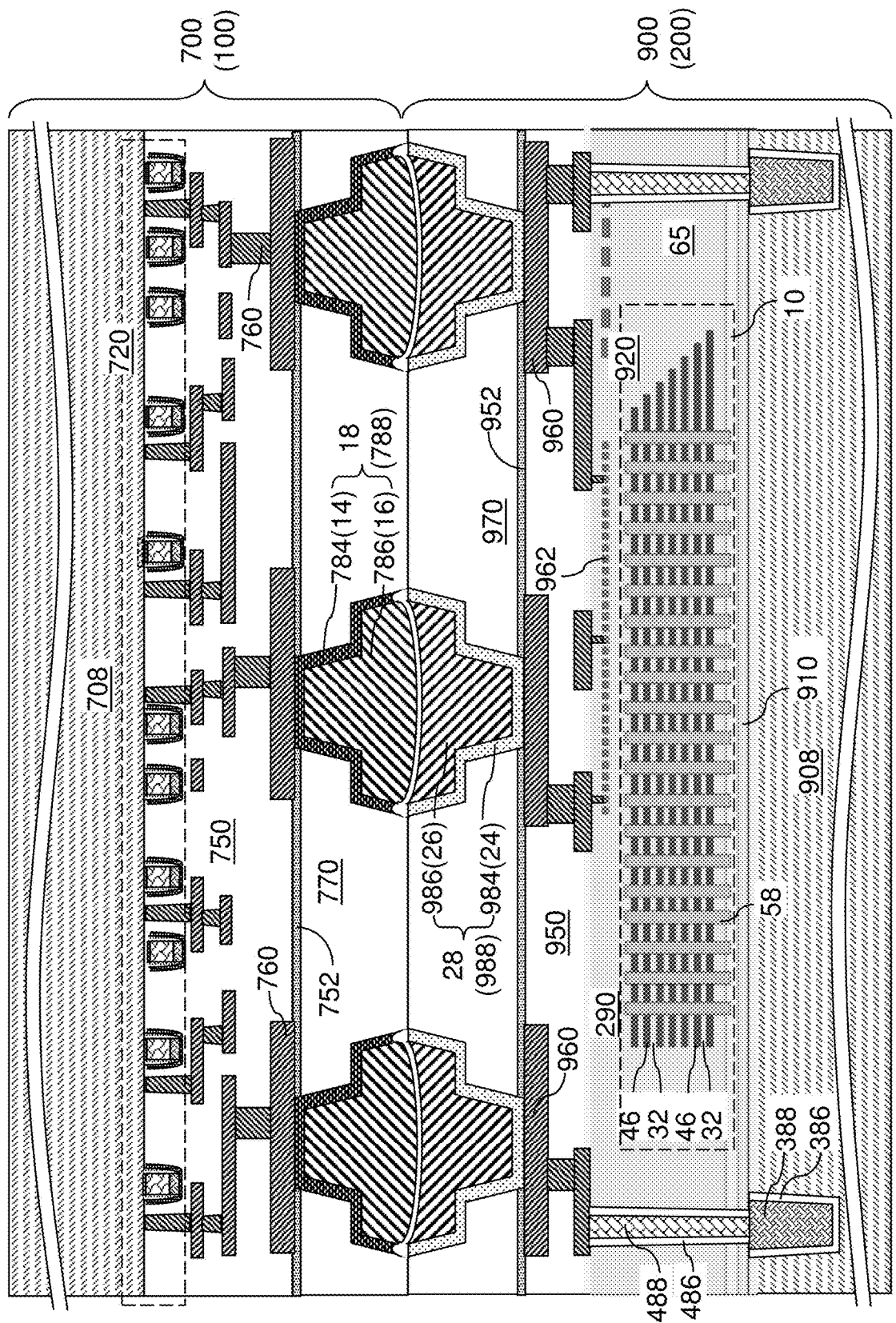
FIG. 4A is a schematic vertical cross-sectional view of a second configuration of the first exemplary structure after the logic die is disposed on the memory die for bonding according to the first embodiment of the present disclosure.

Referring to FIG. 4A, a second configuration of the first exemplary structure is illustrated. The second configuration of the first exemplary structure can be derived from the first configuration of the first exemplary structure illustrated in FIG. 3A by forming the memory-side bonding pads 988 as second bonding pads 28, and by forming the logic-side bonding pads 788 as first bonding pads 18. In other words, the memory-side bonding pads 988 are formed as combinations of a respective second conductive barrier layer 24 and a respective second copper material portion 28 employing the second chemical mechanical planarization process described above, and the logic-side bonding pads 788 are formed as combinations of a respective first conductive barrier layer 14 and a respective first copper material portion 18 employing the first chemical mechanical planarization process described above.

Each of the first conductive barrier layers 14 in the second configuration of the first exemplary structure may be formed with the same material composition and with the same geometrical features as the first conductive barrier layers 14 in the first configuration of the first exemplary structure as described above. Each of the first copper material portions 16 in the second configuration of the first exemplary structure may be formed with the same material composition and with the same geometrical features as the first copper material portion 16 in the first configuration of the first exemplary structure as described above. Each of the second conductive barrier layers 24 in the second configuration of the first exemplary structure may be formed with the same material composition and with the same geometrical features as the second conductive barrier layers 24 in the first configuration of the first exemplary structure as described above. Each of the second copper material portions 26 in the second configuration of the first exemplary structure may be formed with the same material composition and with the same geometrical features as the second copper material portions 26 in the first configuration of the first exemplary structure as described above.

Figure 4B:
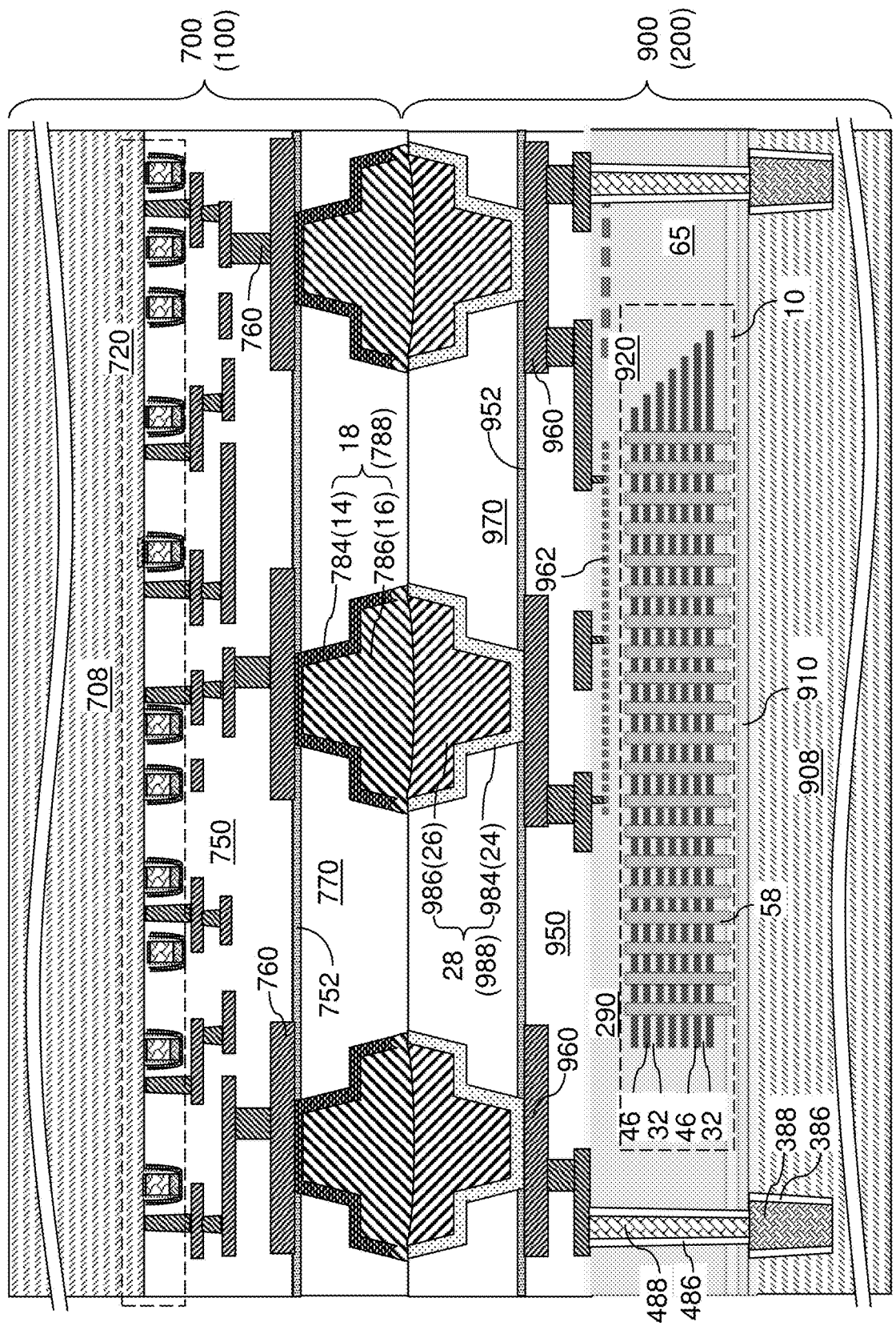
FIG. 4B is a schematic vertical cross-sectional view of the second configuration of the first exemplary structure after bonding the logic die to the memory die according to the first embodiment of the present disclosure.

Referring to FIG. 4B, the processing steps described with reference to FIG. 3B may be performed to induce copper-to-copper bonding between each mating pair of a respective first copper material portion 16 and a respective second copper material portion 26. Dielectric-to-dielectric bonding (such as silicon oxide-to-silicon oxide bonding) may be performed simultaneously with the copper-to-copper bonding between the first bonding-level dielectric layer and the second bonding-level dielectric layer. The bonded pairs of a respective first copper material portion 16 and a respective second copper material portion 26 may have the same geometry as in the first configuration of the first exemplary structure described with reference to FIG. 3B.

Figure 4C:
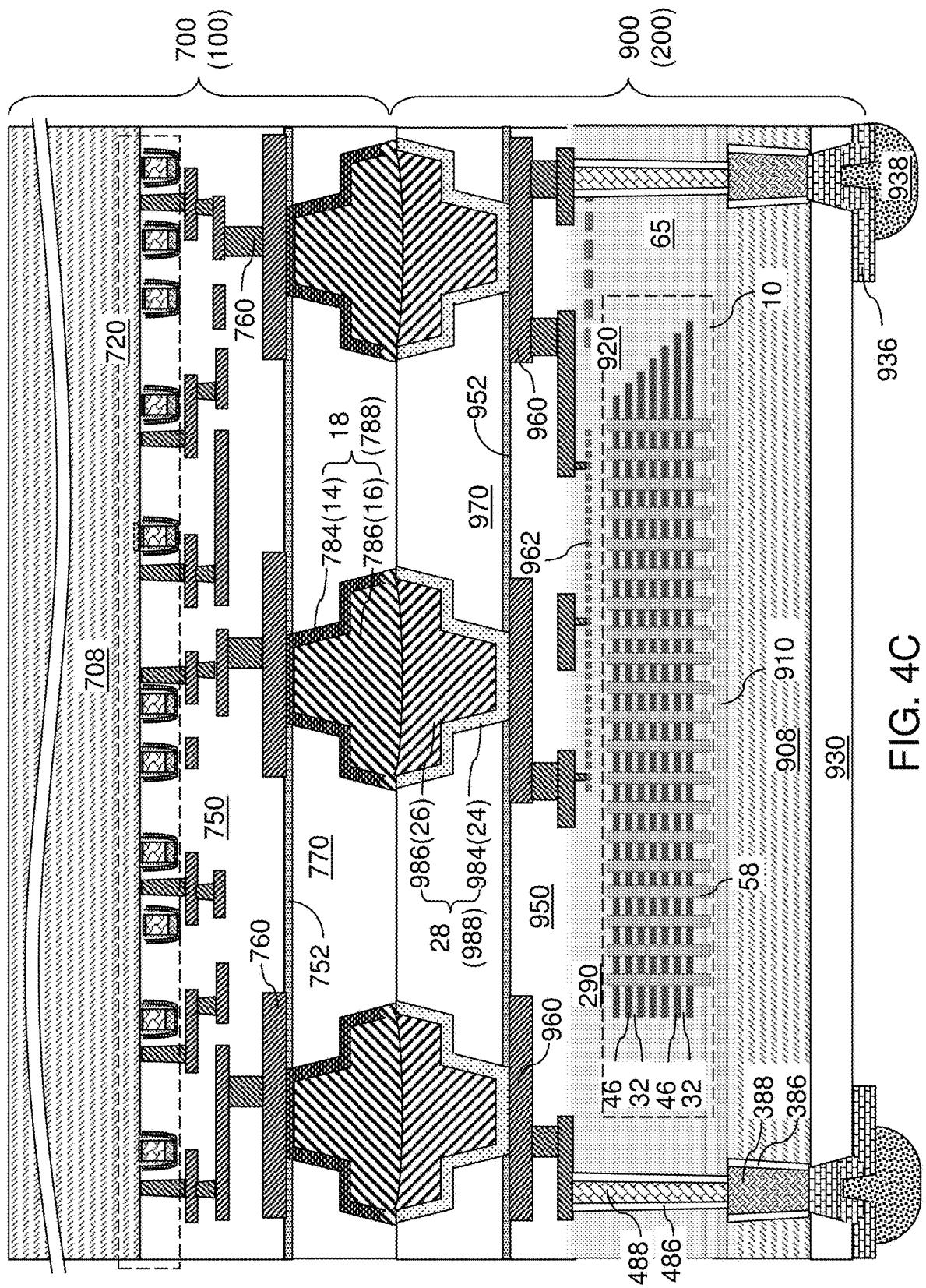
FIGS. 4C and 4D are schematic vertical cross-sectional views of alternative second configurations of the first exemplary structure after thinning the memory die according to the first embodiment of the present disclosure.
Figure 4D:
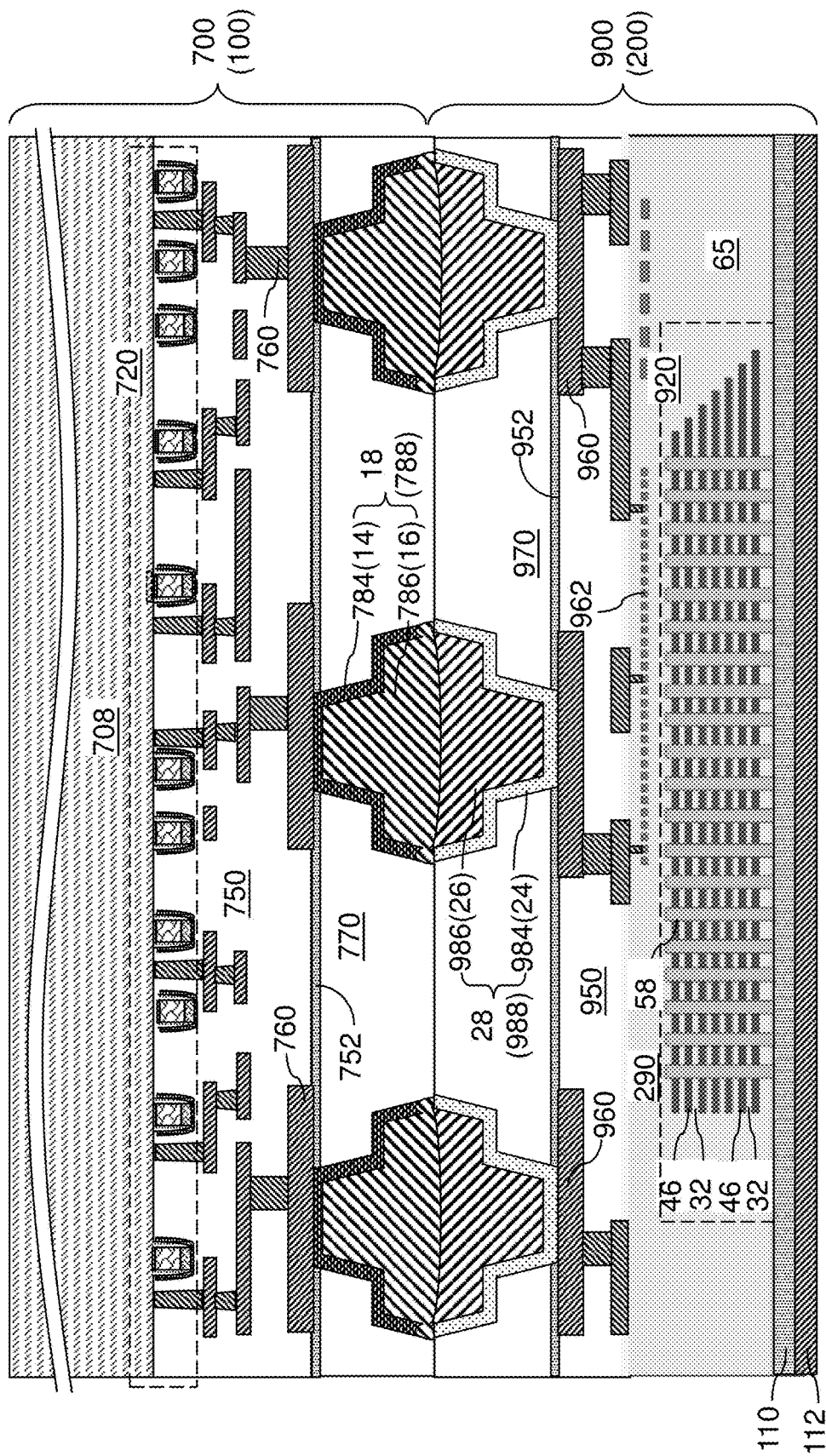

Referring to FIGS. 4C and 4D, the processing steps described with reference to respective FIGS. 3C and 3D may be performed as described above.

Figure 5:
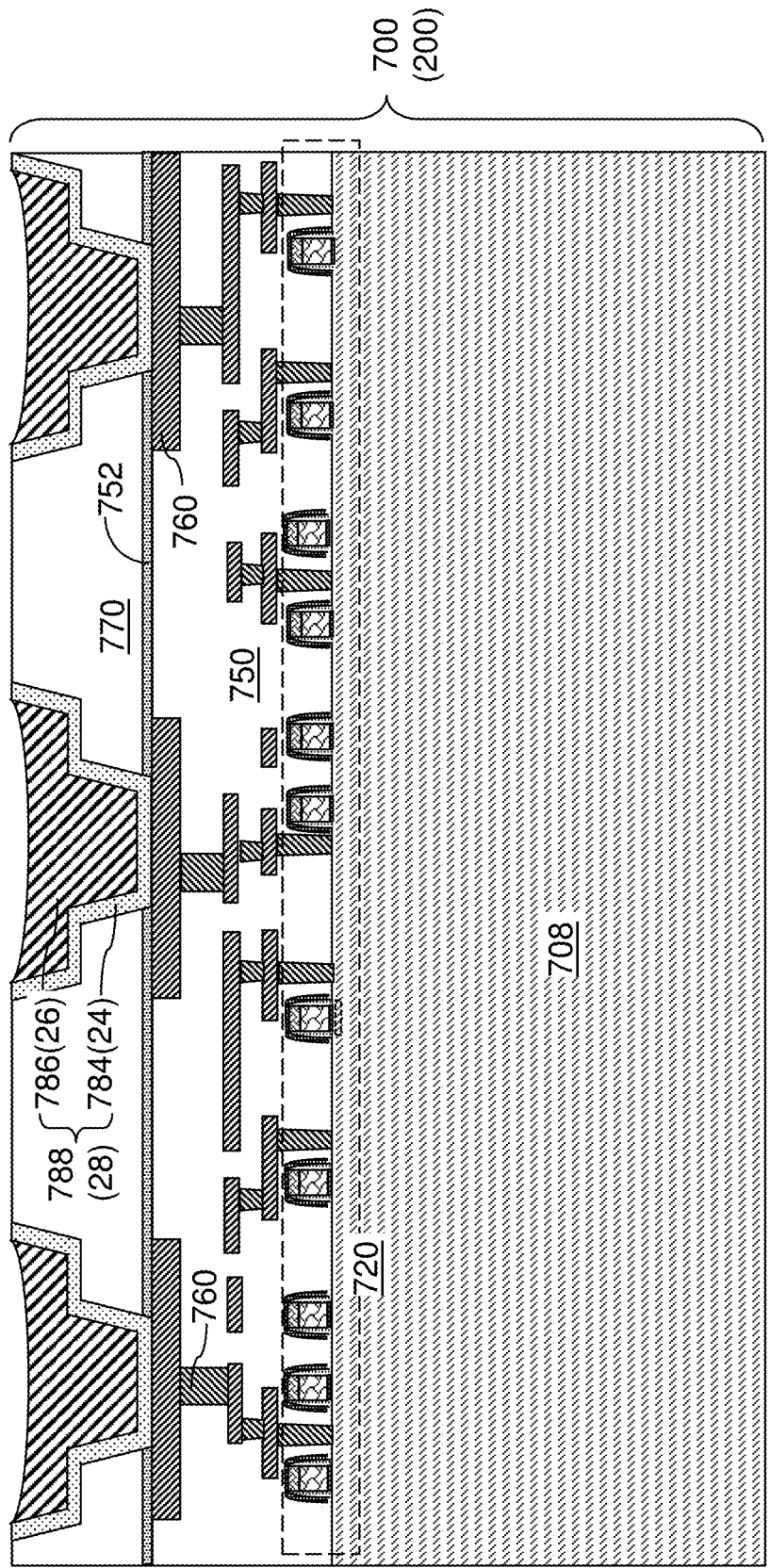
FIG. 5 is a schematic vertical cross-sectional view of a third configuration of a logic die after formation of logic-side bonding pads according to the first embodiment of the present disclosure.

Referring to FIG. 5, a third configuration of a logic die 700 is illustrated in which the size of opposing bonding pads differs from each other. Generally, the third configuration of the logic die 700 can be derived from the first configuration of the logic die 700 that is illustrated with reference to FIGS. 2C and 2D by increasing the size of each second bonding pad 28. Specifically, the lateral dimensions of the second bonding pads 28 can be selected such that the area of the top surface of each second copper material portion 26 is designed to include the entirety of the area of the top surface a respective first bonding pad 18 to be subsequently bonded thereto. Thus, the periphery of the concave top surface of each second bonding pad 28 may have a shape in a plan view that is laterally offset outward from a mirror image of the periphery of the outer sidewall of the first conductive barrier layer 14 of the first bonding pad 18 to which the second bonding pad 28 is to be subsequently bonded.

Figure 6A:
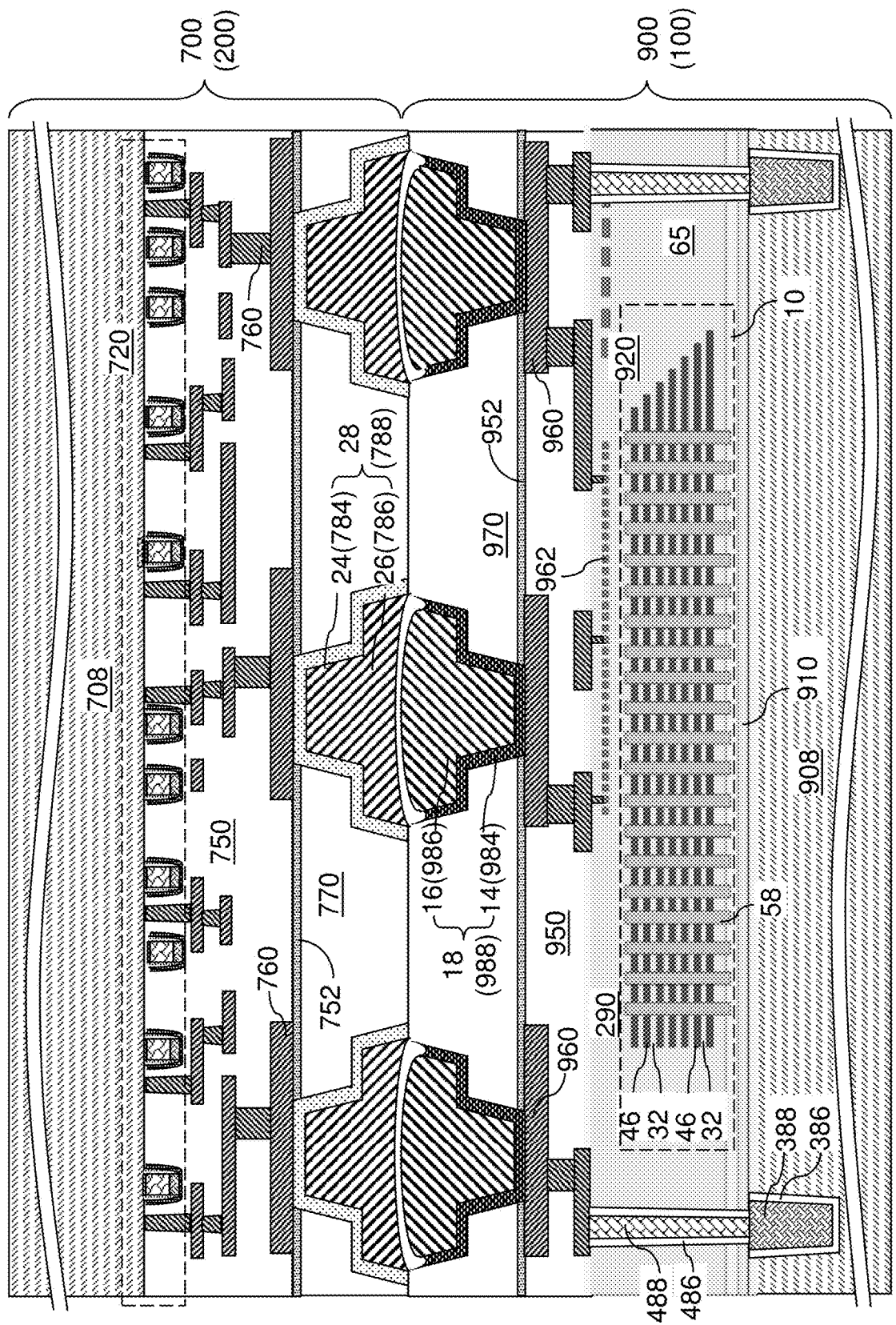
FIG. 6A is a schematic vertical cross-sectional view of the third configuration of the first exemplary structure after bonding the logic die to the memory die according to the first embodiment of the present disclosure.

Referring to FIG. 6A, the processing steps of FIG. 3A can be performed with any needed changes in view of the increase in the size of the second bonding pads 28, such that the second bonding pads 28 face the first bonding pads 18. In one embodiment, the annular top surfaces of the second conductive barrier layers 24 of the second bonding pads 28 may directly contact the top surface of the first bonding-level dielectric layer (such as the memory-side bonding-level dielectric layer 970). In one embodiment, an entirety of a top surface of the second conductive barrier layer 26 of a second bonding pad 28 may contact a horizontal surface of the first bonding-level dielectric layer.

Figure 6B:
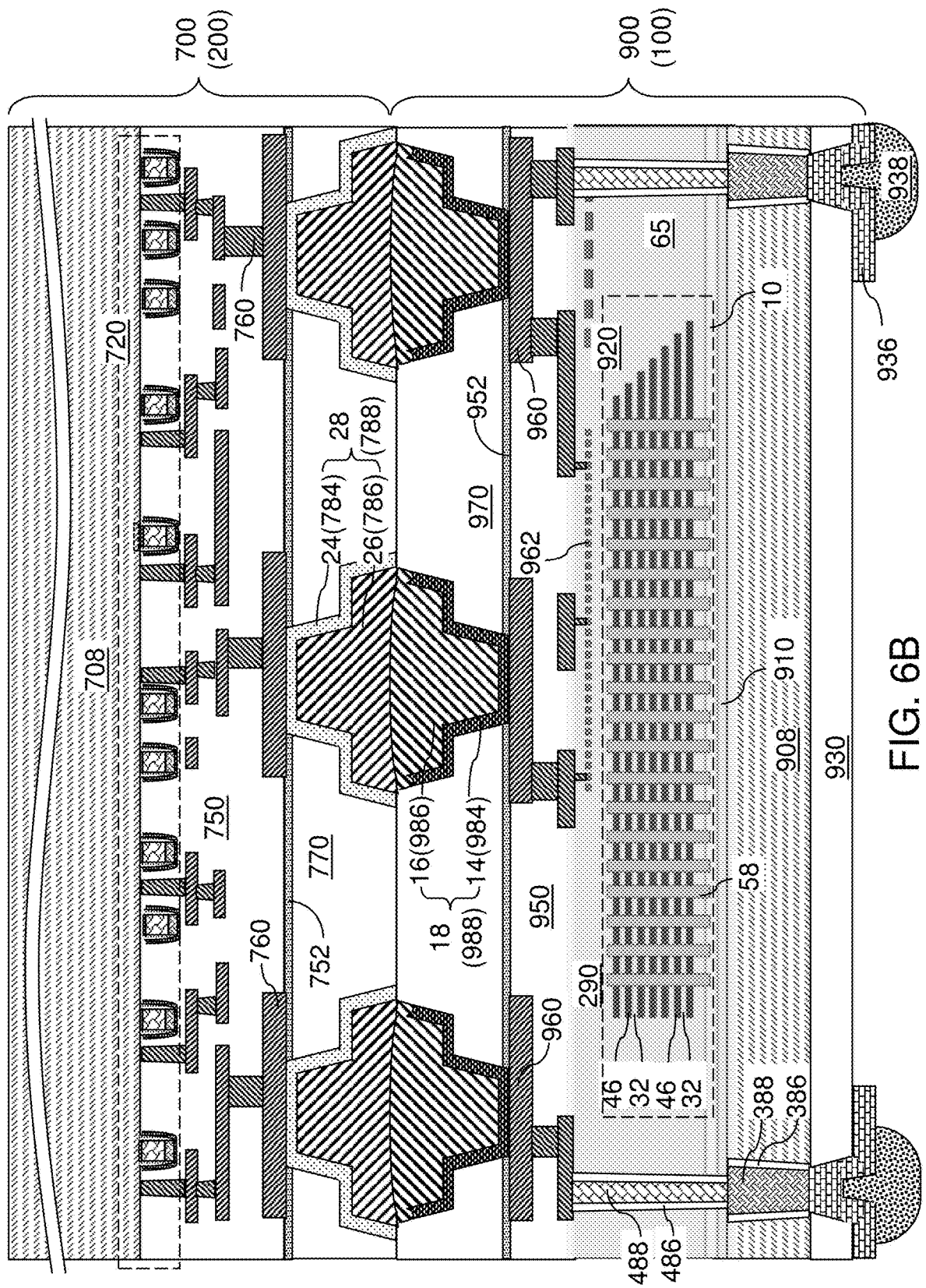
FIG. 6B is a schematic vertical cross-sectional view of the third configuration of the first exemplary structure after thinning the memory die and formation of external bonding structures according to the first embodiment of the present disclosure.

Referring to FIG. 6B, the processing steps of FIG. 3B can be performed to induce metal-to-metal bonding between each mating pair of a first copper material portion 16 and a second coper material portion 26. Dielectric-to-dielectric bonding (such as silicon oxide-to-silicon oxide bonding) may be performed simultaneously with the copper-to-copper bonding between the first bonding-level dielectric layer and the second bonding-level dielectric layer. Generally, the bonded pairs of a respective first copper material portion 16 and a respective second copper material portion 26 may have the same geometry, or similar geometry, as in the first configuration of the first exemplary structure described with reference to FIG. 3B. In the third configuration of the first exemplary structure, the entirety of a bonding surface of the first copper material portion 16 in a bonded pair of a first bonding pad 18 and a second bonding pad 28 may be in contact with a bonding surface of the second copper material portion 26. In one embodiment, an annular peripheral surface of the second copper material portion 26 of a second bonding pad 28 may be in contact with the first bonding-level dielectric layer (which may comprise a memory-side bonding-level dielectric layer 970). In one embodiment, an entirety of a top surface of the second conductive barrier layer 24 in a second bonding pad 28 may be in contact with the first bonding-level dielectric layer.

In this configuration, the convex first bonding pads 18 have a smaller width than the concave second bonding pads 28, such that the edges of the second copper material portions 26 fill the grooves 14G. This improves the bonding quality between the opposing bonding pads. Subsequently, the processing steps of FIG. 3C or 3D may be performed to thin the backside of the memory-side substrate 908 (or to remove it completely) and to form various backside bonding structures or a combination of the doped semiconductor source layer 110 and source line 112.

Figure 7A:
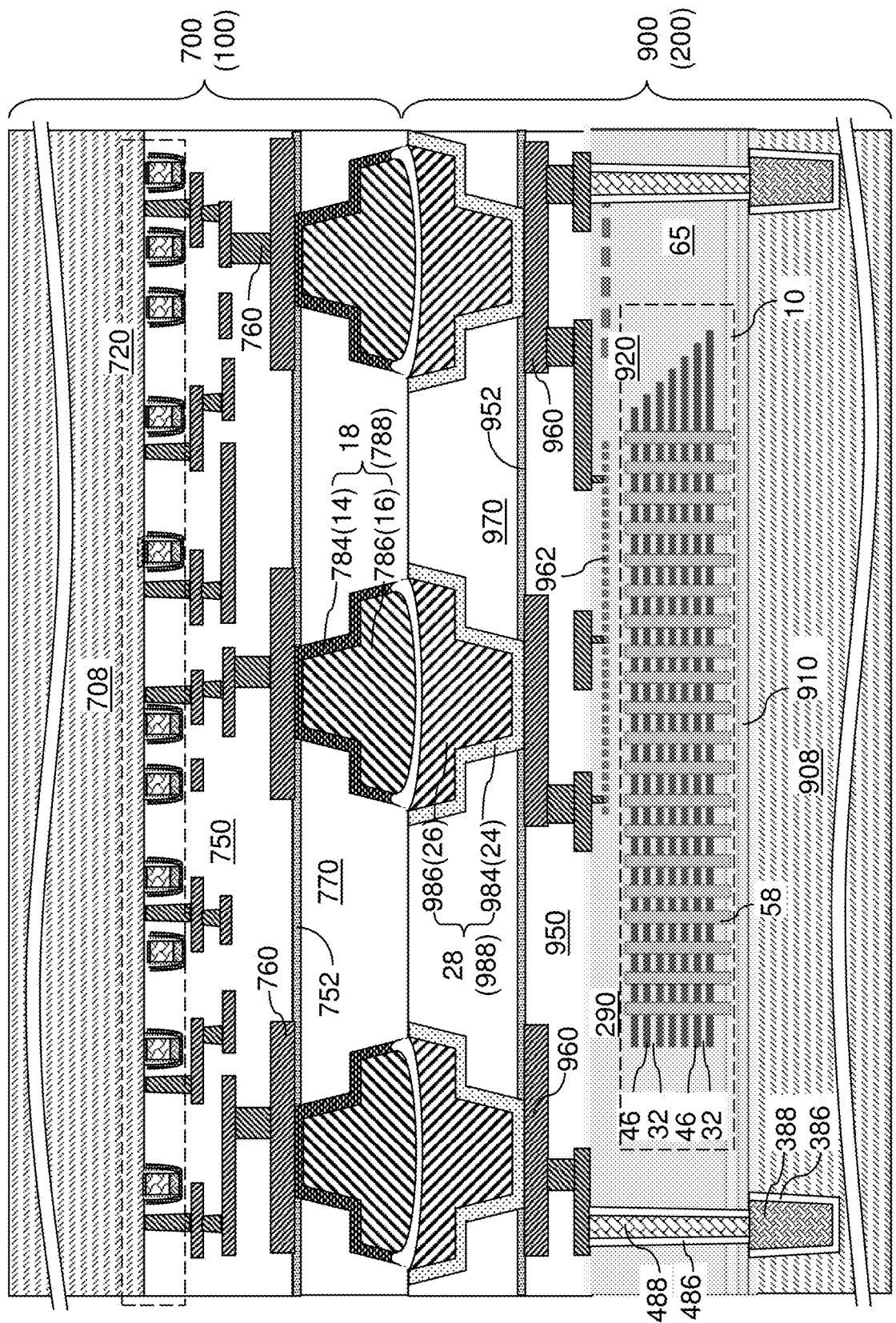
FIG. 7A is a schematic vertical cross-sectional view of a fourth configuration of the first exemplary structure after bonding the logic die to the memory die according to the first embodiment of the present disclosure.

Referring to FIG. 7A, a fourth configuration of the first exemplary structure is illustrated. The fourth configuration of the first exemplary structure can be derived from the third configuration of the first exemplary structure illustrated in FIG. 6A by forming the memory-side bonding pads 988 as second bonding pads 28, and by forming the logic-side bonding pads 788 as first bonding pads 18. In other words, the memory-side bonding pads 988 are formed as combinations of a respective second conductive barrier layer 24 and a respective second copper material portion 28 employing the second chemical mechanical planarization process described above, and the logic-side bonding pads 788 are formed as combinations of a respective first conductive barrier layer 14 and a respective first copper material portion 18 employing the first chemical mechanical planarization process described above.

Figure 7B:
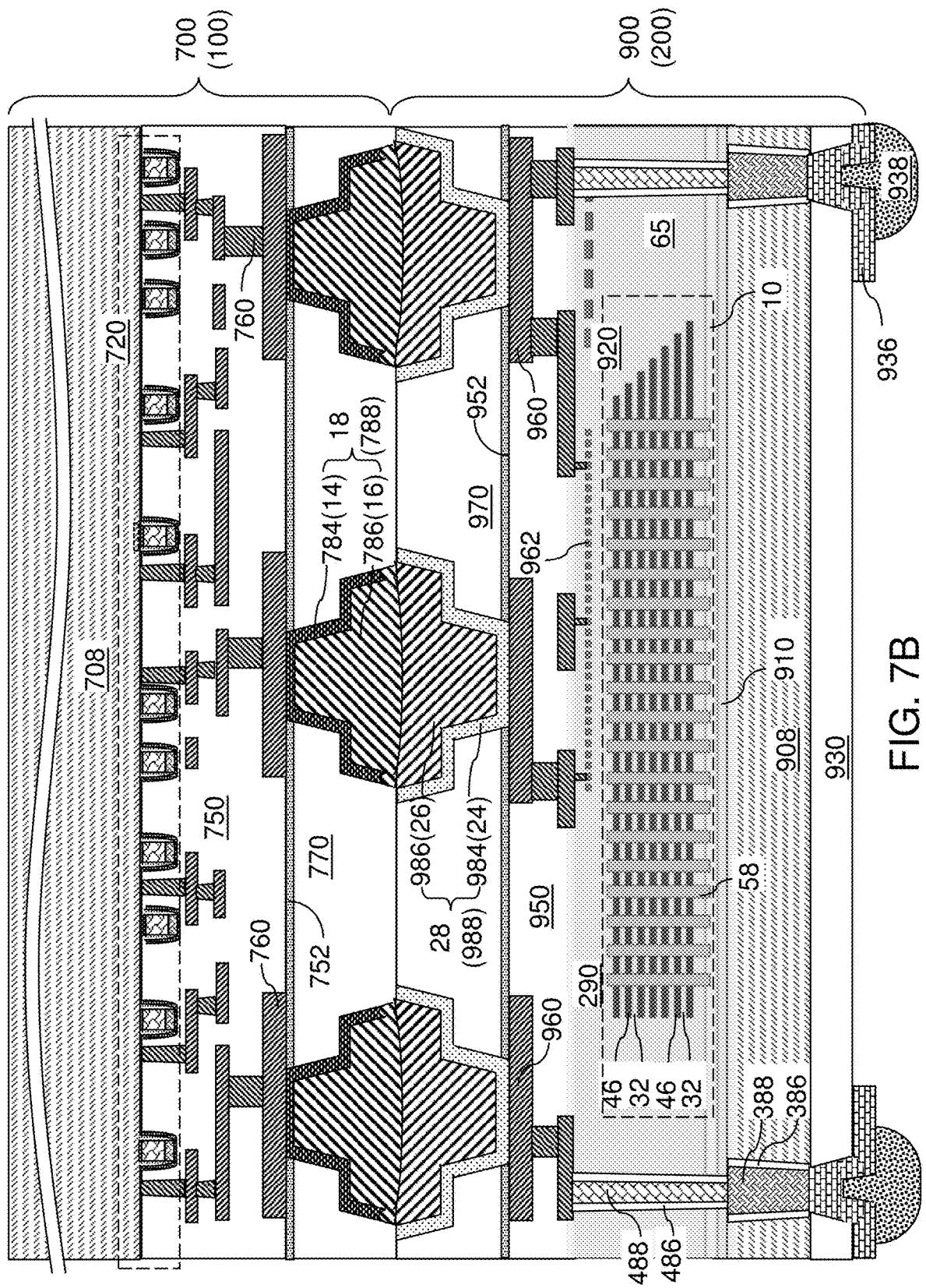
FIG. 7B is a schematic vertical cross-sectional view of the fourth configuration of the first exemplary structure after thinning the memory die and formation of external bonding structures according to the first embodiment of the present disclosure.

Referring to FIG. 7B, the processing steps described with reference to FIG. 6B may be performed to induce copper-to-copper bonding between each mating pair of a respective first copper material portion 16 and a respective second copper material portion 26. Dielectric-to-dielectric bonding (such as silicon oxide-to-silicon oxide bonding) may be performed simultaneously with the copper-to-copper bonding between the first bonding-level dielectric layer and the second bonding-level dielectric layer. The bonded pairs of a respective first copper material portion 16 and a respective second copper material portion 26 may have the same geometry as in the third configuration of the first exemplary structure described with reference to FIG. 6B. Subsequently, the processing steps described with reference to FIGS. 3C and 3D may be performed to thin the backside of the memory-side substrate 908 (or to remove it completely) and to form various backside bonding structures or a combination of the doped semiconductor source layer 110 and source line 112.

Referring to the first embodiment, and all drawings associated with the first exemplary structure, a bonded assembly comprises a first semiconductor die 100 comprising first semiconductor devices (920 or 720) and a first bonding pad 18. The first bonding pad comprises a first copper material portion 16 and a first conductive barrier layer 14 comprising a first conductive barrier material having a higher electrochemical potential than copper located between the first semiconductor devices (920 or 720) and the first copper material portion 16. The bonded assembly also includes a second semiconductor die 200 comprising second semiconductor devices (720 or 920) and a second bonding pad 28. The second bonding pad comprises a second copper material portion 26 and a second conductive barrier layer 24 comprising a second conductive barrier material having a lower electrochemical potential than copper located between the second semiconductor devices (720 or 920) and the second copper material portion 26. The second bonding pad is bonded to the first bonding pad.

In one embodiment, a bonding interface between the first bonding pads 18 and the second bonding pads 28 comprises a non-planar interface at which a convex surface of the first copper material portion 16 contacts a concave surface of the second copper material portion 26.

In one embodiment, the first semiconductor die 100 further comprises at least one first dielectric material layer, first metal interconnect structures embedded in the at least one first dielectric material layer and electrically connected to the first semiconductor devices, and a first bonding-level dielectric layer, wherein the first bonding pad is embedded in the first bonding-level dielectric layer and electrically connected to at least one of the first metal interconnect structures. The second semiconductor die further comprises at least one second dielectric material layer, second metal interconnect structures embedded in the at least one second dielectric material layer and electrically connected to the second semiconductor devices, and a second bonding-level dielectric layer, wherein the second bonding pad is embedded in the second bonding-level dielectric layer and electrically connected to at least one of the second metal interconnect structures.

In one embodiment, an entirety of a periphery of the convex surface of the first copper material portion 16 is adjoined to a surface of the first bonding-level dielectric layer (970 or 770). In one embodiment, the first conductive barrier layer 14 is vertically spaced from the second bonding pad 28 by a peripheral portion of the first copper material portion 16 that contacts a sidewall of the first bonding-level dielectric layer (970 or 770).

In one embodiment, the first conductive barrier layer 14 comprises a vertically-extending portion contacting a sidewall of the first bonding-level dielectric layer (970 or 770) and having a contoured top surface that continuously extends around the first copper material portion 16 and having a concave vertical cross-sectional profile; and a point of the concave top surface laterally midway between an inner sidewall and an outer sidewall of the concave top surface is more distal from a horizontal plane at which the first bonding-level dielectric layer (970 or 770) contacts the second bonding-level dielectric layer (770 or 970) than a point of the inner sidewall that is mot proximal to the horizontal plane, and than a point of the outer sidewall that is most proximal to the horizontal plane.

In one embodiment, a vertically extending portion of the first conductive barrier layer 14 comprises a moat-shaped groove 14G that laterally surrounds the first copper material portion 16 and having a concave profile; and a peripheral portion of the first copper material portion 16 fills the moat-shaped groove 14G and is disposed between the first conductive barrier layer 14 and the second bonding pad 28. In one embodiment, at least 80% of the bonding interface between the first bonding pads 18 and the second bonding pads 28 is located on a side of the second semiconductor die 200 with respect to a horizontal plane including an interface between the first bonding-level dielectric layer (970 or 770) and the second bonding-level dielectric layer (770 or 970).

In one embodiment, the first conductive barrier layer 14 is vertically spaced from the second bonding pad 28 by the first copper material portion 16, and the second conductive barrier layer 24 is in direct contact with the first copper material portion 16. In one embodiment, an entirety of a bonding surface of the first copper material portion 16 is in contact with a bonding surface of the second copper material portion 26. In one embodiment, an annular peripheral surface of the second copper material portion 26 is in contact with the first bonding-level dielectric layer (970 or 770), and an entirety of a top surface of the second conductive barrier layer 24 is in contact with the first bonding-level dielectric layer (970 or 770).

In one embodiment, the first conductive barrier layer 14 consists essentially of a material selected from cobalt, tantalum, or tantalum nitride. In one embodiment, the second conductive barrier layer 24 consists essentially of a material selected from ruthenium, titanium, or titanium nitride.

In one embodiment, the second bonding-level dielectric layer (770 or 970) is in direct contact with the first bonding-level dielectric layer (970 or 770) at a horizontal plane; a horizontal surface of a vertically-extending portion of the second conductive barrier layer 24 is located within the horizontal plane; and an annular surface of a vertically-extending portion of the first conductive barrier layer 14 that faces the second semiconductor die 200 and is most proximal to the second semiconductor die 200 is vertically spaced from the horizontal plane by a peripheral portion of the first copper material portion 16. In one embodiment, the annular surface comprises a non-planar grooved surface having a concave vertical cross-sectional profile, and the non-planar grooved surface is contacted entirely by the first copper material portion 16.

The combination of a convex bonding surface of a first copper material portion 16 and a concave bonding surface of a second copper material portion 26 reduces the volume of a cavity that needs to be filled through volume expansion of the copper material portions (16, 26) during a bonding anneal process. By reducing the volume of cavities to be filled during the bonding anneal process, the copper-to-copper bonding between mating pairs of copper material portions (16, 26) can be formed with greater adhesion strength and with less defects, thereby increasing the bonding yield.

Figure 8A:
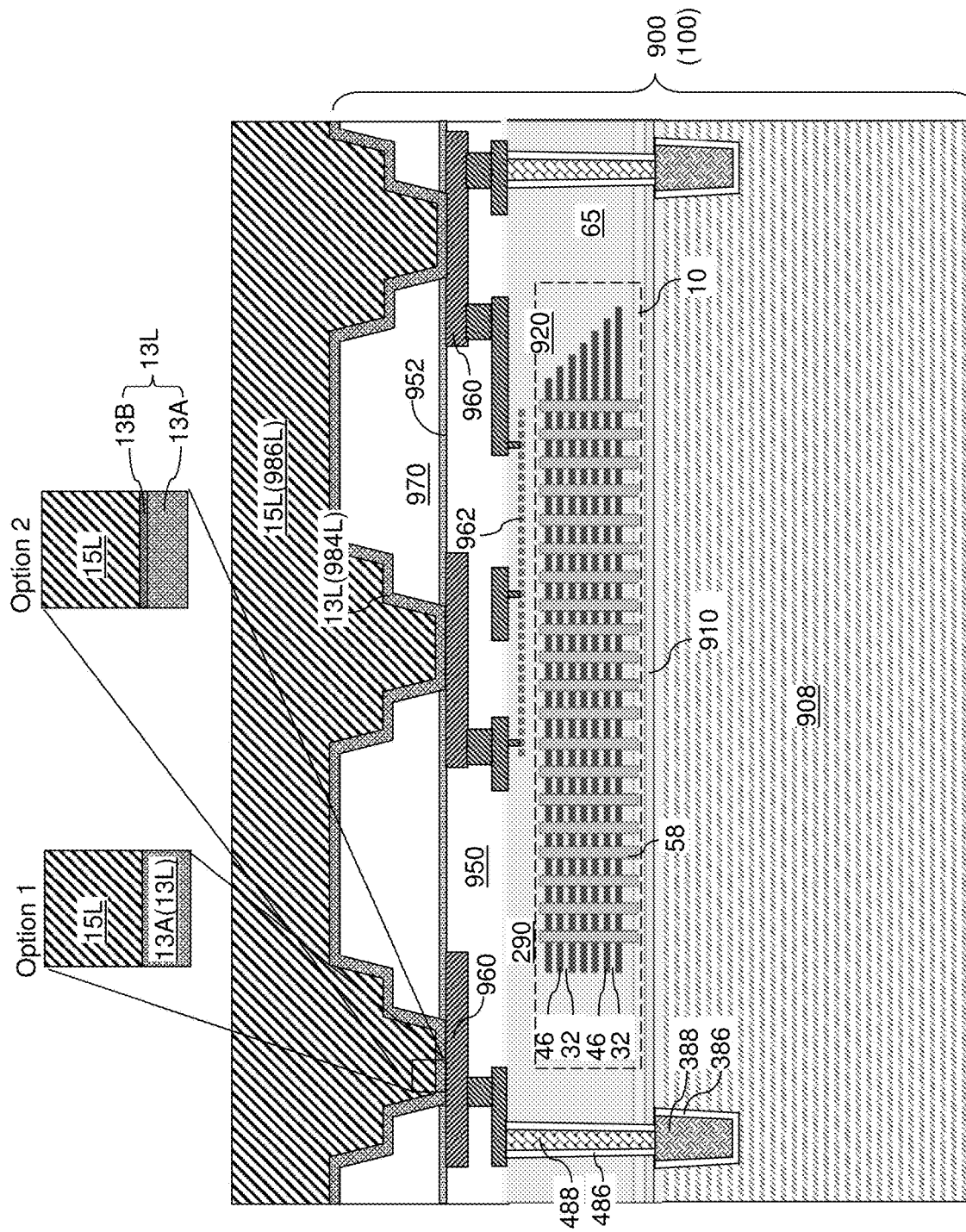
FIG. 8A is a vertical cross-sectional view of a first configuration of a memory die after formation of a memory-side conductive barrier layer and a memory-side copper layer according to a second embodiment of the present disclosure.

Referring to FIG. 8A, a first configuration of a memory die 900 according to a second embodiment of the present disclosure is illustrated. The memory die 900 can be employed to form first-type bonding pads, or first bonding pads thereupon. In one embodiment, the memory-side substrate 908 may be a portion of a commercially available silicon wafer having a thickness in a range from 500 microns to 1 mm. In one embodiment, a plurality of first semiconductor dies 100 can be provided on a first wafer.

The first configuration of the memory die 900 in the second embodiment of the present disclosure may be derived from the first configuration of the memory die 900 in the first embodiment of the present disclosure illustrated in FIG. 1A by forming a first conductive barrier layer 13L and a first copper layer 15L. The first conductive barrier layer 13L and the first copper layer 15L are employed to form first bonding pads in subsequent processing steps. The first conductive barrier layer 13L may comprise a memory-side conductive barrier layer 984L. The first copper layer 15L may comprise a memory-side copper layer 986L.

According to an aspect of the present disclosure, the material composition and the thickness of the first conductive barrier layer 13L are selected such that at least 10% of the volume fraction of a copper material portion in each first bonding pad may include (200) copper grains, where (200) is the Miller Index of the plane of the copper grains. The at least 10% of the volume fraction may be formed in polycrystalline copper after an anneal at an elevated temperature, such as an anneal at 150 degrees Celsius, for example. As used herein, crystallographic orientations of copper grains in a copper layer refer to the crystallographic plane within the copper layer that generates a Bragg peak in an x-ray scan in which the incidence angle and the reflection angle are the same, which is typically referred to as a θ:2θ scan. The incidence angle is measured between the direction of the incident X-ray beam and the horizontal plane that is perpendicular to the growth direction of the copper layer. The reflection angle is measured between the direction of the reflected X-ray beam and the horizontal plane that is perpendicular to the growth direction of the copper layer. In a θ:2θ scan, the detector angle 2θ (as measured between the direction of the incident beam and the reflected beam) is double the incidence angle θ that is measured between the incident beam and the sample surface, such as a horizontally-extending portion of the top surface of the first copper layer 15L that is parallel to the top surface of the first bonding-level dielectric layer. Thus, (200) copper grains are copper grains that generate a (200) peak in a θ:2θ X-ray scan. Similarly, (110) copper grains are copper grains that generate a (110) peak in a θ:2θ X-ray scan. (111) copper grains are copper grains that generate (111) peak in a θ:2θ X-ray scan. Generally, the (200) copper grains grow along a direction that is perpendicular to the [100] crystallographic orientation direction of copper, and therefore, include (100) crystallographic planes as horizontal planes. The (110) copper grains grow along a direction that is perpendicular to the [110] crystallographic orientation direction of copper, and therefore, include (110) crystallographic planes as horizontal planes. The (111) copper grains grow along a direction that is perpendicular to the [111] crystallographic orientation direction of copper, and therefore, include (111) crystallographic planes as horizontal planes.

Generally, slow recrystallization of electroplated copper results in formation of a predominant fraction of copper grains as (111) copper grains. In contrast, formation of (200) copper grains by annealing electroplated copper at any significant volume fraction is more difficult to achieve. According to an aspect of the present disclosure, the material composition and the thickness of the first conductive barrier layer 13L can be selected such that each first copper pad may include (200) copper grains at a volume fraction not less than 10% after an anneal process at 150 degrees Celsius prior to a bonding process. The present inventors found material compositions and/or thickness ranges that result formation of (200) copper grains at a volume fraction of at least 10% within first bonding pads that are formed after a first chemical mechanical planarization process, and preferably by performing a subsequent anneal at an elevated temperature, such as 100 to 200 degrees Celsius, such as 150 degrees Celsius.

Specifically, in one embodiment, the first conductive barrier layer 13L comprises a titanium layer 13A that is formed directly on, and thus is in direct contact with the first bonding-level dielectric layer (which may comprise the memory-side bonding-level dielectric layer 970). The first conductive barrier layer 13L has a thickness of at least 10 nm. For example, the titanium layer 13A is in direct contact with the first copper material portion 15 and has a thickness greater than 15 nm. The thickness of the titanium layer 13A may be in a range from 16 nm to 30 nm.

In a first example, which is herein referred to as Option 1, the first conductive barrier layer 13L may consist of the titanium layer 13A having a thickness greater than 15 nm, such as a thickness in a range from 16 nm to 30 nm. In this case, the first copper layer 15L can be formed directly on the titanium layer 13A, which is the entirety of the first conductive barrier layer 13L.

In a second example, which is herein referred to as Option 2, the first conductive barrier layer 13L comprises a tantalum layer 13B that is formed between the titanium layer 13A and the first copper layer 15L. In this case, the first copper layer 15L can be formed directly on the tantalum layer 13B. The thickness of the first conductive barrier layer 13L may be in a range from 10 nm to 60 nm, the thickness of the titanium layer 13A may be in a range from 5 nm to 30 nm, and the thickness of the tantalum layer 13B may be in a range from 5 nm to 30 nm, such as from 5 nm to 20 nm.

The thickness of the first copper layer 15L, as measured over a horizontal top surface of the first bonding-level dielectric layer, may be in a range from 300 nm to 6 microns, such as from 600 nm to 3 microns, although lesser and greater thicknesses may also be employed. The first copper layer 15L as deposited may be polycrystalline, amorphous or substantially amorphous, i.e., may include crystallographic grains at a volume fraction less than 10%, such as less than 5%, and/or less than 2%. The first copper layer 15L may be deposited using a two step deposition process which includes first depositing a copper seed layer by physical vapor deposition (e.g., sputtering) followed by depositing a copper fill layer on the copper seed layer by plating (e.g., electroplating).

Figure 8B:
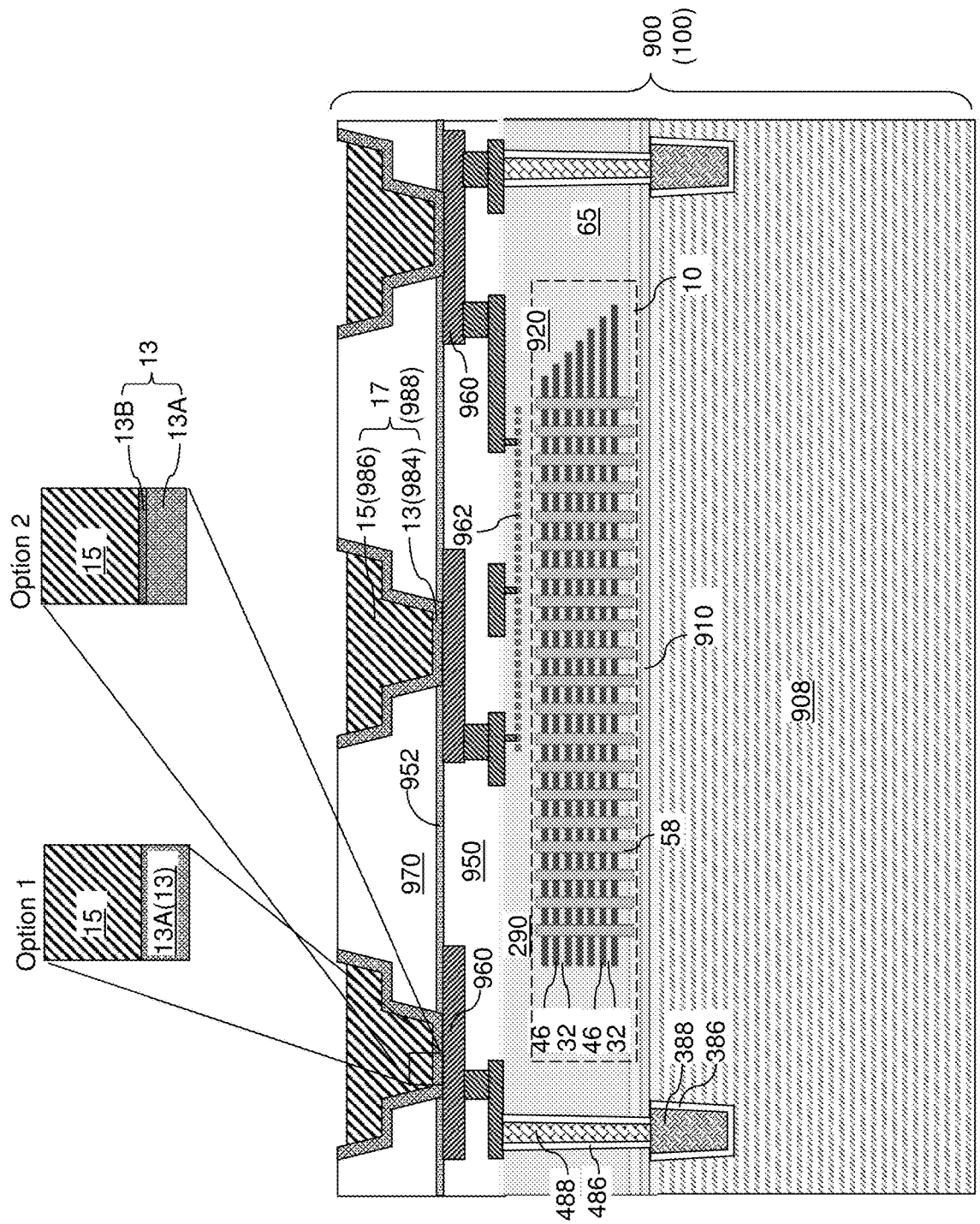
FIG. 8B is a vertical cross-sectional view of the first configuration of the memory die after formation of a memory-side bonding pads according to a second embodiment of the present disclosure.

Referring to FIG. 8B, a first chemical mechanical polishing (CMP) process can be performed to remove portions of the first copper layer 15L (which may comprise the memory-side copper layer 986L) and the first conductive barrier layer 13L (which may comprise the memory-side conductive barrier layer 984L) from above the top surface of the first bonding-level dielectric layer (which may comprise the memory-side bonding-level dielectric layer 970). Each remaining portion of the first copper layer 15L comprises the first copper material portion 15. Each remaining portion of the first conductive barrier layer 13L comprises a first conductive barrier layer 13. Each first copper material portion 15 is a memory-side copper material portion 986. Each first conductive barrier layer 13L is a memory-side conductive barrier layer 984 embedded within the memory-side bonding dielectric layer 970. Each contiguous combination of a first conductive barrier layer 13 and a first copper material portion 15 constitutes a first bonding pad 17, which is a memory-side bonding pad 988.

An anneal at an elevated temperature may be performed to induce formation of crystalline grains within the first copper material portions 15. Generally, the crystallization characteristics of thin copper films, such as copper films having a thickness less than 3,000 nm and/or less than 1,000 nm, is different from crystallization characteristics of thick copper films, and generates more (111) grains than thick copper films. According to an aspect of the present disclosure, the material composition and the thickness of the first conductive barrier layers 13 are selected such that more than 10% of the volume fraction of all copper material within each first copper material portion 15 includes (200) copper grains after a low temperature anneal at a relatively low temperature, such as an anneal at a temperature of 150 degrees Celsius. The duration of the anneal at the elevated temperature may be in a range from 10 minutes to 600 minutes, such as from 30 minutes to 300 minutes, although lesser and greater durations may also be employed. As discussed above, formation of more than 10% of the volume fraction of all copper material within each first copper material portion 15 as (200) copper grains may be achieved under several conditions. For example, the first conductive barrier layer 13 in each first bonding pad 17 may comprises a titanium layer 13A in direct contact with the first bonding-level dielectric layer. In one example, the titanium layer 13A in each first bonding pad 17 may be in direct contact with the first copper material portion 15 and may have a thickness greater than 15 nm. In this example, the first copper material portion 15 in contact with the titanium layer 13A may have a concave top (i.e., bonding) surface, as discussed above with respect to the first embodiment. In another example, the first conductive barrier layer 13 in each first bonding pad 17 further comprises a tantalum layer 13B disposed between the titanium layer 13A and the first copper material portion 15. In this example, the first copper material portion 15 in contact with the tantalum layer 13B may have a convex top (i.e., bonding) surface, as discussed above with respect to the first embodiment.

First bonding pads 17 are embedded in a first bonding-level dielectric layer (such as the memory-side bonding-level dielectric layer 970) and electrically connected to a respective one of the first metal interconnect structures (such as the memory-side metal interconnect structures 960). Each of the first bonding pads 17 comprises a first conductive barrier layer 13 including a material composition or a material stack that induces subsequent formation of more than 10% in volume fraction of (200) copper grains in the first copper material portions 15 after a subsequent anneal process. Each of the first bonding pads 17 comprises a first copper material portion 15 at least partially laterally surrounded by the first conductive barrier layer 13. A top surface of the first copper portion 15 in each first bonding pad 17 may be vertically recessed relative to the horizontal plane including the top surface of the first bonding-level dielectric layer.

Generally, a first semiconductor die 100 comprises first semiconductor devices, first metal interconnect structures embedded in first dielectric material layers and electrically connected to the first semiconductor devices, and a first bonding pad 17 embedded in a first bonding-level dielectric layer and electrically connected to one of the first metal interconnect structures. The first bonding pad 17 comprises a first conductive barrier layer 13 and a first copper material portion 15 laterally surrounded by the first conductive barrier layer 13 and including (200) copper grains at a volume fraction not less than 10%.

Figure 9A:
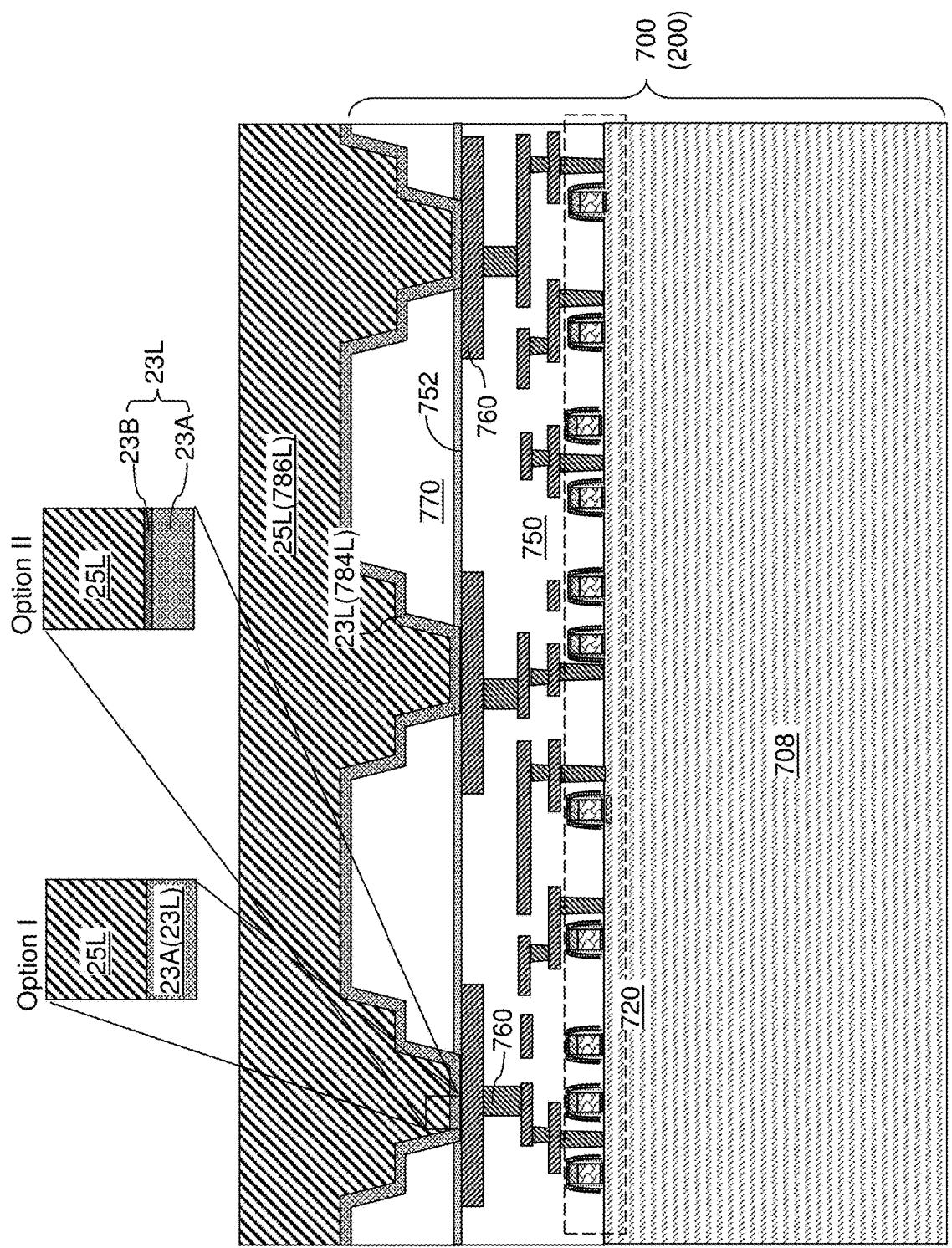
FIG. 9A is a vertical cross-sectional view of a first configuration of a logic die after formation of a logic-side conductive barrier layer and a logic-side copper layer according to a second embodiment of the present disclosure.

Referring to FIG. 9A, a first configuration of a logic die 700 for formation of a second exemplary structure is illustrated. Second-type bonding pads, which are also referred to as second bonding pads, can be subsequently formed on the logic die 700. In this case, the logic die 700 can be referred to as a second-type semiconductor die, or as a second semiconductor die 200. The logic die 700 includes a logic-side substrate 708, logic-side semiconductor devices 720 overlying the logic-side substrate 708, logic-side dielectric material layers 750 located on the logic-side semiconductor devices, and logic-side metal interconnect structures 760 embedded in the logic-side dielectric material layers 750. In one embodiment, the logic-side substrate 708 may be a commercially available silicon wafer having a thickness in a range from 500 microns to 2 mm. In one embodiment, a plurality of second semiconductor dies 200 may be provided on a second wafer.

The first configuration of the logic die 700 in the second embodiment of the present disclosure may be derived from the first configuration of the logic die 700 in the first embodiment of the present disclosure illustrated in FIG. 2A by forming a second conductive barrier layer 23L and a second copper layer 25L. The second conductive barrier layer 23L and the second copper layer 25L are employed to form second bonding pads in subsequent processing steps. The second conductive barrier layer 23L may be embodied as a logic-side conductive barrier layer 784L. The second copper layer 25L may be embodied as a logic-side copper layer 786L.

According to an aspect of the present disclosure, the material composition and/or the thickness of the second conductive barrier layer 23L are selected such that at least 10% of the volume fraction of a copper material portion in each second bonding pad may include (200) copper grains upon an anneal at an elevated temperature. Specifically, the second conductive barrier layer 23L comprises a titanium layer 23A that is formed directly on, and thus is in direct contact with the second bonding-level dielectric layer (which may comprise the logic-side bonding-level dielectric layer 770). The thickness of the second conductive barrier layer 23L is at least 10 nm. The titanium layer 23A is in direct contact with the second copper material portion 25 and has a thickness greater than 15 nm. The thickness of the titanium layer 23A may be in a range from 16 nm to 30 nm.

In a first example, which is herein referred to as Option I, the second conductive barrier layer 23L may consist of the titanium layer 23A having a thickness greater than 15 nm, such as a thickness in a range from 16 nm to 30 nm. In this case, the second copper layer 25L can be formed directly on the titanium layer 23A, which constitutes the entirety of the second conductive barrier layer 23L.

In a second example, which is herein referred to as Option II, the second conductive barrier layer 23L comprises a tantalum layer 23B that is formed between the titanium layer 23A and the second copper layer 25L. The thickness of the second conductive barrier layer 23 may be in a range from 10 nm to 60 nm, the thickness of the titanium layer 23A may be in a range from 5 nm to 30 nm, and the thickness of the tantalum layer 23B may be in a range from 5 nm to 30 nm, such as from 5 nm to 20 nm.

The thickness of the second copper layer 25L, as measured over a horizontal top surface of the second bonding-level dielectric layer, may be in a range from 300 nm to 6 microns, such as from 600 nm to 3 microns, although lesser and greater thicknesses may also be employed. The second copper layer 25L as deposited may be polycrystalline, amorphous, or substantially amorphous.

Figure 9B:
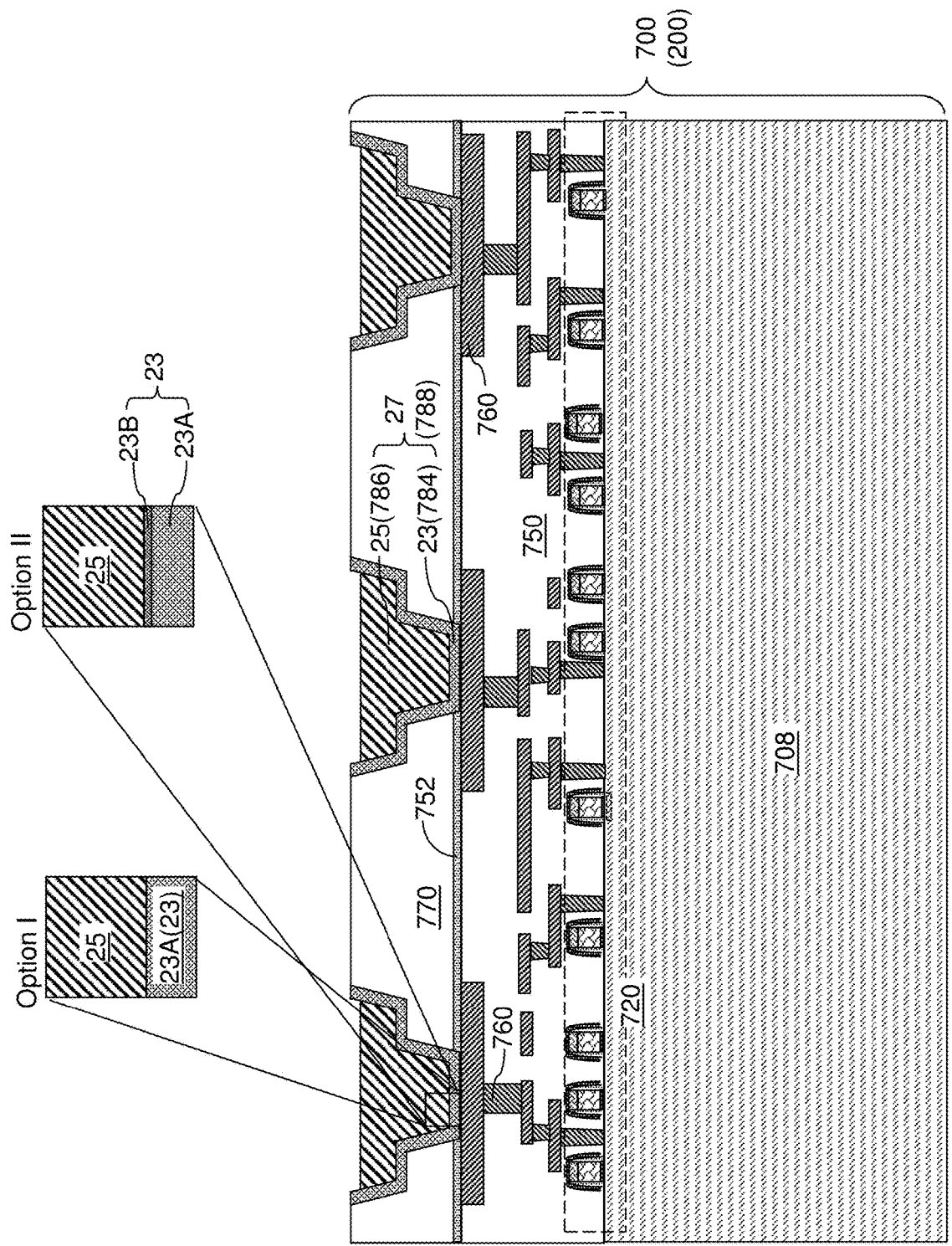
FIG. 9B is a vertical cross-sectional view of the first configuration of the logic die after formation of a logic-side bonding pads according to a second embodiment of the present disclosure.

Referring to FIG. 9B, a second chemical mechanical polishing (CMP) process can be performed to remove portions of the second copper layer 25L (comprising the logic-side copper layer 786L) and the second conductive barrier layer 23L (comprising the logic-side conductive barrier layer 784L) from above the top surface of the second bonding-level dielectric layer (comprising the logic-side bonding-level dielectric layer 770). Each remaining portion of the second copper layer 25L comprises the second copper material portion 25. Each remaining portion of the second conductive barrier layer 23L comprises a second conductive barrier layer 23. Each second copper material portion 25 is a logic-side copper material portion 786. Each second conductive barrier layer 23 is a logic-side conductive barrier layer 784 embedded within the logic-side bonding dielectric layer 770. Each contiguous combination of a second conductive barrier layer 23 and a second copper material portion 25 constitutes a second bonding pad 27, which is a logic-side bonding pad 788.

An anneal at an elevated temperature may be performed to induce formation of crystal grains within the second copper material portions 25. As described above, the material composition and/or the thickness of the second conductive barrier layers 23 are selected such that at least 10% of the volume fraction of all copper material within each second copper material portion 25 includes (200) copper grains after a low temperature anneal described above. In one example, the second conductive barrier layer 23 in each second bonding pad 27 may comprises a titanium layer 23A in direct contact with the second bonding-level dielectric layer. The titanium layer 23A in each second bonding pad 27 may be in direct contact with the second copper material portion 25 and may have a thickness greater than 15 nm. In another example, the second conductive barrier layer 23 in each second bonding pad 27 comprises a tantalum layer 23B disposed between the titanium layer 23A and the second copper material portion 25.

Second bonding pads 27 are embedded in a second bonding-level dielectric layer (such as the logic-side bonding-level dielectric layer 770) and electrically connected to a respective one of the second metal interconnect structures (such as the logic-side metal interconnect structures 760). Each of the second bonding pads 27 comprises a second conductive barrier layer 23 including a material composition or a material stack that induces subsequent formation of at least 10% in volume fraction of (200) copper grains in the second copper material portions 25 upon a subsequent anneal process. Each of the second bonding pads 27 comprises a second copper material portion 25 at least partially laterally surrounded by the second conductive barrier layer 23. A top surface of the second copper portion 25 in each second bonding pad 27 may be vertically recessed relative to the horizontal plane including the top surface of the second bonding-level dielectric layer.

Generally, a second semiconductor die 200 comprises second semiconductor devices, second metal interconnect structures embedded in second dielectric material layers and electrically connected to the second semiconductor devices, and a second bonding pad 27 embedded in a second bonding-level dielectric layer and electrically connected to one of the second metal interconnect structures. The second bonding pad 27 comprises a second conductive barrier layer 23 and a second copper material portion 25 laterally surrounded by the second conductive barrier layer 23 and including (200) copper grains at a volume fraction of at least 10%.

Figure 10A:
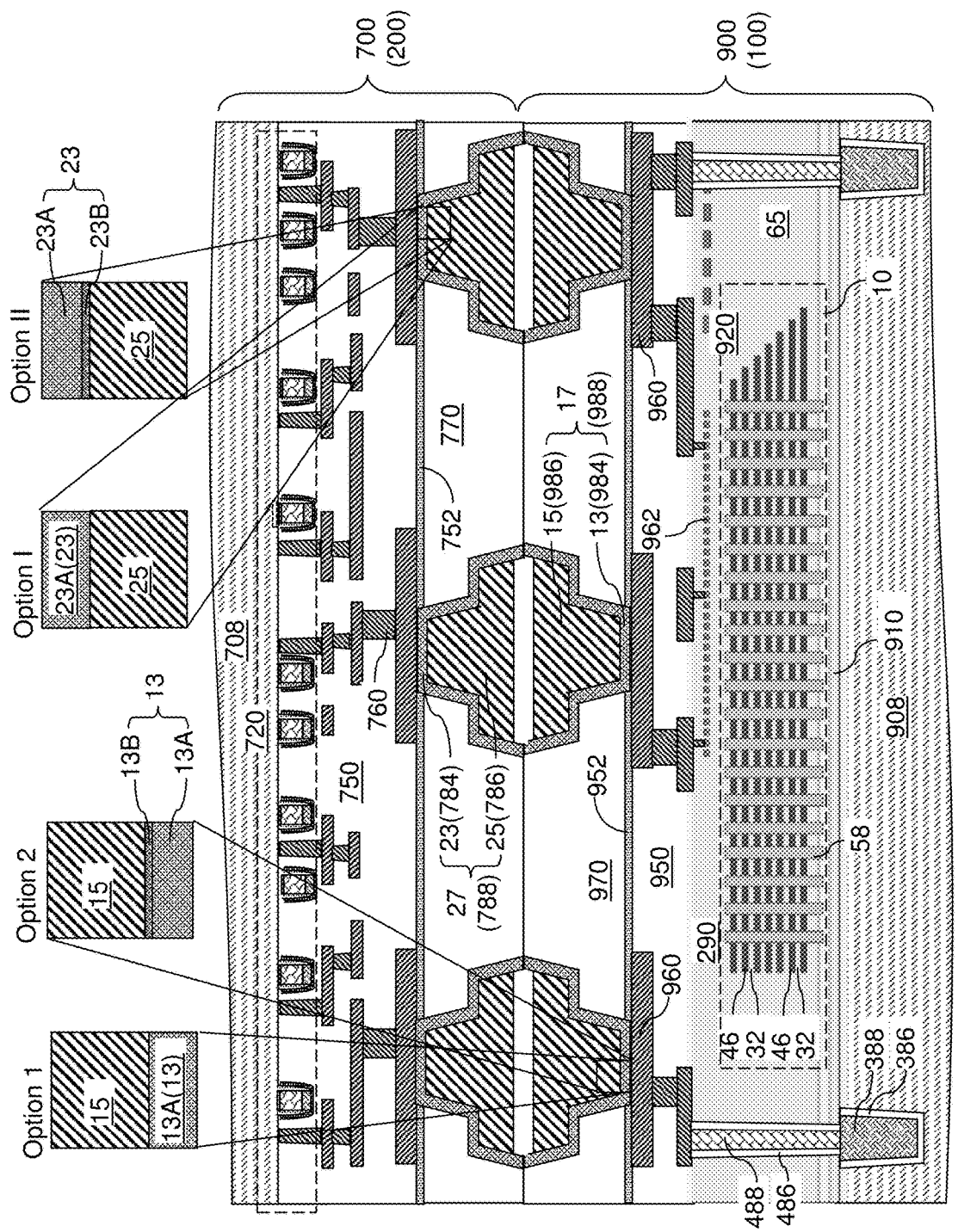
FIG. 10A is a schematic vertical cross-sectional view of a first configuration of a second exemplary structure after the logic die is disposed on the memory die for bonding according to the second embodiment of the present disclosure.

Referring to FIG. 10A, the first wafer including the plurality of first semiconductor dies 100 and the second wafer including the plurality of second semiconductor dies 200 can be aligned to each other for bonding. In this case, the front side of each wafer including the first bonding pads 17 or the second bonding pads 27 can face each other. The second bonding pads 27 can be arranged in a mirror image pattern of the first bonding pads 17, and the first wafer and the second wafer can be aligned such that each second bonding pad faces a respective first bonding pad and vice versa. In the illustrated example, the first semiconductor dies 100 can be memory dies 900, the second semiconductor dies 200 can be logic dies 700, the first bonding pads 17 can be memory-side bonding pads 988, and the second bonding pads 27 can be logic-side bonding pads 788.

In one configuration in which the first and the second embodiments are combined one of the first bonding pad 17 or the second bonding pad 27 has a concave vertical cross-sectional profile, and the other one of the first bonding pad 17 or the second bonding pad 27 has a convex vertical cross-sectional profile. Specifically, one of the first bonding pad 17 or the second bonding pad 27 may have the Option I configuration where the copper material portion directly contacts the titanium layer to form the concave vertical cross-sectional profile. The other one of the first bonding pad 17 or the second bonding pad 27 may have the Option II configuration where the copper material portion directly contacts the tantalum layer of the titanium-tantalum layer stack to form the convex vertical cross-sectional profile. The bonding of concave bonding pad to the opposing convex bonding pad may form the non-planar bonding interface and improve the bonding quality, as described above.

The first and second dies are brought into contact with each other such that each mating pair of a first bonding pad 17 and a second bonding pad 27 are aligned to each other. A cavity, which is herein referred to as a bonding cavity, may be formed between each mating pair of a first bonding pad 17 and a second bonding pad 27. In one embodiment, the volume of each bonding cavity may be in a range from 0.01% to 0.5%, such as from 0.03% 0.3% of the combined volume of the mating pair of a first copper material portion 15 and a second copper material portion 25.

Figure 10B:
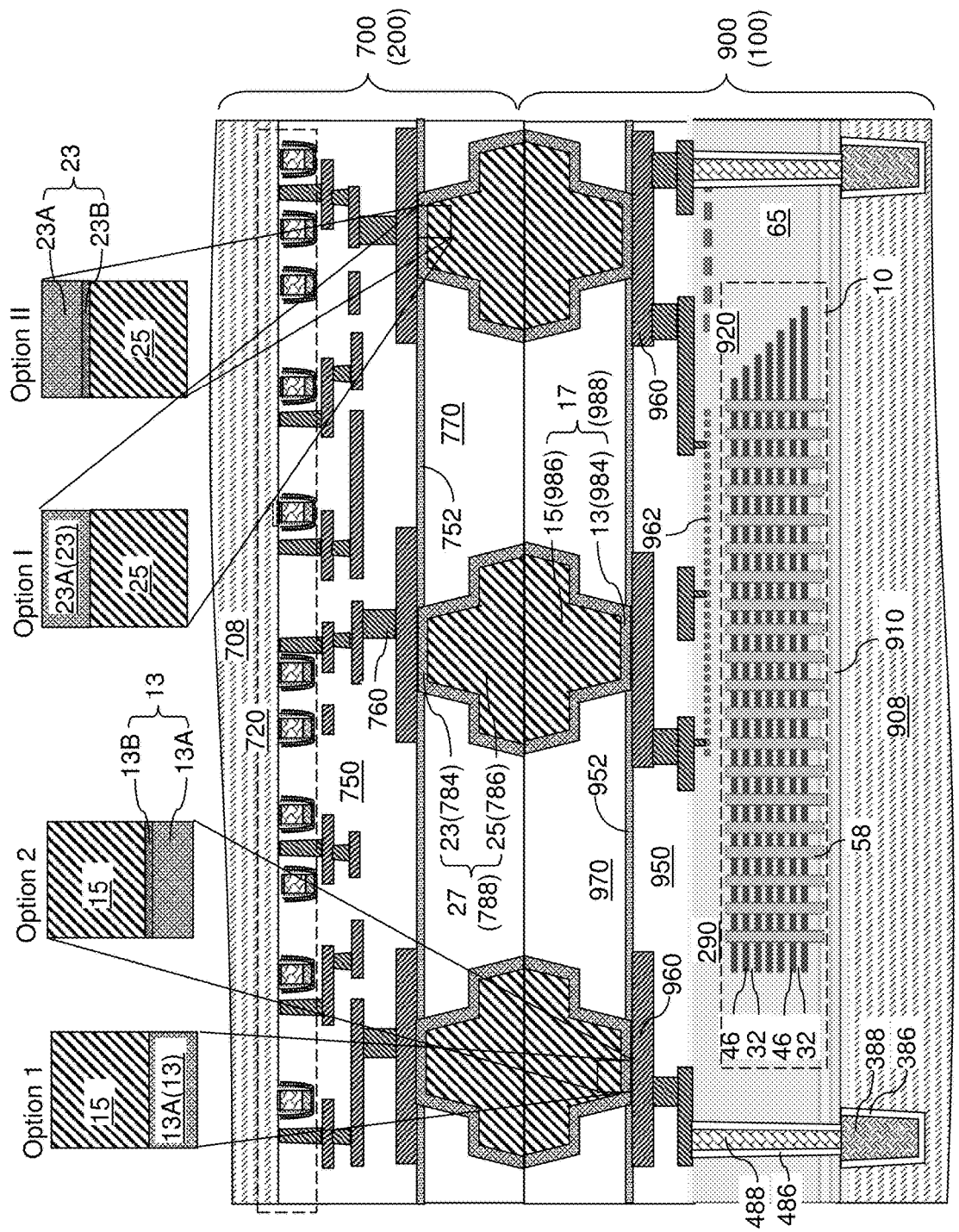
FIG. 10B is a schematic vertical cross-sectional view of the first configuration of the second exemplary structure after bonding the logic die to the memory die according to the second embodiment of the present disclosure.

Referring to FIG. 10B, a thermal anneal process can be performed at an elevated temperature to induce copper-to-copper bonding between each mating pair of a first bonding pad 17 and a second bonding pad 27. The elevated temperature of the thermal anneal process may be in a range from 300 degrees Celsius to 450 degrees Celsius, such as from 350 degrees Celsius to 425 degrees Celsius. The first copper material portions 15 and the second copper material portions 25 expand in volume during the thermal anneal process, and contact and are bonded to a respective mating copper material portion. In one embodiment, a bonding process may be performed to bond an array of first semiconductor dies 100 on a first substrate to an array of second semiconductor dies 200 on a second substrate.

Generally, copper-to-copper bonding can be induced between the second copper material portions 25 and the first copper material portions 15 such that each second bonding pad 27 can be bonded to a respective one of the first bonding pad 17, and each first bonding pad 17 can be bonded to a respective one of the second bonding pads 27. According to an aspect of the present disclosure, the first copper material portions 15 and the second copper material portions 25 include (200) copper grains at a volume fraction of at least 10%, such as from 10% to 80% and/or from 15% to 70%, and/or from 20% to 60%. The (200) copper grains provide a greater linear volume expansion along the grain growth direction (i.e., along the vertical direction perpendicular to the bonding interface) than directions that are perpendicular to the grain growth direction. In other words, the volume expansion of copper grains is not isotropic, but is the greatest along the growth directions of the (200) copper grains. For example, the ratio of the volume expansion rate (per unit temperature change) along the grain growth direction (i.e., a vertical direction) for (200) copper grains is believed to be greater than the volume expansion rate (per unit temperature change) along the grain growth direction for (110) and (111) copper grains.

Referring back to FIG. 10B, the higher the volume fraction of (200) copper grains in the first copper material portion 15 and in the second copper material portion 25, the greater the volume expansion of the first copper material portions 15 and the second copper material portions 25, and the lower the probability of insufficient contact between mating pairs of a respective first copper material portions 15 and the second copper material portions 25. By increasing the volume fraction of (200) copper grains above 10%, embodiments of the present disclosure increase copper volume expansion for the purpose of copper-to-copper bonding along the direction that is substantially perpendicular to the bonding interfaces, and improves the quality of copper-to-copper bonding.

Generally, the second bonding pads 27 can be bonded to the first bonding pads 17 by inducing copper-to-copper bonding between the second copper material portions 25 and the first copper material portions 15. In one embodiment, the second copper material portion includes (200) copper grains at a volume fraction of at least 10% (such as a volume fraction in a range from 10% to 80% and/or from 15% to 70%, and/or from 20% to 60%) prior to and after bonding the second bonding pads 27 to the first bonding pads 17. In one embodiment, the first conductive barrier layer 13 in each bonded pair of a first bonding pad 17 and a second bonding pad 27 includes a layer stack including a titanium layer 13A and a tantalum layer 13B that contacts the first copper material portion 15, or a titanium layer 13A having a thickness not less than 15 nm. In one embodiment, the second conductive barrier layer 23 includes a layer stack including a titanium layer 23A and a tantalum layer 23B that contacts the second copper material portion 25, or a titanium layer 23A having a thickness not less than 15 nm.

Figure 10C:
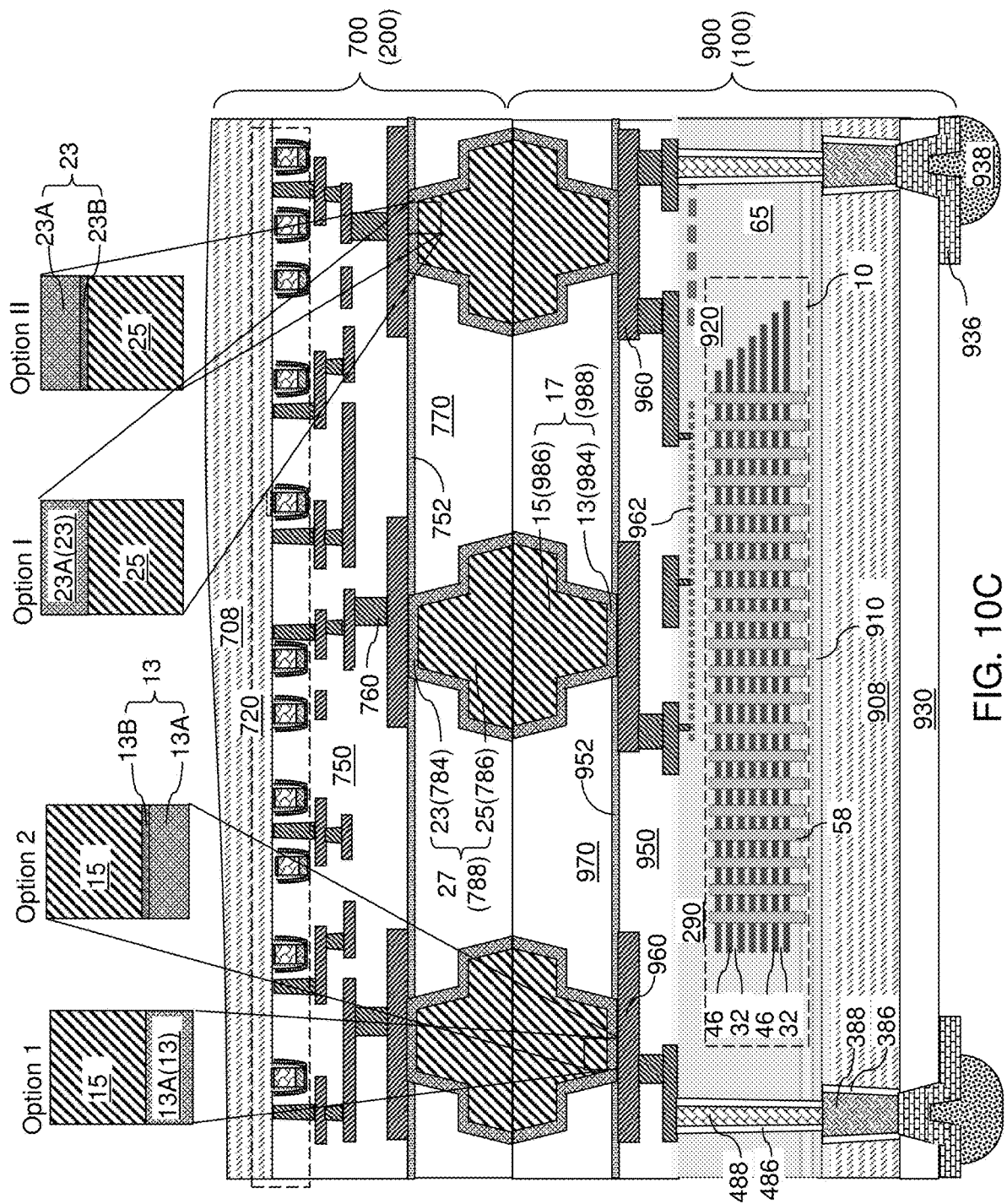
FIGS. 10C and 10D are schematic vertical cross-sectional views of alternative first configurations of the second exemplary structure after thinning the memory die according to the second embodiment of the present disclosure.

Referring to FIG. 10C, the processing steps of FIG. 3C can be performed to thin the backside of the memory-side substrate 908, and to form various backside bonding structures.

Figure 10D:
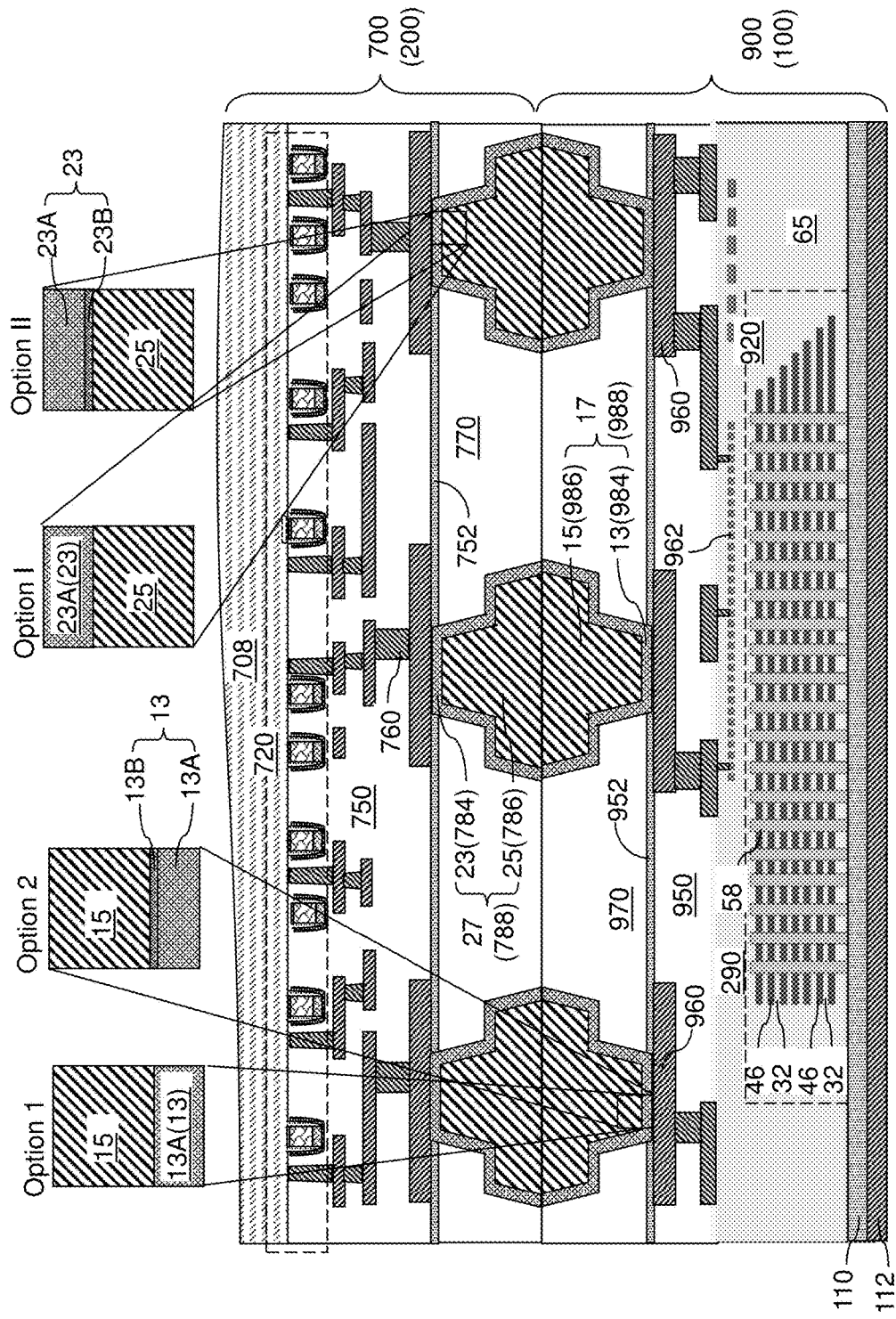

Alternatively, referring to FIG. 10D, a doped semiconductor source layer 110 is formed in contact with the exposed tips of the semiconductor channels, and a conductive source line (e.g., source contact) 112 is then formed on the doped semiconductor source layer 110, as described with regard to FIG. 3D.

Figure 11A:
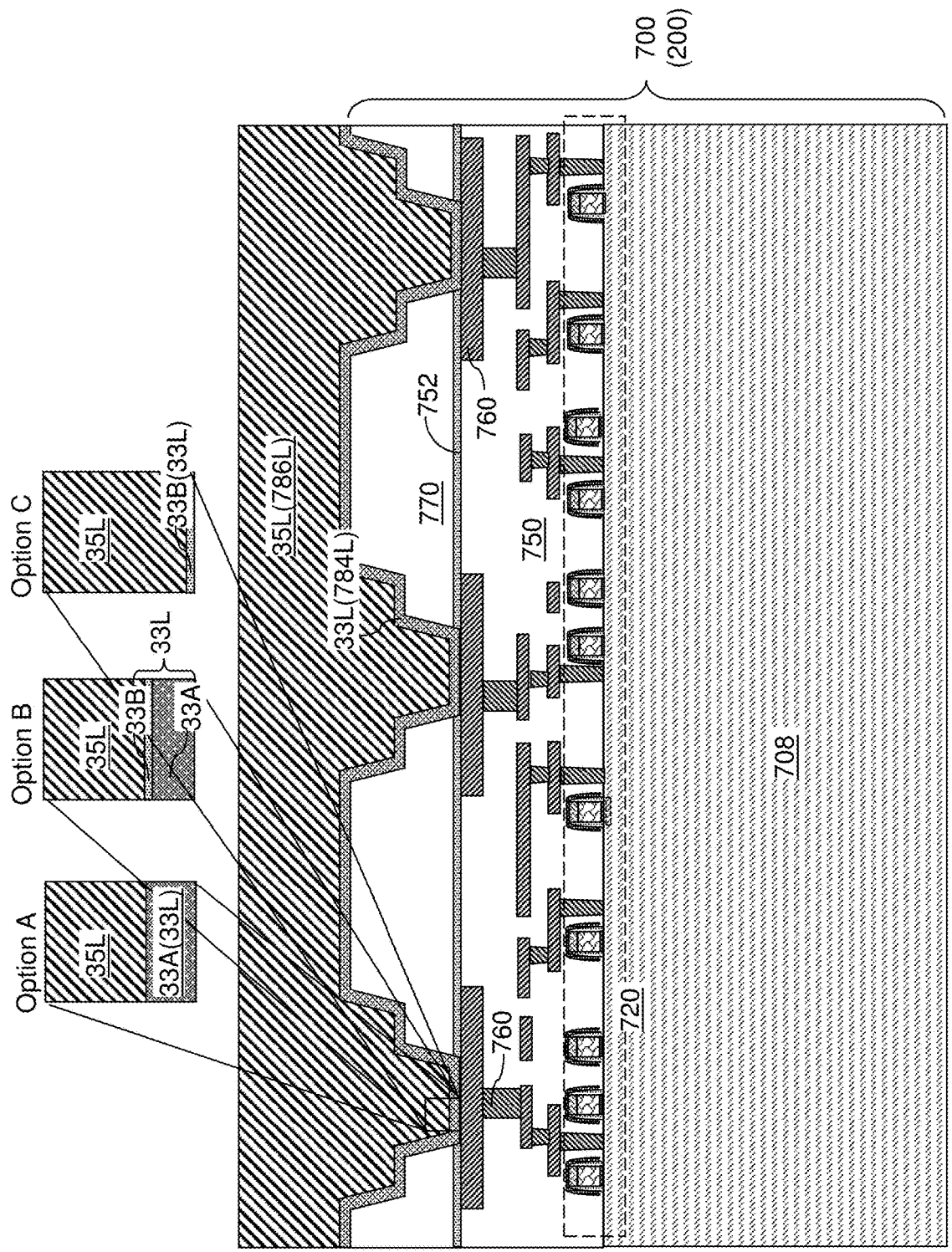
FIG. 11A is a vertical cross-sectional view of a second configuration of a logic die after formation of a logic-side conductive barrier layer and a logic-side copper layer according to a second embodiment of the present disclosure.

Referring to FIG. 11A, a second configuration of a logic die 700 according to a second embodiment of the present disclosure is illustrated. The second configuration of the logic die 700 can be derived from the first configuration of the logic die 700 illustrated in FIG. 10A by employing a second conductive barrier layer 33L having a different material composition than the second conductive barrier layer 23L in the first configuration of the logic die 700 in the second embodiment of the present disclosure as illustrated in FIG. 9A. The second conductive barrier layer 33L is formed as a logic-side conductive barrier layer 784L. A second copper layer 35L can be formed on the second conductive barrier layer 33L. The second copper layer 35L is formed as a logic-side copper layer 786L.

According to an aspect of the present disclosure, the material composition and the thickness of the second conductive barrier layer 33L are selected such that at least 95% of the volume fraction of a copper material portion in each second bonding pad may include (111) copper grains, such as after an anneal at an elevated temperature, such as a temperature of 100 to 200 degrees Celsius, for example 150 degrees Celsius. In some embodiments, the second conductive barrier layer 33L comprises a tantalum layer 33A in direct contact with the second bonding-level dielectric layer (such as the logic-side bonding-level dielectric layer 770) without contacting an underlying titanium layer. In some embodiments, the second conductive barrier layer 33L comprises a titanium layer 33B having a thickness of 10 nm or less in direct contact with the second copper material portion 35. In some embodiments, the second conductive barrier layer 33L is a stack of an underlying tantalum layer 33A and an overlying titanium layer 33B having a thickness of 10 nm or less in direct contact with the second copper material portion 35.

In a first example, which is herein referred to as Option A, the second conductive barrier layer 33L consists of a tantalum layer 33A having a thickness greater than 10 nm, such as a thickness in a range from 15 nm to 30 nm. In this case, the second copper layer 35L can be formed directly on the tantalum layer 33A, which comprises the entirety of the second conductive barrier layer 23L.

In a second example, which is herein referred to as Option B, the second conductive barrier layer 23L comprises a stack of a tantalum layer 33A and a titanium layer 33B. The tantalum layer 33A is in direct contact with the second bonding-level dielectric layer (such as the logic-side bonding-level dielectric layer 770). The titanium layer 33B is in direct contact with the second copper material portion 35. The thickness of the titanium layer 33B is less than the thickness of the tantalum layer 33A. The thickness of the second conductive barrier layer 33L may be in a range from 15 nm to 30 nm, the thickness of the tantalum layer 33A may be in a range from 15 nm to 30 nm, and the thickness of the titanium layer 33B may be in a range from 0 nm to 10 nm, such as from 1 nm to 6 nm and/or from 2 nm to 4 nm.

In a third example, which is herein referred to as Option C, the second conductive barrier layer 33L consists of a titanium layer having a thickness of 10 nm or less, such as from 1 nm to 6 nm and/or from 2 nm to 4 nm. In this case, the second copper layer 35L can be formed directly on the titanium layer 33B, which comprises the entirety of the second conductive barrier layer 23L.

The thickness of the second copper layer 35L, as measured over a horizontal top surface of the second bonding-level dielectric layer, may be in a range from 300 nm to 6 microns, such as from 600 nm to 3 microns, although lesser and greater thicknesses may also be employed. The second copper layer 35L as deposited may be polycrystalline, amorphous, or substantially amorphous.

Figure 11B:
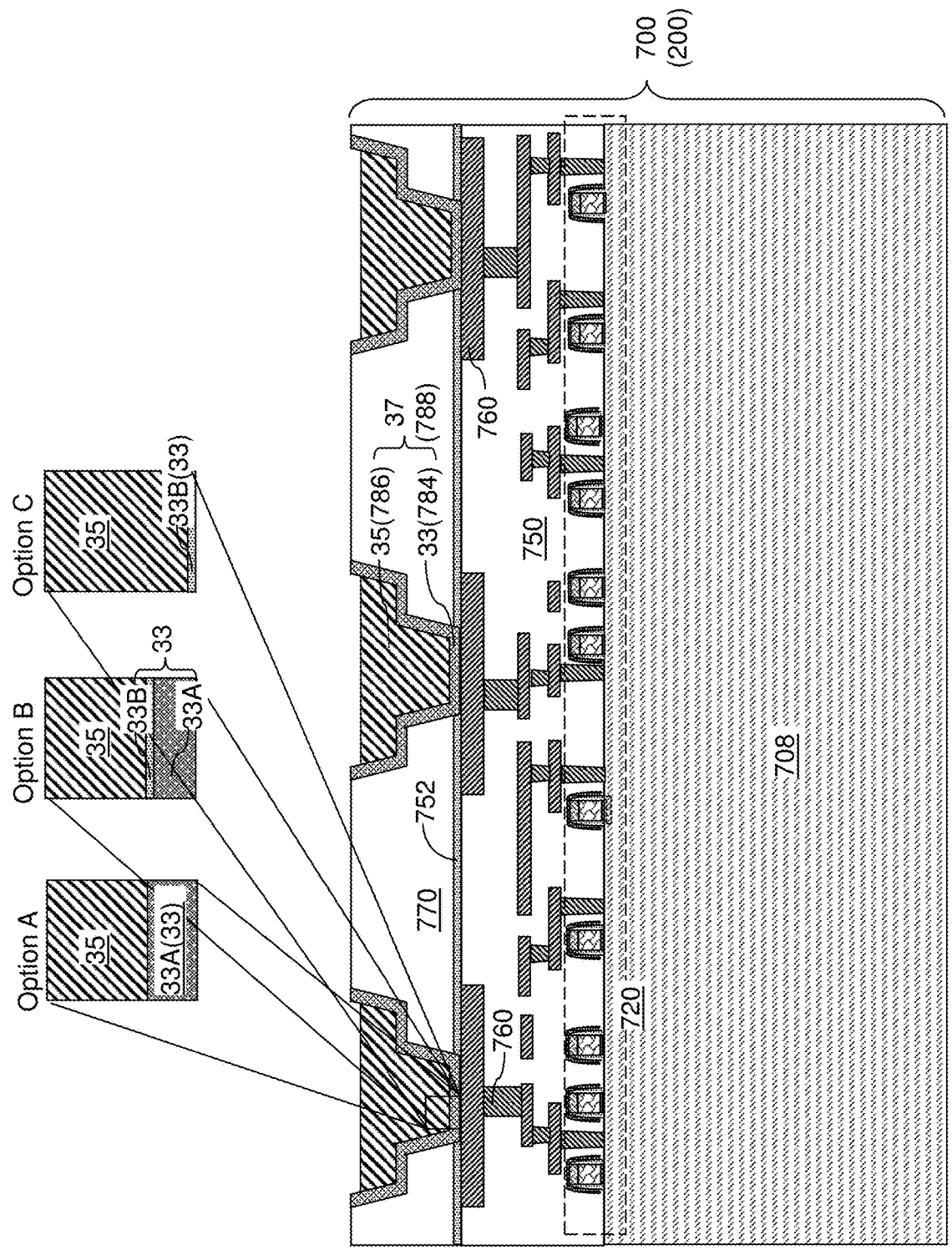
FIG. 11B is a vertical cross-sectional view of the second configuration of the logic die after formation of a logic-side bonding pads according to a second embodiment of the present disclosure.

Referring to FIG. 11B, a second chemical mechanical polishing (CMP) process can be performed to remove portions of the second copper layer 35L (comprising the logic-side copper layer 786L) and the second conductive barrier layer 33L (comprising the logic-side conductive barrier layer 784L) from above the top surface of the second bonding-level dielectric layer (comprising the logic-side bonding-level dielectric layer 770). Each remaining portion of the second copper layer 35L comprises the second copper material portion 35. Each remaining portion of the second conductive barrier layer 33L comprises a second conductive barrier layer 33. Each second copper material portion 35 is a logic-side copper material portion 786. Each second conductive barrier layer 33 is a logic-side conductive barrier layer 784 embedded within the logic-side bonding dielectric layer 770. Each contiguous combination of a second conductive barrier layer 33 and a second copper material portion 35 constitutes a second bonding pad 37, which is a logic-side bonding pad 788.

An anneal at an elevated temperature may be performed to induce formation of crystal grains within the second copper material portions 35. According to an aspect of the present disclosure, the material composition and/or the thickness of the second conductive barrier layers 33 are selected such that at least 95% of the volume fraction of all copper material within each second copper material portion 35 includes (111) copper grains. The duration of the anneal at the elevated temperature of 100 to 200 degrees Celsius may be in a range from 30 minutes to 600 minutes, such as from 30 minutes to 300 minutes, although lesser and greater durations may also be employed. Without wishing to be bound by a particular theory, the present inventors believe that copper formed directly on thin titanium barrier layers (e.g., having a thickness or 10 or less) or directly on tantalum barrier layers without an underlying titanium barrier layer have a predominant (111) orientation in which at least 95 volume percent of all grains have a (111) orientation.

Second bonding pads 37 are embedded in a second bonding-level dielectric layer (such as the logic-side bonding-level dielectric layer 770) and electrically connected to a respective one of the second metal interconnect structures (such as the logic-side metal interconnect structures 760). Each of the second bonding pads 37 comprises a second conductive barrier layer 33 including a material composition or a material stack that induces subsequent formation of at least 95% in volume fraction of (111) copper grains in the second copper material portions 35 upon a subsequent anneal process. Thus, at least 95%, such as from 95% to 100%, and/or from 96% to 99%, of the volume fraction of a copper material portion in each second bonding pad 35 may include (111) copper grains upon an anneal at an elevated temperature (which may be about 150 degrees Celsius). Each of the second bonding pads 37 comprises a second copper material portion 35 at least partially laterally surrounded by the second conductive barrier layer 33. A top surface of the second copper portion 35 in each second bonding pad 37 may be vertically recessed relative to the horizontal plane including the top surface of the second bonding-level dielectric layer.

Generally, a second semiconductor die 200 comprises second semiconductor devices, second metal interconnect structures embedded in second dielectric material layers and electrically connected to the second semiconductor devices, and a second bonding pad 37 embedded in a second bonding-level dielectric layer and electrically connected to one of the second metal interconnect structures. The second bonding pad 37 comprises a second conductive barrier layer 33 and a second copper material portion 35 laterally surrounded by the second conductive barrier layer 33 and including (111) copper grains at a volume fraction of at least 95%.

Figure 12A:
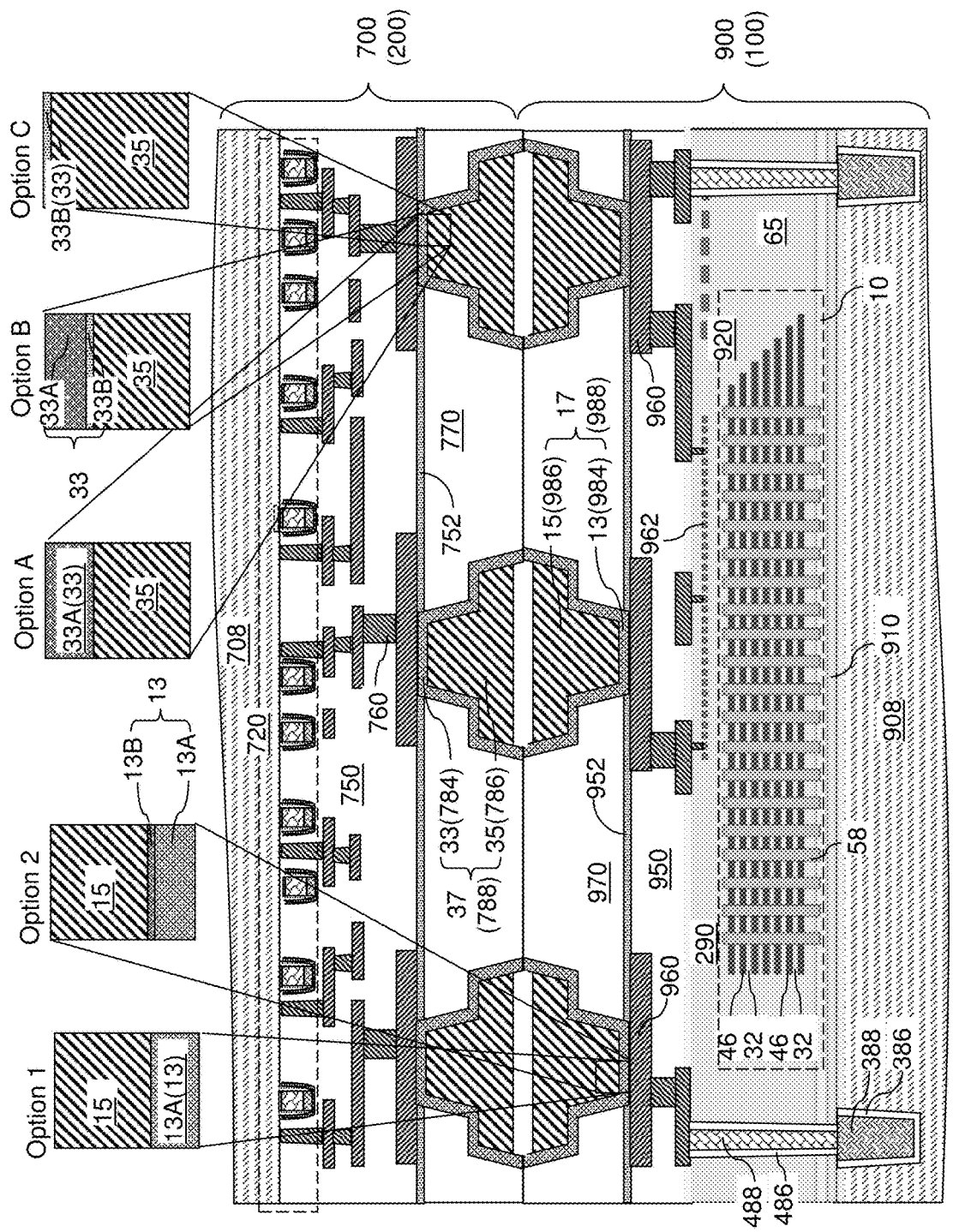
FIG. 12A is a schematic vertical cross-sectional view of a second configuration of a second exemplary structure after the logic die is disposed on the memory die for bonding according to the second embodiment of the present disclosure.

Referring to FIG. 12A, a second configuration of the second exemplary structure according to the second embodiment of the present disclosure is illustrated. A first wafer can be provided, which includes a plurality of first semiconductor dies 100 that includes multiple instances of the first semiconductor die 100 as illustrated in FIG. 8C. A second wafer can be provided, which includes a plurality of second semiconductor dies 200 that includes multiple instances of the second semiconductor die as illustrated in FIG. 11B. The first wafer and the second wafer can be aligned to each other for bonding. In this case, the front side of each wafer including the first bonding pads 17 or the second bonding pads 37 can face each other. The second bonding pads 37 can be arranged in a mirror image pattern of the first bonding pads 17, and the first wafer and the second wafer can be aligned such that each second bonding pad faces a respective first bonding pad and vice versa. In the illustrated example, the first semiconductor dies 100 can be memory dies 900, the second semiconductor dies 200 can be logic dies 700, the first bonding pads 17 can be memory-side bonding pads 988, and the second bonding pads 37 can be logic-side bonding pads 788.

The first bonding-level dielectric layer can be brought into contact with the second bonding-level dielectric layer while each mating pair of a first bonding pad 17 and a second bonding pad 37 remains aligned to each other. A cavity, which is herein referred to as a bonding cavity, may be formed between each mating pair of a first bonding pad 17 and a second bonding pad 37. In one embodiment, the volume of each bonding cavity may be in a range from 0.01% to 0.5%, such as from 0.03% 0.3% of the combined volume of the mating pair of a first copper material portion 15 and a second copper material portion 35.

Figure 12B:
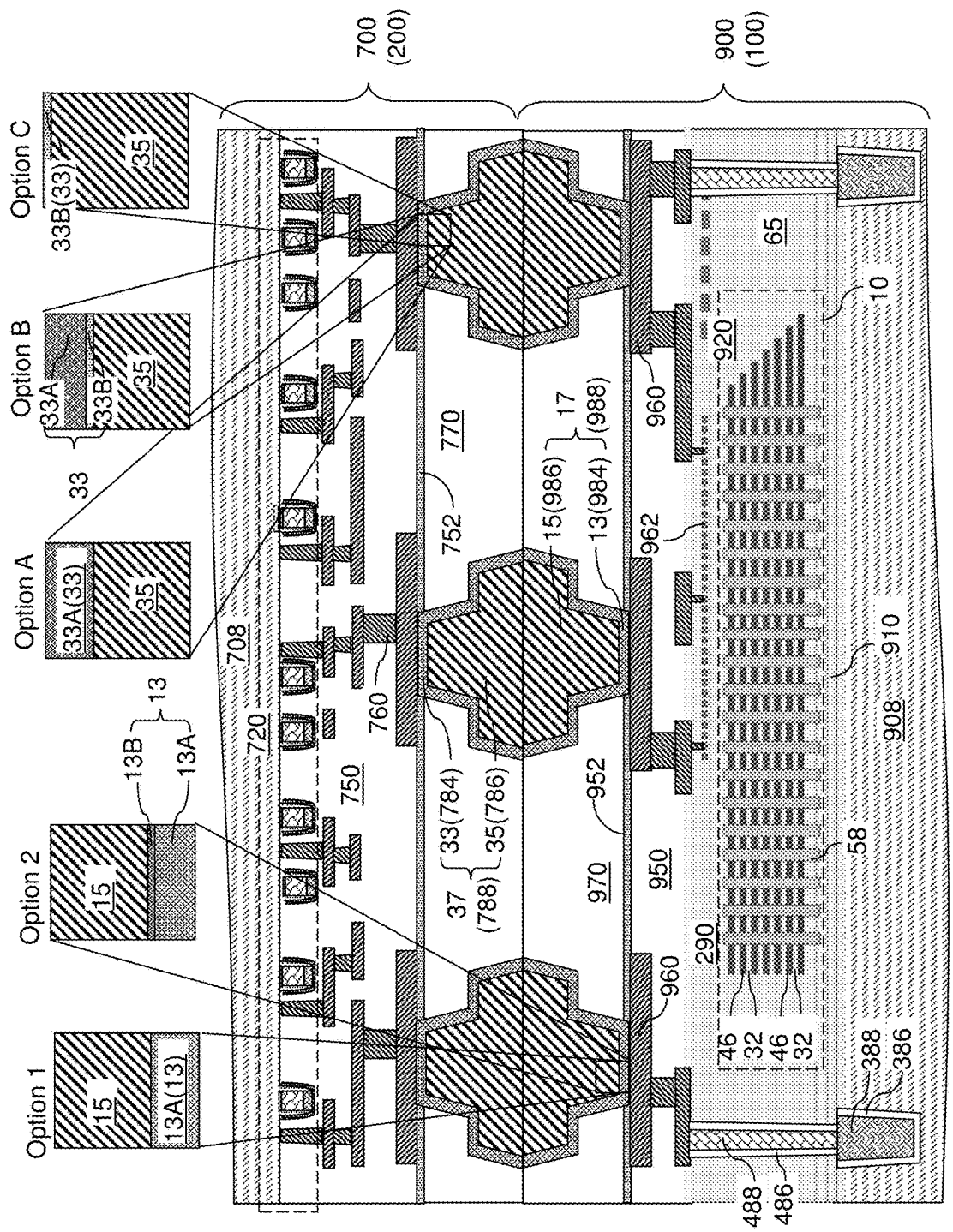
FIG. 12B is a schematic vertical cross-sectional view of the second configuration of the second exemplary structure after bonding the logic die to the memory die according to the second embodiment of the present disclosure.

Referring to FIG. 12B, a thermal anneal process can be performed at an elevated temperature to induce copper-to-copper bonding between each mating pair of a first bonding pad 17 and a second bonding pad 37. The elevated temperature of the thermal anneal process may be in a range from 300 degrees Celsius to 450 degrees Celsius, such as from 350 degrees Celsius to 425 degrees Celsius. The first copper material portions 15 and the second copper material portions 35 expand in volume during the thermal anneal process, and contact and are bonded to a respective mating copper material portion.

Generally, copper-to-copper bonding can be induced between the second copper material portions 35 and the first copper material portions 15 such that each second bonding pad 37 can be bonded to a respective one of the first bonding pads 17, and each first bonding pad 17 can be bonded to a respective one of the second bonding pads 37. According to an aspect of the present disclosure, the first copper material portions 15 include (200) copper grains at a volume fraction of at least 10%, such as from 10% to 80% and/or from 15% to 70%, and/or from 20% to 60%. According to another aspect of the present disclosure, the second copper material portions 35 include (111) copper grains at a volume fraction of at least 95%, such as from 95% to 100%, and/or from 96% to 99%.

The (200) copper grains provide a greater liner volume expansion along the grain growth direction (i.e., along the vertical direction) than directions that are perpendicular to the grain growth direction as discussed above. The (111) copper grain provide greater surface diffusivity than the (200) copper grains. The higher surface diffusivity of the (111) copper grains promote copper diffusion along the bonding interfaces between the first copper material portions 15 and the second copper material portions 35 to enhance the adhesion at the bonding interface during the bonding process.

Generally, the second bonding pads 37 can be bonded to the first bonding pads 17 by inducing copper-to-copper bonding between the second copper material portions 35 and the first copper material portions 15. In one embodiment, the first conductive barrier layer 13 in each bonded pair of a first bonding pad 17 and a second bonding pad 37 includes a layer stack including a titanium layer 13A and a tantalum layer 13B that contacts the first copper material portion 15; or a titanium layer 13A having a thickness not less than 15 nm. In one embodiment, the second copper material portion 35 in each bonded pair of a first bonding pad 17 and a second bonding pad 37 includes (111) copper grains at a volume fraction not less than 95% prior to and after bonding the second bonding pad 37 to the first bonding pad 17. In one embodiment, the second conductive barrier layer 33 in each bonded pair of a first bonding pad 17 and a second bonding pad 37 consists of: a layer stack including a tantalum layer 33A and a titanium layer 33B that contacts the second copper material portion 35; a titanium layer 33B having a thickness less than 10 nm; or a tantalum layer 33A without an underlying titanium layer.

Figure 12C:
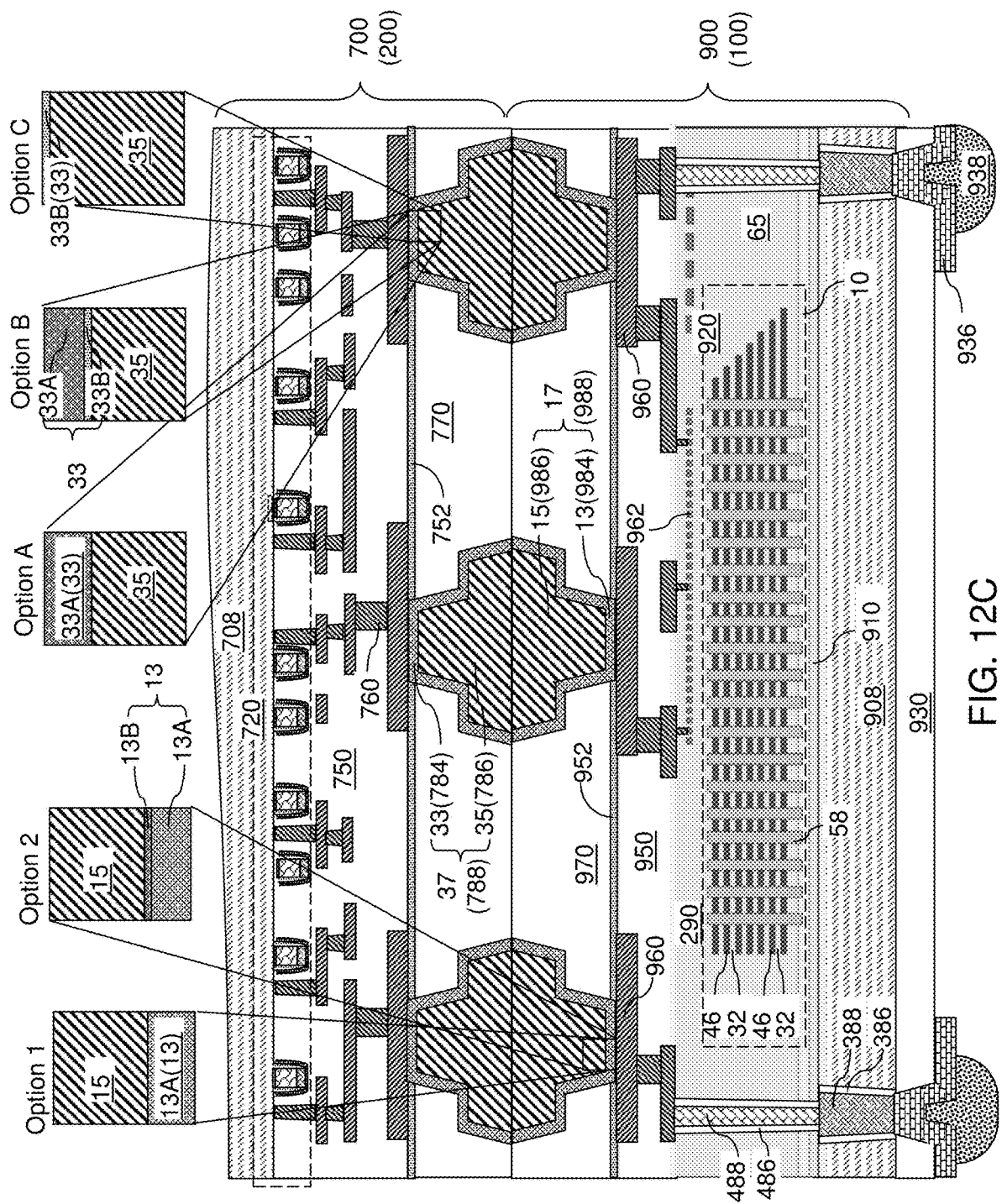
FIG. 12C is a schematic vertical cross-sectional view of the second configuration of the second exemplary structure after thinning the memory die and formation of external bonding structures according to the second embodiment of the present disclosure.

Referring to FIG. 12C, the processing steps of FIG. 3C can be performed to thin the backside of the memory-side substrate 908, and to form various backside bonding structures. Alternatively, a doped semiconductor source layer 110 is formed in contact with the exposed tips of the semiconductor channels, and a conductive source line (e.g., source contact) 112 is then formed on the doped semiconductor source layer 110, as described with regard to FIGS. 3D and 10D.

Figure 13A:
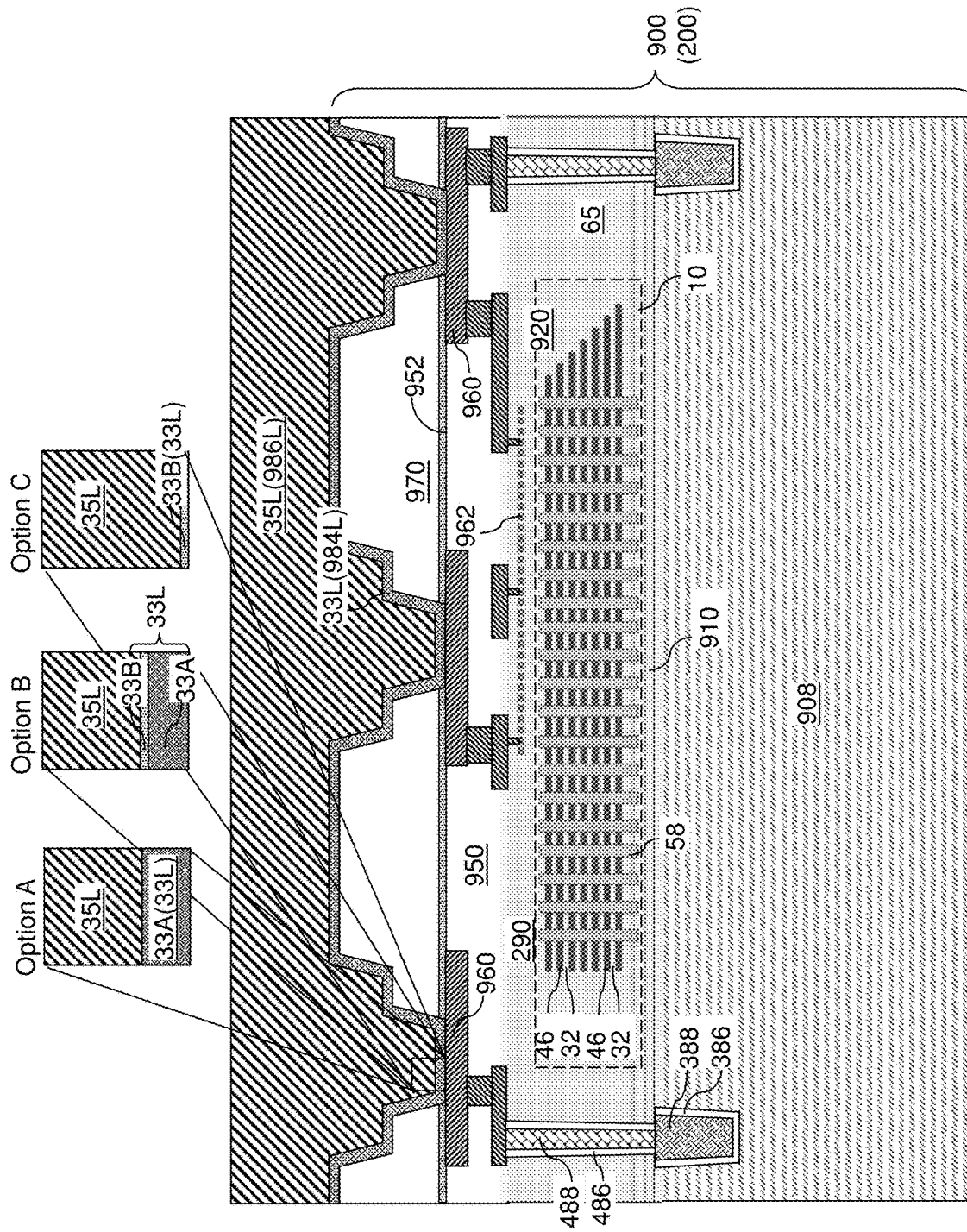
FIG. 13A is a vertical cross-sectional view of a third configuration of a memory die after formation of a memory-side conductive barrier layer and a memory-side copper layer according to a second embodiment of the present disclosure.

Referring to FIG. 13A, a third configuration of a memory die 900 according to a second embodiment of the present disclosure is illustrated. The third configuration of the memory 900 may be derived from the first configuration of the memory die 900 illustrated in FIG. 8A by employing the second conductive barrier layer 33L in lieu of the first conductive barrier layer 13L. The second conductive barrier layer 33L is formed as a memory-side conductive barrier layer 984L. A second copper layer 35L can be formed on the second conductive barrier layer 33L. The second copper layer 35L is formed as a memory-side copper layer 986L.

According to an aspect of the present disclosure, the material composition and the thickness of the second conductive barrier layer 33L are selected such that at least 95% of the volume fraction of a copper material portion in each second bonding pad may include (111) copper grains, such as after an anneal at an elevated temperature, for example at 150 degrees Celsius. The second conductive barrier layer 33L may have the same material composition and the same thickness range as discussed above.

Figure 13B:
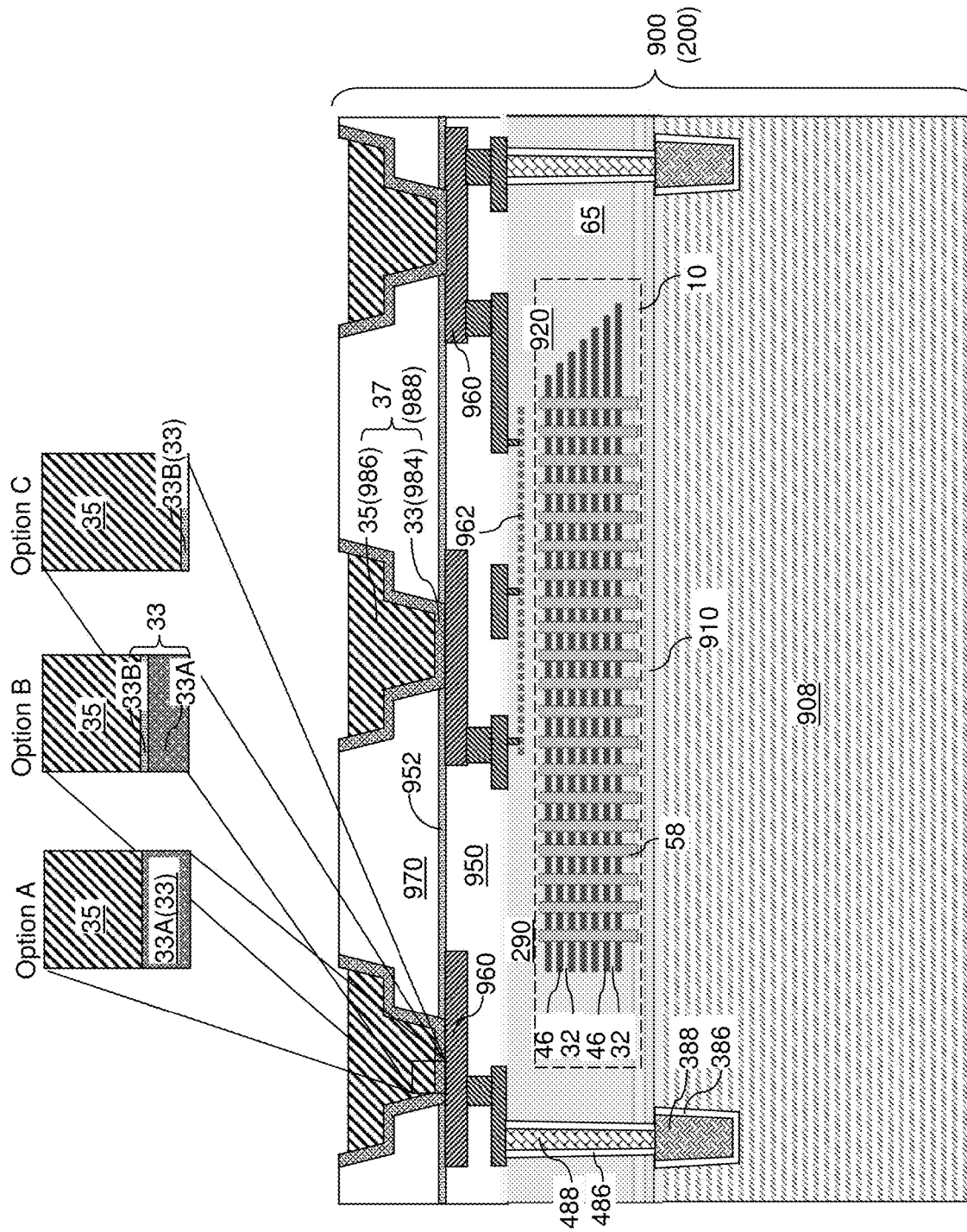
FIG. 13B is a vertical cross-sectional view of the third configuration of the memory die after formation of a memory-side bonding pads according to a second embodiment of the present disclosure.

Referring to FIG. 13B, a second chemical mechanical polishing (CMP) process can be performed to remove portions of the second copper layer 35L (comprising the memory-side copper layer 986L) and the second conductive barrier layer 33L (comprising the memory-side conductive barrier layer 984L) from above the top surface of the second bonding-level dielectric layer (comprising the memory-side bonding-level dielectric layer 970). Each remaining portion of the second copper layer 35L comprises the second copper material portion 35. Each remaining portion of the second conductive barrier layer 33L comprises a second conductive barrier layer 33. Each second copper material portion 35 is a memory-side copper material portion 986. Each second conductive barrier layer 33 is a memory-side conductive barrier layer 984 embedded within the memory-side bonding dielectric layer 970. Each contiguous combination of a second conductive barrier layer 33 and a second copper material portion 35 constitutes a second bonding pad 37, which is a memory-side bonding pad 988.

An anneal at an elevated temperature may be performed to induce formation of crystal grains within the second copper material portions 35. According to an aspect of the present disclosure, the material composition and/or the thickness of the second conductive barrier layers 33 are selected such at least 95% of the volume fraction of all copper material within each second copper material portion 35 includes (111) copper grains, such as after a low temperature anneal at a relatively low temperature, such as an anneal at a temperature of 150 degrees Celsius, as described above.

Second bonding pads 37 are embedded in a second bonding-level dielectric layer (such as the memory-side bonding-level dielectric layer 970) and electrically connected to a respective one of the second metal interconnect structures (such as the memory-side metal interconnect structures 960). Each of the second bonding pads 37 comprises a second conductive barrier layer 33 including a material composition or a material stack that induces subsequent formation of at least 95% in volume fraction of (111) copper grains in the second copper material portions 35. Thus, at least 95%, such as from 95% to 100%, and/or from 96% to 99% of the volume fraction of a copper material portion in each second bonding pad 35 may include (111) copper grains. Each of the second bonding pads 37 comprises a second copper material portion 35 laterally surrounded by the second conductive barrier layer 33. A top surface of the second copper portion 35 in each second bonding pad 37 may be vertically recessed relative to the horizontal plane including the top surface of the second bonding-level dielectric layer.

Generally, the second semiconductor die 200 comprises second semiconductor devices, second metal interconnect structures embedded in second dielectric material layers and electrically connected to the second semiconductor devices, and a second bonding pad 37 embedded in a second bonding-level dielectric layer and electrically connected to one of the second metal interconnect structures. The second bonding pad 37 comprises a second conductive barrier layer 33 and a second copper material portion 35 at least partially laterally surrounded by the second conductive barrier layer 33 and including (111) copper grains at a volume fraction of at least 95%.

Figure 14A:
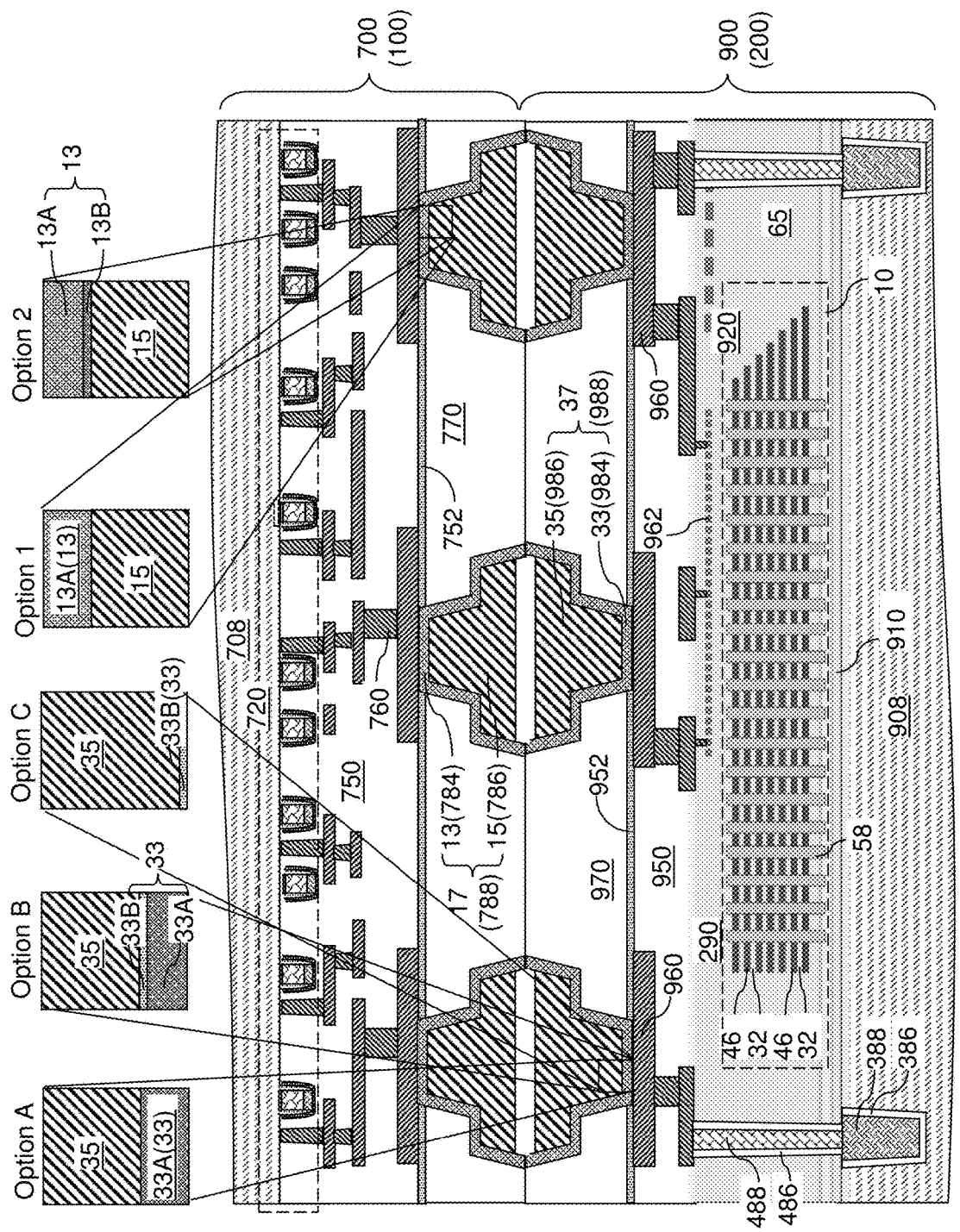
FIG. 14A is a schematic vertical cross-sectional view of a third configuration of a second exemplary structure after the logic die is disposed on the memory die for bonding according to the second embodiment of the present disclosure.

Referring to FIG. 14A, a third configuration of the second exemplary structure according to the second embodiment of the present disclosure is illustrated. A first wafer can be provided, which includes a plurality of first semiconductor dies 100. The first semiconductor die 100 may be the same as the logic 700 illustrated in FIG. 9B. A second wafer can be provided, which includes a plurality of second semiconductor dies 200 that includes multiple instances of the memory die 900 illustrated in FIG. 13B. The first wafer and the second wafer can be aligned to each other for bonding. In this case, the bonding pads 27 (which may be the same as bonding pad 17) and 37 can face each other. The first bonding-level dielectric layer can be brought into contact with the second bonding-level dielectric layer while each mating pair of bonding pads 27 and 37 remains aligned to each other.

Figure 14B:
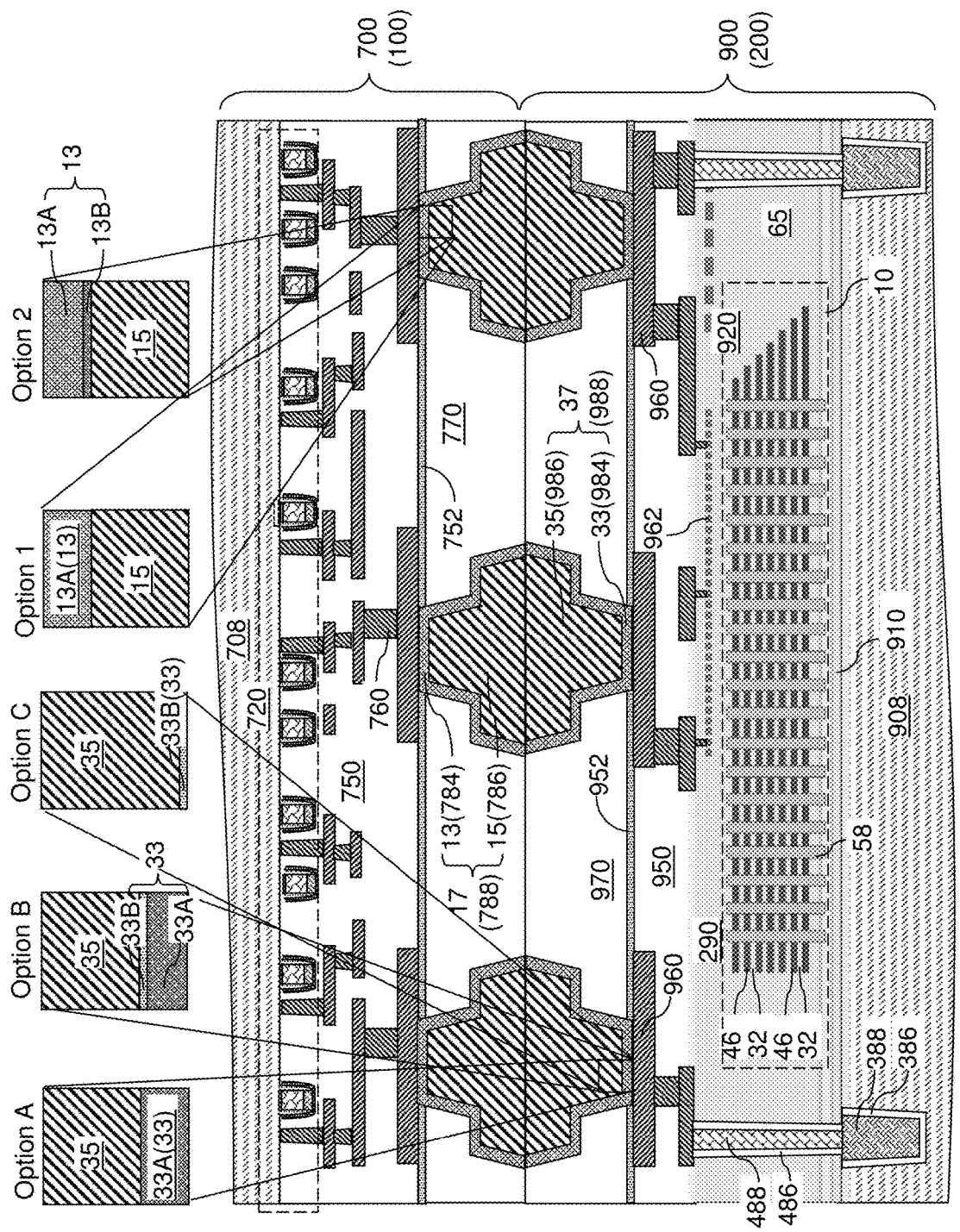
FIG. 14B is a schematic vertical cross-sectional view of the third configuration of the second exemplary structure after bonding the logic die to the memory die according to the second embodiment of the present disclosure.

Referring to FIG. 14B, the processing steps of FIG. 12B can be performed to induce bonding between the bonding pads 27 and 37, as described above.

Figure 14C:
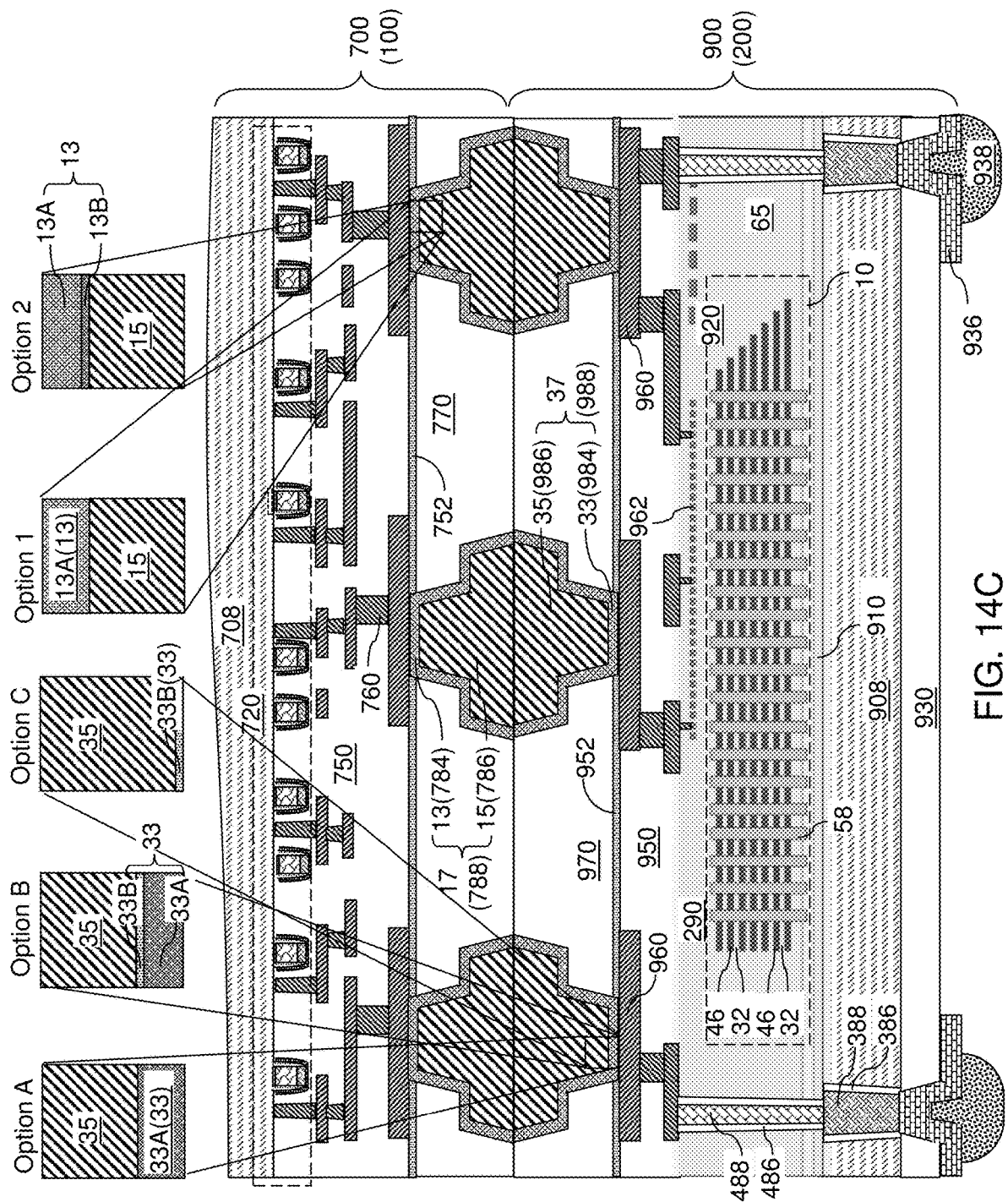
FIG. 14C is a schematic vertical cross-sectional view of the third configuration of the second exemplary structure after thinning the memory die and formation of external bonding structures according to the second embodiment of the present disclosure.

Referring to FIG. 14C, the processing steps of FIG. 3C can be performed to thin the backside of the memory-side substrate 908, and to form various backside bonding structures. Alternatively, a doped semiconductor source layer 110 is formed in contact with the exposed tips of the semiconductor channels, and a conductive source line (e.g., source contact) 112 is then formed on the doped semiconductor source layer 110, as described with regard to FIGS. 3D and 10D.

Referring to the first, second and third configurations of the second exemplary structure and FIGS. 8A to 14C related thereto, a bonded assembly comprises a first semiconductor die 100 comprising first semiconductor devices (920 or 720) and a first bonding pad 17. The first bonding pad comprises a first copper material portion 15 containing (200) copper grains at a volume fraction of at least 10% and a first conductive barrier layer 13 located between the first semiconductor devices and the first copper material portion. The bonded assembly also includes a second semiconductor die 200 comprising second semiconductor devices (720 or 920) and a second bonding pad (27 or 37). The second bonding pad comprises a second copper material portion (25 or 35) and a second conductive barrier layer (23 or 33) located between the second semiconductor devices and the second copper material portion. The second bonding pad is bonded to the first bonding pad.

In one embodiment, the first conductive barrier layer 13 comprises a titanium layer 13A having a thickness greater than 15 nm. In another embodiment, the first conductive barrier layer 13 comprises a stack of a tantalum layer 13B and a titanium layer 13A, wherein the tantalum layer is disposed between the titanium layer and the first copper material portion 15.

In the first configuration of the second embodiment illustrated in FIGS. 8A to 10D, the second copper material portion 25 contains (200) copper grains at a volume fraction of at least 10%. In one embodiment, the second conductive barrier layer 23 comprises a titanium layer 23A having a thickness greater than 15 nm. In another embodiment, the second conductive barrier layer 23 comprises a stack of a tantalum layer 23B and a titanium layer 23A, wherein the tantalum layer is disposed between the titanium layer and the first copper material portion 25.

In the second and third configurations of the second embodiment illustrated in FIGS. 9A to 14C, the second copper material portion 35 contains (111) copper grains at a volume fraction of at least 95%. In one embodiment, the second conductive barrier layer 33 comprises a tantalum layer 33A in direct contact with the second copper material portion 35. In another embodiment, the second conductive barrier layer 33 comprises a titanium layer 33A having a thickness not greater than 10 nm in direct contact with the second copper material portion 35. In another embodiment, the second conductive barrier layer 33 comprises a stack of a tantalum layer 33B and a titanium layer 33A, wherein the titanium layer is disposed between the tantalum layer and the first copper material portion 35.

It is believed that the (200) copper grains provide higher mean expansion distance per unit temperature change (e.g., per degree Celsius) than the (110) copper grains and the (111) copper grains. In contrast, it is also believed that the (111) copper grains provide higher surface diffusivity than (110) copper grains and (200) copper grains. Embodiments utilizing at least 10% in volume fraction of (200) copper grains in a first copper material portion 15 and a second copper material portion 25 utilize increased volume expansion of the (200) copper grains along the vertical direction (along the direction perpendicular to the bonding interfaces) to provide enhanced copper-to-copper bonding between copper material portions (15, 25). Embodiments utilizing at least 10% in volume fraction of (200) copper grains in a first copper material portion 15 and at least 95% in volume fraction of (111) copper grains in a second copper material portion 35 utilize the combination of increased volume expansion from the first copper material portion 15 and enhanced surface diffusivity provided by the second copper material portion 35 to provide enhanced copper-to-copper bonding between copper material portions (15, 35).

Figure 15:
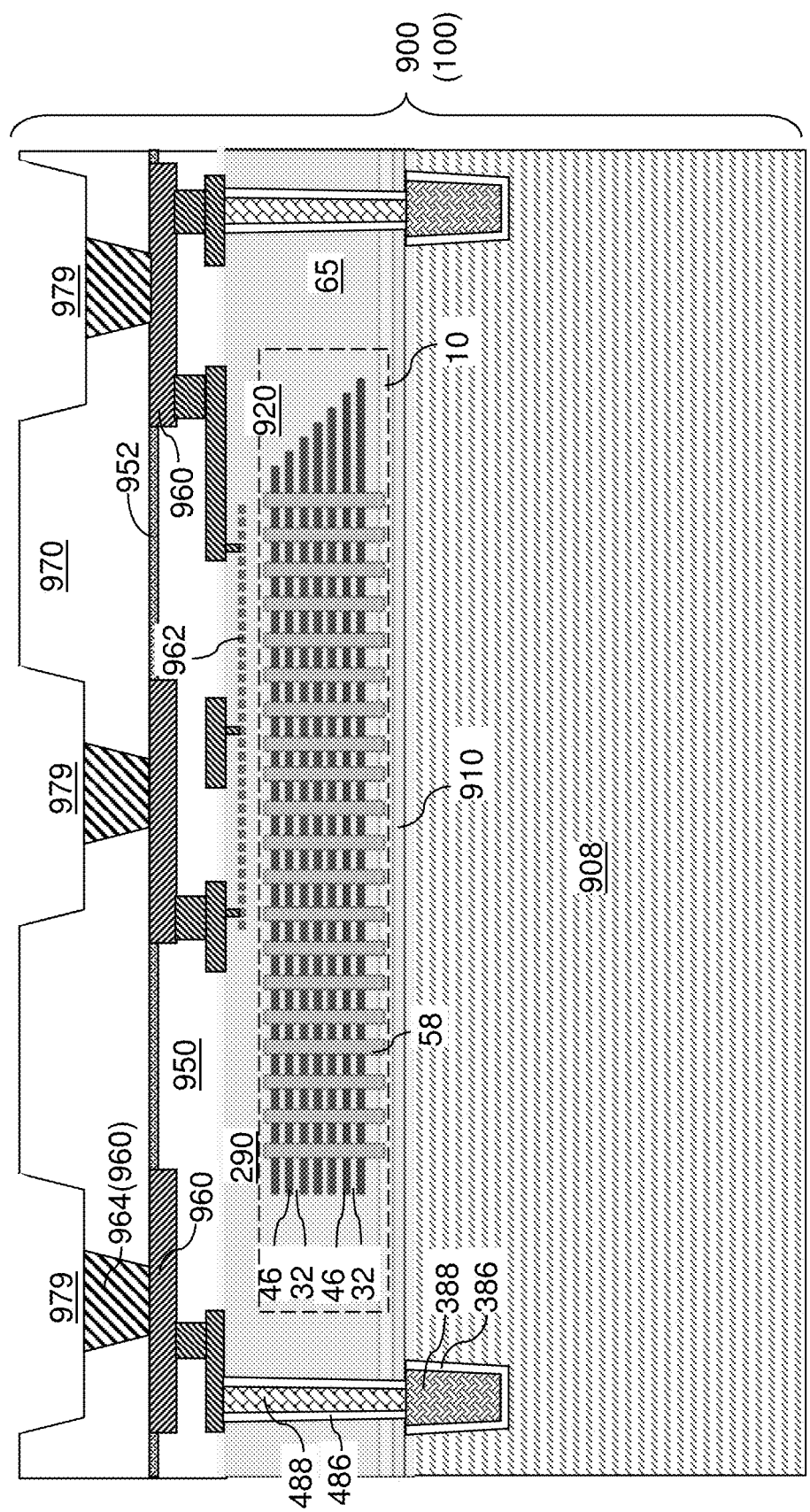
FIG. 15 is a schematic vertical cross-sectional view of a memory die for forming a third exemplary structure after formation of memory-side pad cavities according to a third embodiment of the present disclosure.

Referring to FIG. 15, a memory die 900 for forming a third exemplary structure is illustrated after formation of memory-side pad cavities 979. The memory die 900 may be employed as a first semiconductor die 100 or as a second semiconductor die for forming a bonded assembly within the third exemplary structure. The memory die 900 illustrated in FIG. 15 may be derived from the memory die illustrated in FIG. 1A above by forming memory-side metal interconnect structures 960 such that top surfaces of a subset of the memory-side metal interconnect structures 960 are coplanar with a top surface of an optional memory-side dielectric diffusion barrier layer 952. Alternatively, the memory-side dielectric diffusion barrier layer 952 is omitted.

A memory-side bonding-level dielectric layer 970 can be formed over the top surfaces of the topmost memory-side metal interconnect structures 960. The memory-side bonding-level dielectric layer 970 may be formed as a single dielectric material layer in which integrated pad and via cavities are subsequently formed, or may be formed as a stack of a bonding-via-level dielectric layer and a bonding-pad-level dielectric layer that overlies the bonding-via-level dielectric layer. In one embodiment, the bonding-via-level dielectric layer may be formed first, and memory-side bonding via structures 964 may be formed in the bonding-via-level dielectric layer. In this case, the memory-side bonding via structures 964 may be a subset of the memory-side metal interconnect structures 960. The bonding-pad-level dielectric layer may be subsequently formed over the bonding-via-level dielectric layer, and the memory-side pad cavities 979 may be formed through the bonding-pad-level dielectric layer over the memory-side bonding via structures 964. A top surface of a memory-side bonding via structure 964 may be physically exposed at the bottom of each memory-side pad cavity 979. The depth of each memory-side pad cavity 979 may be in a range from 200 nm to 5,000 nm, such as from 300 nm to 3,000 nm, and/or from 400 nm to 1,500 nm, although lesser and greater depths may also be employed. An entirety of a top periphery of each memory-side bonding via structure 964 may be physically exposed at the bottom of each memory-side pad cavity 979.

Figure 16:
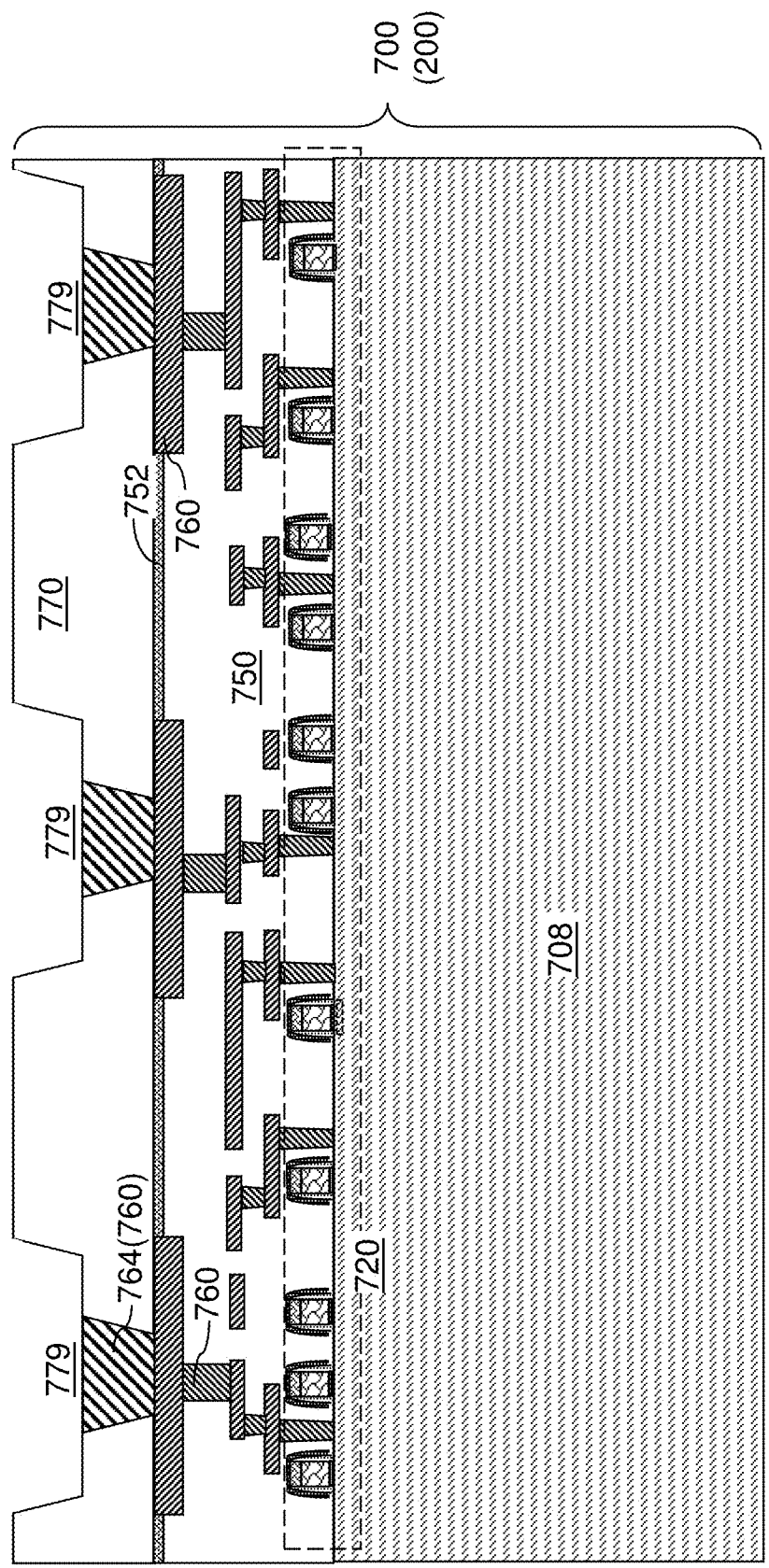
FIG. 16 is a schematic vertical cross-sectional view of a logic die for forming the third exemplary structure after formation of logic-side pad cavities according to the third embodiment of the present disclosure.

Referring to FIG. 16, a logic die 700 for forming the third exemplary structure is illustrated after formation of logic-side pad cavities 779. The logic die 700 may be employed as a second semiconductor die 200 or as a first semiconductor die for forming the bonded assembly within the third exemplary structure. The logic die 700 illustrated in FIG. 16 may be derived from the logic die illustrated in FIG. 2A above by forming logic-side metal interconnect structures 760 such that top surfaces of a subset of the logic-side metal interconnect structures 760 are coplanar with a top surface of an optional logic-side dielectric diffusion barrier layer 752. Alternatively, the logic-side dielectric diffusion barrier layer 752 is omitted.

A logic-side bonding-level dielectric layer 770 can be formed over the top surfaces of the topmost logic-side metal interconnect structures 760. The logic-side bonding-level dielectric layer 770 may be formed as a single dielectric material layer in which integrated pad and via cavities are subsequently formed, or may be formed as a stack of a bonding-via-level dielectric layer and a bonding-pad-level dielectric layer that overlies the bonding-via-level dielectric layer. In one embodiment, the bonding-via-level dielectric layer may be formed first, and logic-side bonding via structures 764 may be formed in the bonding-via-level dielectric layer. In this case, the logic-side bonding via structures 764 may be a subset of the logic-side metal interconnect structures 760. The bonding-pad-level dielectric layer may be subsequently formed over the bonding-via-level dielectric layer, and the logic-side pad cavities 779 may be formed through the bonding-pad-level dielectric layer over the logic-side bonding via structures 764. A top surface of a logic-side bonding via structure 764 may be physically exposed at the bottom of each logic-side pad cavity 779. The depth of each logic-side pad cavity 779 may be in a range from 200 nm to 5,000 nm, such as from 300 nm to 3,000 nm, and/or from 400 nm to 1,500 nm, although lesser and greater depths may also be employed. An entirety of a top periphery of each logic-side bonding via structure 764 may be physically exposed at the bottom of each logic-side pad cavity 779.

FIGS. 17A-17E are sequential vertical cross-sectional views of a region around memory-side pad cavities 978 during formation of memory-side bonding pads and formation of a first configuration of the third exemplary structure including a bonded assembly according to the third embodiment of the present disclosure.

Figure 17B:
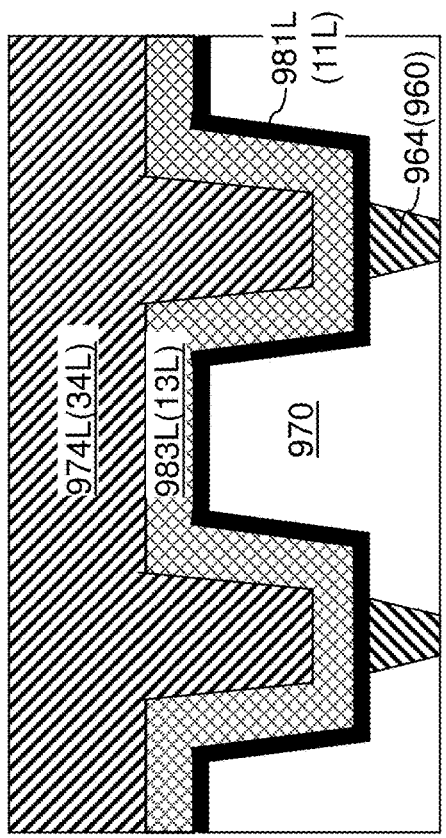
FIGS. 17A-17E are sequential vertical cross-sectional views of a region around memory-side pad cavities during formation of memory-side bonding pads and formation of a first configuration of the third exemplary structure including a bonded assembly according to the third embodiment of the present disclosure.
Figure 17A:
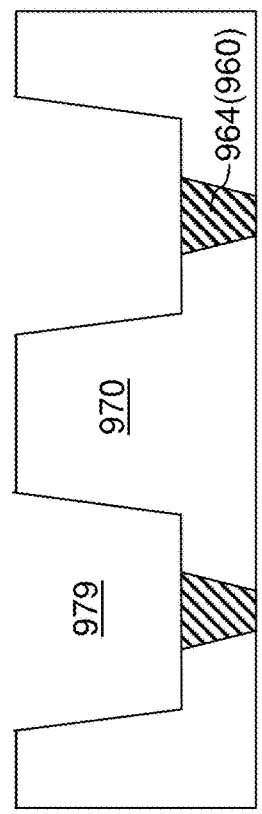

Referring to FIG. 17A, a region around memory-side pad cavities 979 in the memory die 900 of FIG. 15 is illustrated. The memory-side pad cavities 979 are formed within the memory-side bonding-level dielectric layer 970, which may be a silicon oxide layer. In case the memory die 900 is employed as a first semiconductor die 100, the memory-side bonding-level dielectric layer 970 may be employed as a first silicon oxide layer. In case the memory die 900 is employed as a second semiconductor die 200, the memory-side bonding-level dielectric layer 970 may be employed as a second silicon oxide layer.

Referring to FIG. 17B, a memory-side metallic barrier liner layer 981L may be deposited on the physically exposed surfaces of the memory-side bonding-level dielectric layer 970 in a peripheral portion of each of the memory-side pad cavities 979 and over the top surface of the memory-side bonding-level dielectric layer 970. In case the memory die 900 is employed as a first semiconductor die 100, the memory-side metallic barrier liner layer 981L may be employed as a first metallic barrier liner layer 11L. The memory-side metallic barrier liner layer 981L may comprise a first conductive metal nitride material such as TiN, TaN, WN, or a multilayer stack thereof, or a first metal, such as Ti, Ta, or a multilayer stack thereof. The thickness of the memory-side metallic barrier liner layer 981L may be in a range from 3 nm to 100 nm, such as from 10 nm to 30 nm, although lesser and greater thicknesses may also be employed.

According to an aspect of the present disclosure, a memory-side copper-manganese alloy layer 983L may be deposited over the memory-side metallic barrier liner layer 981L, for example, by a physical vapor deposition process, such as sputtering. In case the memory die 900 is employed as a first semiconductor die 100, the memory-side copper-manganese alloy layer 983L may be employed as a first copper-manganese alloy layer 13L. The memory-side copper-manganese alloy layer 983L includes, and/or consists essentially of, a copper-manganese alloy in which atomic percentage of manganese atoms is in a range from 0.5% to 10%, such as from 1% to 5%, and/or from 2% to 3%. The sum of the atomic percentage of manganese atoms and the atomic percentage of copper atoms may be in 99.9% to 100%. The thickness of the horizontally-extending portions of the memory-side copper-manganese alloy layer 983L may be greater than 10%, and/or greater than 20%, and/or greater than 30%, and/or greater than 40%, and/or greater than 50%, and/or greater than 60%, of the depth of the memory-side pad cavities 979. The thickness of the horizontally-extending portions of the memory-side copper-manganese alloy layer 983L may be less than 90%, and/or less than 80% and/or less than 70%, and/or less than 60%, and/or less than 50%, and/or less than 60%, of the depth of the memory-side pad cavities 979. For example, the thickness of the horizontally-extending portions of the memory-side copper-manganese alloy layer 983L may be in a range from 150 nm to 1,000 nm, such as from 200 nm to 500 nm, and/or from 250 nm to 400 nm, although lesser and greater thicknesses may also be employed.

A memory-side copper layer 974L may be deposited on the memory-side copper-manganese alloy layer 983L, for example, by electroplating or electroless plating using the copper-manganese alloy layer 983L as a seed layer. The thickness of the memory-side copper layer 974L may be selected such that the entire volume of each memory-side pad cavity 979 as provided at the processing steps of FIG. 17A is filled with the combination of the memory-side metallic barrier liner layer 981L, the memory-side copper-manganese alloy layer 983L, and the memory-side copper layer 974L. The memory-side copper layer 974L may consist essentially of copper.

An anneal process may be performed to increase the average grain size in one or more of the memory-side metallic barrier liner layer 981L, the memory-side copper-manganese alloy layer 983L, and the memory-side copper layer 974L. For example, the anneal process may be performed at an elevated temperature below 300 degrees Celsius, such as in a range from 100 degrees to 250 degrees Celsius, such as from 125 degrees to 200 degrees Celsius to avoid forming a manganese silicon oxide alloy with the silicon oxide memory-side bonding-level dielectric layer 970, which forms at a temperature of at least 300 degrees Celsius. The duration of the anneal process at the elevated temperature may be in a range from 10 minutes to 300 minutes, such as from 30 minutes to 120 minutes, although lesser and greater durations may also be employed.

Figure 17C:
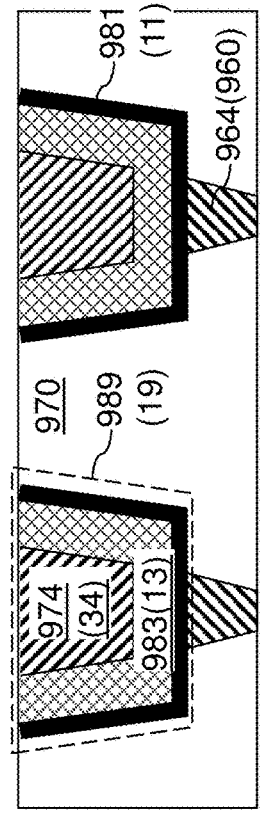

Referring to FIG. 17C, a chemical mechanical polishing process may be performed to remove portions of the memory-side metallic barrier liner layer 981L, the memory-side copper-manganese alloy layer 983L, and the memory-side copper layer 974L from above the horizontal plane including the top surface of the memory-side bonding-level dielectric layer 970 (which may be a first silicon oxide layer in case the memory die 900 is a first semiconductor die, or a second silicon oxide layer in case the memory die 900 is a second semiconductor die).

Each remaining portion of the memory-side metallic barrier liner layer 981L constitutes a memory-side metallic barrier liner 981. The memory-side metallic barrier liner 981 may be a first metallic barrier liner 11 in case the memory die 900 comprises a first semiconductor die of a bonded assembly to be subsequently formed, or a second metallic barrier liner in case the memory die 900 comprises a second semiconductor die.

Each remaining portion of the memory-side copper-manganese alloy layer 983L constitutes a memory-side copper-manganese alloy portion 983. The memory-side copper-manganese alloy portion 983 may be a first copper-manganese alloy portion 13 in case the memory die 900 comprises a first semiconductor die of a bonded assembly to be subsequently formed, or a second copper-manganese alloy portion in case the memory die 900 comprises a second semiconductor die.

Each remaining portion of the memory-side copper layer 974L constitutes a memory-side copper portion 974. The memory-side copper portion 974 may be a first copper portion 34 in case the memory die 900 comprises a first semiconductor die of a bonded assembly to be subsequently formed, or a second copper portion in case the memory die 900 comprises a second semiconductor die.

Each contiguous combination of a memory-side metallic barrier liner 981, a memory-side copper-manganese alloy portion 983, and a memory-side copper portion 974 constitutes a memory-side bonding pad 989. Each memory-side bonding pad 989 may be formed in the volume of a respective one of the memory-side pad cavities 979. The memory-side bonding pad 989 may be a first bonding pad 19 in case the memory die 900 comprises a first semiconductor die of a bonded assembly to be subsequently formed, or a second bonding pad in case the memory die 900 comprises a second semiconductor die.

Figure 17E:
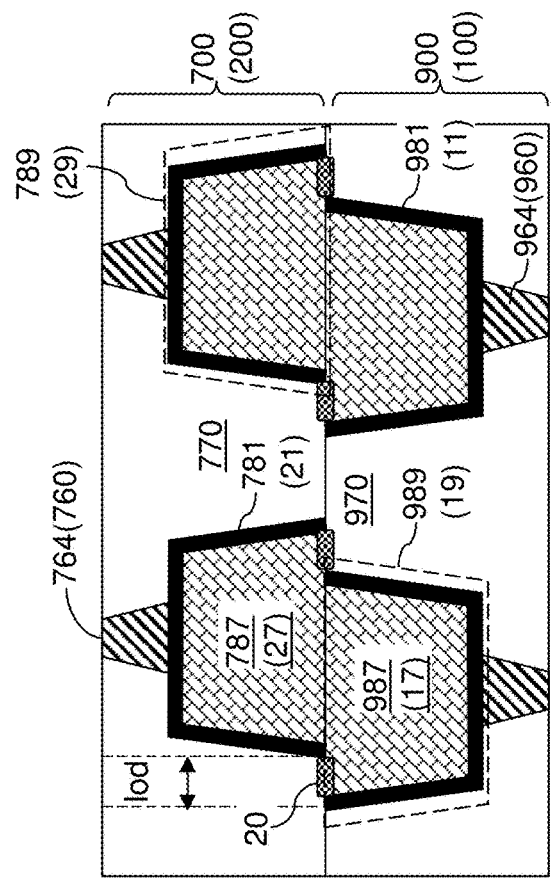
Figure 17D:
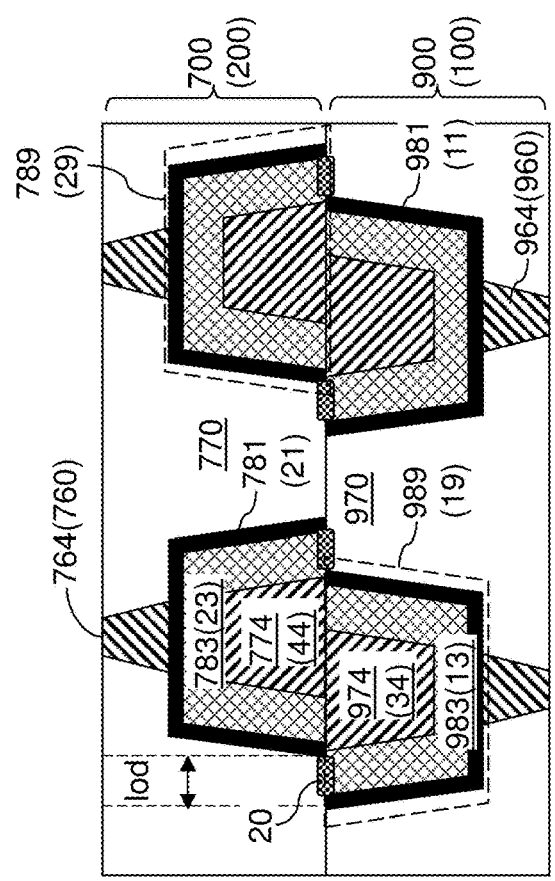

Referring to FIG. 17D, the processing steps described with reference to FIGS. 17B and 17C may also be performed on the logic die 700 to form a logic-side bonding pad 789 in each volume of the logic-side pad cavities 779. Each logic-side bonding pad 789 may comprise a logic-side metallic barrier liner 781, a logic-side copper-manganese alloy portion 783, and a logic-side copper portion 774. Each logic-side bonding pad 789 may be a second bonding pad 29 in case the logic die 700 comprises the second semiconductor die of a bonded assembly to be subsequently formed, or a first bonding pad in case the logic die 700 comprises the first semiconductor die.

The logic die 700 and the memory die 900 are oriented such that each of the logic-side bonding pads 789 faces a respective memory-side bonding pad 989. The logic die 700 and the memory die 900 are brought into contact with each other such that each mating pair of a logic-side bonding pad 789 and a memory-side bonding pad 989 contact each other, and the memory-side bonding-level dielectric layer 970 contacts the logic-side bonding-level dielectric layer 770.

Generally, the shape of the top surface of the logic-side bonding pad 789 may, or may not, be a mirror image of the shape of the top surface of the memory-side bonding pad 989 within each mating pair of a logic-side bonding pad 789 and the memory-side bonding pad 989. Further, the lateral offset distance lod between the geometrical center of the shape of the top surface of the logic-side bonding pad 789 relative to the geometrical center of the shape of the top surface of the memory-side bonding pad 989 may or may not be zero. Generally, the lateral offset distance lod between the geometrical centers of the top surfaces (i.e., mating surfaces) of a mating pair of a logic-side bonding pad 789 and the memory-side bonding pad 989 tends to be non-zero due to misalignment, and may be in a range from 0 nm to 150 nm, such as from 5 nm to 100 nm, and/or from 10 nm to 50 nm.

An anneal process may be performed, in which the assembly of the logic die 700 and the memory die 900 are annealed at an elevated temperature to induce metal-to-metal bonding between the bonding pads 19 and 29. The elevated temperature of the anneal process may be at least 300 degrees Celsius, such as in a range from 300 degrees Celsius to 450 degrees Celsius, such as from 375 degrees Celsius to 425 degrees Celsius, although lesser and greater temperatures may also be employed.

In one embodiment, one of the memory-side bonding-level dielectric layer 970 and the logic-side bonding-level dielectric layer 770 may be a first silicon oxide layer located in a first semiconductor die 100, and another of the memory-side bonding-level dielectric layer 970 and the logic-side bonding-level dielectric layer 770 may be a second silicon oxide layer located in a second semiconductor die 200.

Metal-to-metal bonding occurs at each interface between a logic-side bonding pad 789 and a memory-side bonding pad 989. In one embodiment, each logic-side bonding pad 789 may be bonded to a respective memory-side bonding pad 989, and each memory-side bonding pad 989 may be bonded to a respective logic-side bonding pad 789.

Generally, a first semiconductor die 100 comprising first semiconductor devices (920 or 720) and a first bonding pad 19 embedded within a first silicon oxide layer (970 or 770) may be provided. The first bonding pad 19 comprises a first copper-manganese alloy portion 13 (such as a memory-side copper-manganese alloy portion 983 or a logic-side copper-manganese alloy portion 783). In one embodiment, the first bonding pad 19 comprises a first metallic barrier liner 11 (such as a memory-side metallic barrier liner 981 or a logic-side metallic barrier liner 781) comprising a first conductive metal or a metal nitride material or their bilayer, and interposed between the first copper-manganese alloy portion 13 and the first silicon oxide layer (970 or 770). In one embodiment, the first bonding pad 19 comprises a first copper portion 34, which may be a memory-side copper portion 974 or as a logic-side copper portion 774.

Likewise, a second semiconductor die 200 comprising second semiconductor devices (720 or 920) and a second bonding pad 29 embedded within a second silicon oxide layer (770 or 970) may be provided. The second bonding pad 29 comprises a second copper-manganese alloy portion 23 (such as a logic-side copper-manganese alloy portion 783 or a memory-side copper-manganese alloy portion 983). In one embodiment, the second bonding pad 29 comprises a second metallic barrier liner 21 (such as a logic-side metallic barrier liner 781 or a memory-side metallic barrier liner 981) comprising a second conductive metal or a metal nitride material or their bilayer, and interposed between the second copper-manganese alloy portion 23 and the second silicon oxide layer (770 or 970). In one embodiment, the second bonding pad 29 comprises a second copper portion 44, which may comprise a logic-side copper portion 774 or as a memory-side copper portion 974.

As shown in FIG. 17D which shows the dies 100 and 200 during the bonding process, the second bonding pads 29 can be bonded to the first bonding pads 19 via metal-to-metal bonding while inducing outdiffusion of manganese atoms from at least one of the first copper-manganese alloy portion 13 and the second copper-manganese alloy portion 23 into at least one of the first silicon oxide layer (970 or 770) and the second silicon oxide layer (770 or 970). In one embodiment, at least one of the first silicon oxide layer (970 or 770) and the second silicon oxide layer (770 or 970) directly contacts at least one of the first bonding pad 19 and the second bonding pad 29 when the first semiconductor die 100 is brought into contact with the second semiconductor die 200. For example, a horizontal surface segment of the first bonding pad 19 may contact a horizontal surface segment of the second silicon oxide layer 770, and/or a horizontal surface segment of the second bonding pad 29 may contact a horizontal surface segment of the first silicon oxide layer 970. In this case, manganese atoms from the first copper-manganese alloy portion 13 (such as the memory-side copper-manganese alloy portion 983) may diffuse into a surface portion of the second silicon oxide layer (such as the logic-side bonding-level dielectric layer 770), and/or manganese atoms from the second copper-manganese alloy portion 23 (such as the logic-side copper-manganese alloy portion 783) may diffuse into a surface portion of the first silicon oxide layer (such as the memory-side bonding-level dielectric layer 970) during the bonding anneal.

At least one manganese silicon oxide layer 20 is formed between one of the first bonding pad 19 or the second bonding pad 29 and one of the first silicon oxide layer (970 or 770) or the second silicon oxide layer (770 or 970). Specifically, the at least one manganese silicon oxide layer 20 can be formed at each interface between one of the first copper-manganese alloy portion 13 (such as the memory-side copper-manganese alloy portion 983) or the second copper-manganese alloy portion 23 (such as the logic-side copper-manganese alloy portion 783) and one of the first silicon oxide layer (such as the memory-side bonding-level dielectric layer 970) or the second silicon oxide layer (such as the logic-side bonding-level dielectric layer 770).

In one embodiment, prior to the bonding process, the first bonding pad 19 comprises a first copper portion 34 that is substantially free of manganese and is in contact with the first copper-manganese alloy portion 13, and the first copper portion 34 is laterally surrounded by the first copper-manganese alloy portion 13. In one embodiment, a bonding surface of the first bonding pad 19 comprises a planar surface of the first copper portion 34 and a planar surface of the first copper-manganese alloy portion 13 that laterally surrounds the planar surface of the first copper portion 34. In this case, during or after the bonding, the at least one manganese silicon oxide layer 20 comprises a horizontally-extending portion through which a horizontal plane including an interface between the first silicon layer (970 or 770) and the second silicon oxide layer (770 or 970) extends.

In one embodiment, prior to the bonding process, the second bonding pad 29 comprises a second copper portion 44 that is substantially free of manganese and is in contact with the second copper-manganese alloy portion 23, and the second copper portion 44 is laterally surrounded by the second copper-manganese alloy portion 23. In one embodiment, a bonding surface of the second bonding pad 29 comprises a planar surface of the second copper portion 44 and a planar surface of the second copper-manganese alloy portion 23 that laterally surrounds the planar surface of the second copper portion 44. In this case, during or after the bonding process, the at least one manganese silicon oxide layer 20 comprises a horizontally-extending portion through which a horizontal plane including an interface between the first silicon layer (970 or 770) and the second silicon oxide layer (770 or 970) extends.

Referring to FIG. 17E, the bonding anneal process may be continued until the manganese atoms in the first copper-manganese alloy portion 13 (such as the memory-side copper-manganese alloy portion 983) and the second copper-manganese alloy portion 23 (such as the logic-side copper-manganese alloy portion 783) diffuse into the first copper portion 34 (such as the memory-side copper portion 974) and into the second copper portion 44 (such as the logic-side copper portion 774) and/or into the manganese silicon oxide layers 20. The duration of the anneal process may be in a range from 10 minutes to 300 minutes, such as from 30 minutes to 120 minutes, although lesser and greater durations may also be employed. The combination of the first copper-manganese alloy portion 13 and the first copper portion 34 is converted into a first copper containing portion 17, which may be, for example, a memory-side copper containing portion 987. Likewise, the combination of the second copper-manganese alloy portion 23 and the second copper portion 44 is converted into a second copper containing portion 27, which may be, for example, a logic-side copper containing portion 787.

Depending on the thickness of the alloy portions (13, 23) and the manganese content in these alloy portions (13, 23), some or none of the manganese may remain in the first and second copper containing portions (17, 27) after the bonding process. In one embodiment, all of the manganese diffuses from the alloy portions (13, 23) into the manganese silicon oxide layers 20. In this embodiment, the first and second copper containing portions (17, 27) comprise substantially pure copper containing less than 0.1 atomic percent manganese.

In another embodiment, a first portion of the manganese from the alloy portions (13, 23) diffuses into the first or second silicon oxide layers (770, 970), while a second portion of the manganese diffuses from the alloy portions (13, 23) into the first and second copper portions (34, 44). In this embodiment, the first and second copper containing portions (17, 27) comprise first and second copper-manganese alloy portions. For example, the combination of the first copper-manganese alloy portion 13 and the first copper portion 34 are converted into a first copper-manganese alloy portion 17, which may be, for example, a memory-side copper-manganese alloy portion 987. Likewise, the combination of the second copper-manganese alloy portion 23 and the second copper portion 44 is converted into a second copper-manganese alloy portion 27, which may be, for example, a logic-side copper-manganese alloy portion 787. Each of the first copper-manganese alloy portion 17 and the second copper-manganese alloy portion 27 may comprise a homogenized copper-manganese alloy, or may comprise a copper-manganese alloy having a compositional gradient therein.

The bonded assembly of the first semiconductor die 100 and the second semiconductor die 200 illustrated in FIG. 17E comprises: a first semiconductor die 100 comprising first semiconductor devices (920 or 720) and a first bonding pad 19 embedded within a first silicon oxide layer (970 or 770), wherein the first bonding pad 19 comprises a first copper containing portion 17; a second semiconductor die 200 comprising second semiconductor devices (720 or 920) and a second bonding pad 29 that is embedded within a second silicon oxide layer (770 or 970) and is bonded to the first bonding pad 19 via metal-to-metal bonding, wherein the second bonding pad 29 comprises a second copper containing portion 27; and at least one manganese silicon oxide layer 20 interposed between a first combination of the first bonding pad 19 and the second bonding pad 29 and a second combination of the first silicon oxide layer (970 or 770) and the second silicon oxide layer (770 or 970).

In one embodiment, the at least one manganese silicon oxide layer 20 comprises: a first manganese silicon oxide layer 20 in contact with the first copper-manganese alloy portion 17 (such as the memory-side copper-manganese alloy portion 987) and the second silicon oxide layer (such as the memory-side bonding-level dielectric layer 770); and a second manganese silicon oxide layer 20 in contact with the second copper-manganese alloy portion 27 (such as the logic-side copper-manganese alloy portion 787) and the first silicon oxide layer (such as the memory-side bonding-level dielectric layer 970).

In one embodiment, the at least one manganese silicon oxide layer 20 comprises manganese silicate. The manganese silicate may have any suitable formula, such as $Mn_2SiO_4$ or $MnSiO_3$. Alternatively, the at least one manganese silicon oxide layer 20 comprises any other suitable stoichiometric or non-stoichiometric manganese silicon oxide alloy having a formula $MnSi_xO_y$, where $0.5 \leq x \leq 3$ and $1 \leq y \leq 6$. In one embodiment, the at least one manganese silicon oxide layer 20 has a composition gradient in which an atomic concentration of manganese decreases with a distance from the first combination of the first bonding pad 19 and the second bonding pad 29 toward the second combination of the first silicon oxide layer (970 or 770) and the second silicon oxide layer (770 or 970). In one embodiment, at least one of the first copper-manganese alloy portion 17 and the second copper-manganese alloy portion 27 may have a gradient in atomic concentration of manganese atoms therein. In one embodiment, the compositional gradient has at least a vertical component, i.e., the material composition changes along the vertical direction.

In one embodiment, at least one of the first bonding pads 19 and the second bonding pads 29 comprises a metallic barrier liner (11 or 21) comprising a conductive metal or a metal nitride material or their bilayer, and the at least one manganese silicon oxide layer 20 is in contact with the metallic barrier liner (11 or 21). In one embodiment, the metallic barrier liner (11 or 21) is in contact with an entirety of sidewalls of and is in contact with an entirety of a backside surface of one of the first copper containing portion 17 and the second copper containing portion 27.

In one embodiment, a backside surface of the first bonding pad 19 contacts a first metal interconnect structure (960 or 760) embedded in the first semiconductor die 100. A backside surface of the second bonding pad 29 contacts a second metal interconnect structure (760 or 960) embedded in the second semiconductor die 200. A combination of the first copper containing portion 17 and the second copper containing portion 27 is encapsulated by a combination of the at least one manganese silicon oxide layer 20, the at least one metallic barrier liner (11 or 21), the first metal interconnect structure (960 or 760), and the second metal interconnect structure (760 or 960).

FIGS. 18A-18E are sequential vertical cross-sectional views of a region around memory-side pad cavities 979 during formation of memory-side bonding pads and formation of a second configuration of the third exemplary structure including a bonded assembly according to the third embodiment of the present disclosure.

Referring to FIG. 18A, a region around memory-side pad cavities 979 in the memory die 900 of FIG. 15 is illustrated. The memory-side pad cavities 979 are formed within the memory-side bonding-level dielectric layer 970, which may be a silicon oxide layer. In case the memory die 900 is employed as a first semiconductor die 100, the memory-side bonding-level dielectric layer 970 may be employed as a first silicon oxide layer. In case the memory die 900 is employed as a second semiconductor die 200, the memory-side bonding-level dielectric layer 970 may be employed as a second silicon oxide layer.

Referring to FIG. 18B, a memory-side metallic barrier liner layer 981L may be deposited on the physically exposed surfaces of the memory-side bonding-level dielectric layer 970 in a peripheral portion of each of the memory-side pad cavities 979 and over the top surface of the memory-side bonding-level dielectric layer 970. In case the memory die 900 is employed as a first semiconductor die 100, the memory-side metallic barrier liner layer 981L may be employed as a first metallic barrier liner layer 11L. The memory-side metallic barrier liner layer 981L may comprise a first metal, such as Ti, Ta, or multilayer stack thereof, and/or a first conductive metal nitride material such as TiN, TaN, WN, or a multilayer stack thereof. The thickness of the memory-side metallic barrier liner layer 981L may be in a range from 3 nm to 100 nm, such as from 10 nm to 30 nm, although lesser and greater thicknesses may also be employed.

According to an aspect of the present disclosure, the above described memory-side copper-manganese alloy seed layer 983L may be deposited over the memory-side metallic barrier liner layer 981L, for example, by a physical vapor deposition process, such as sputtering. In case the memory die 900 is employed as a first semiconductor die 100, the memory-side copper-manganese alloy seed layer 983L may be employed as a first copper-manganese alloy seed layer 13L.

A memory-side copper-manganese alloy fill layer 985L may be deposited on the memory-side copper-manganese alloy seed layer 983L, for example, by electroplating or electroless plating. In case the memory die 900 is employed as a first semiconductor die 100, the memory-side copper-manganese alloy fill layer 985L may be employed as a first copper-manganese alloy fill layer 15L. The thickness of the memory-side copper-manganese alloy fill layer 985L may be selected such that the entire volume of each memory-side pad cavity 979 as provided at the processing steps of FIG. 18A is filled with the combination of the memory-side metallic barrier liner layer 981L, the memory-side copper-manganese alloy seed layer 983L, and the memory-side copper-manganese alloy fill layer 985L. The memory-side copper-manganese alloy fill layer 985L may include, and/or may consist essentially of, a copper-manganese alloy in which atomic percentage of manganese atoms is in a range from 0.5% to 10%, such as from 1% to 5%, and/or from 2% to 3%. The sum of the atomic percentage of manganese atoms and the atomic percentage of copper atoms may be in 99.9% to 100%. The composition of the memory-side copper-manganese alloy fill layer 985L may be the same as or different from that of the memory-side copper-manganese alloy seed layer 983L.

Referring to FIG. 18C, an anneal process may be performed to increase the average grain size in each of the memory-side copper-manganese alloy seed layer 983L, and the memory-side copper-manganese alloy fill layer 985L at a temperature below 300 degrees Celsius as described above. The memory-side copper-manganese alloy seed layer 983L and the memory-side copper-manganese alloy fill layer 985L merge to form a memory-side copper-manganese alloy layer 987L. In one embodiment, the atomic concentration of manganese atoms in the memory-side copper-manganese alloy layer 987L may be uniform. Alternatively, the memory-side copper-manganese alloy layer 987L may have a vertical concentration gradient in the atomic concentration of manganese atoms. In case the memory die 900 is employed as a first semiconductor die 100, the memory-side copper-manganese alloy layer 987L may be employed as a first copper-manganese alloy layer 17L.

Figure 18E:
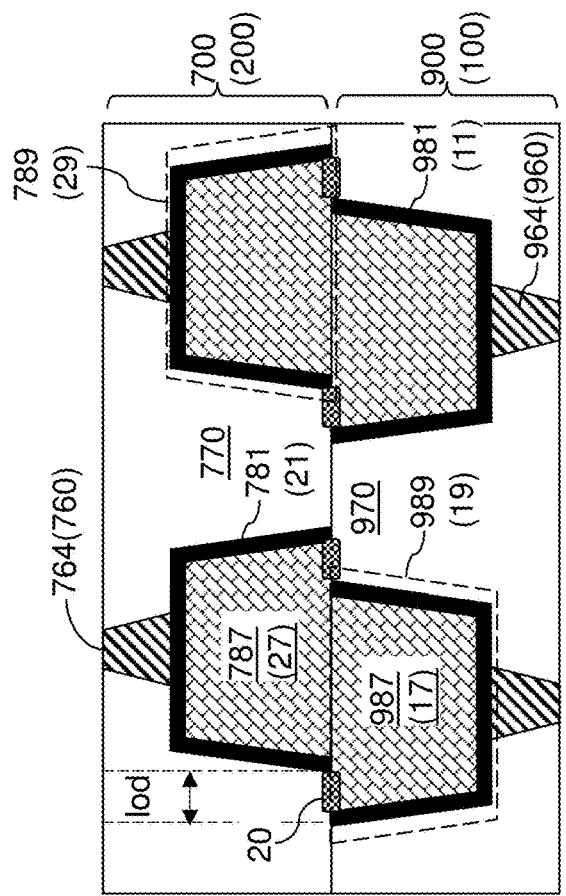
Figure 18D:
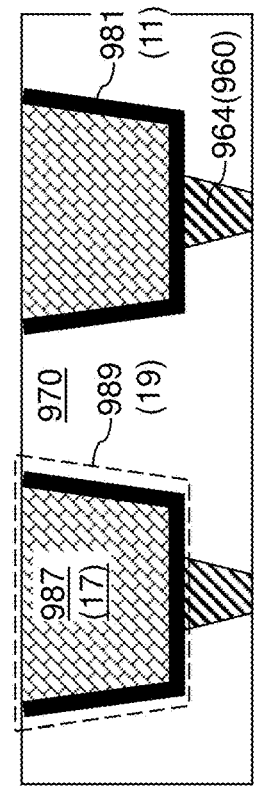

Referring to FIG. 18D, a chemical mechanical polishing process may be performed to remove portions of the memory-side metallic barrier liner layer 981L and the memory-side copper-manganese alloy layer 987L from above the horizontal plane including the top surface of the memory-side bonding-level dielectric layer 970 (which may be a first silicon oxide layer in case the memory die 900 is a first semiconductor die, or a second silicon oxide layer in case the memory die 900 is a second semiconductor die).

Each remaining portion of the memory-side metallic barrier liner layer 981L constitutes a memory-side metallic barrier liner 981. The memory-side metallic barrier liner 981 may be a first metallic barrier liner 11 in case the memory die 900 comprises a first semiconductor die of a bonded assembly to be subsequently formed, or a second metallic barrier liner in case the memory die 900 comprises a second semiconductor die.

Each remaining portion of the memory-side copper-manganese alloy layer 987L constitutes a memory-side copper-manganese alloy portion 987. The memory-side copper-manganese alloy portion 987 may be a first copper containing portion 17 in case the memory die 900 comprises a first semiconductor die of a bonded assembly to be subsequently formed, or a second copper containing portion 27 in case the memory die 900 comprises a second semiconductor die.

Each contiguous combination of a memory-side metallic barrier liner 981 and a memory-side copper-manganese alloy portion 987 constitutes a memory-side bonding pad 989. Each memory-side bonding pad 989 may be formed in the volume of a respective one of the memory-side pad cavities 979. The memory-side bonding pad 989 may be a first bonding pad 19 in case the memory die 900 comprises a first semiconductor die of a bonded assembly to be subsequently formed, or a second bonding pad in case the memory die 900 comprises a second semiconductor die.

Referring to FIG. 18E, the processing steps described with reference to FIGS. 18B-18D may also be performed on the logic die 700 to form a logic-side bonding pad 789 in each volume of the logic-side pad cavities 779. Each logic-side bonding pad 789 may comprise a logic-side metallic barrier liner 781 and a logic-side copper-manganese alloy portion 787. Each logic-side bonding pad 789 may be a second bonding pad 29 in case the logic die 700 comprises the second semiconductor die of a bonded assembly to be subsequently formed, or a first bonding pad in case the logic die 700 comprises the first semiconductor die.

As described above with respect to FIGS. 17D and 17E, the logic die 700 and the memory die 900 are bonded to each other by annealing at a temperature of at least 300 degrees Celsius. In one embodiment, the first bonding pad 19 comprises a first metallic barrier liner 11 (such as a memory-side metallic barrier liner 981 or a logic-side metallic barrier liner 781) comprising a first conductive metal or a metal nitride material or their bilayer, and interposed between the first copper containing portion 17, which in this embodiment comprises a first copper-manganese alloy portion, and the first silicon oxide layer (970 or 770). The second bonding pad 29 comprises a second metallic barrier liner 21 (such as a logic-side metallic barrier liner 781 or a memory-side metallic barrier liner 981) comprising a second conductive metal or a metal nitride material or their bilayer, and interposed between the second copper containing portion 27 which in this embodiment comprises a second copper-manganese alloy portion, and the second silicon oxide layer (770 or 970).

As described above, the manganese atoms from the first copper-manganese alloy portion 17 (such as the memory-side copper-manganese alloy portion 987) may diffuse into a surface portion of the second silicon oxide layer (such as the logic-side bonding-level dielectric layer 770), and/or manganese atoms from the second copper-manganese alloy portion 27 (such as the logic-side copper-manganese alloy portion 787) may diffuse into a surface portion of the first silicon oxide layer (such as the memory-side bonding-level dielectric layer 970) to form the least one manganese silicon oxide layer 20.

Depending on the manganese content in the alloy portions (17, 27), some or none of the manganese may remain in these alloy portions (17, 27) after the bonding process. In one embodiment, all of the manganese diffuses from the alloy portions (17, 27) into the manganese silicon oxide layers 20. In this embodiment, the alloy portions (17, 27) are converted into the first and second copper containing portions (17, 27) which comprise substantially pure copper containing less than 0.1 atomic percent manganese. In another embodiment, a first portion of the manganese from the alloy portions (17, 27) diffuses into the first or second silicon oxide layers (770, 970), while a second portion of the manganese remains in the alloy portions (17, 27) In this embodiment, the first and second copper containing portions (17, 27) comprise first and second copper-manganese alloy portions.

FIGS. 19A-19I are sequential vertical cross-sectional views of a region around memory-side pad cavities during formation of memory-side bonding pads and formation of a third configuration of the third exemplary structure including a bonded assembly according to the third embodiment of the present disclosure.

Figure 19B:
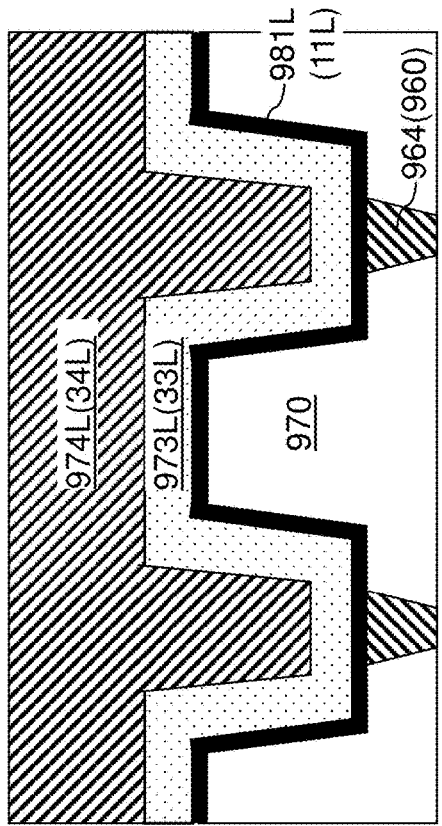
FIGS. 19A-19I are sequential vertical cross-sectional views of a region around memory-side pad cavities during formation of memory-side bonding pads and formation of a third configuration of the third exemplary structure including a bonded assembly according to the third embodiment of the present disclosure.
Figure 19A:
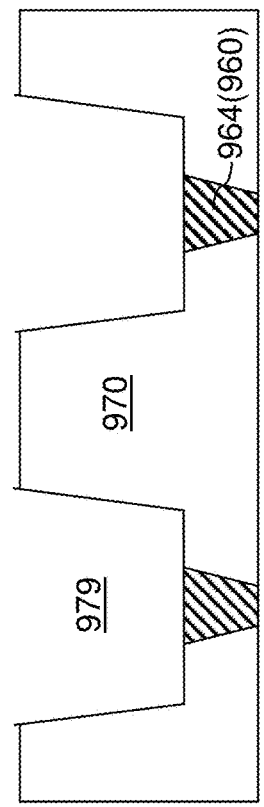

Referring to FIG. 19A, a region around memory-side pad cavities 979 in the memory die 900 of FIG. 15 is illustrated. The memory-side pad cavities 979 are formed within the memory-side bonding-level dielectric layer 970, which may be a silicon oxide layer. In case the memory die 900 is employed as a first semiconductor die 100, the memory-side bonding-level dielectric layer 970 may be employed as a first silicon oxide layer. In case the memory die 900 is employed as a second semiconductor die 200, the memory-side bonding-level dielectric layer 970 may be employed as a second silicon oxide layer.

Referring to FIG. 19B, a memory-side metallic barrier liner layer 981L may be deposited on the physically exposed surfaces of the memory-side bonding-level dielectric layer 970 in a peripheral portion of each of the memory-side pad cavities 979 and over the top surface of the memory-side bonding-level dielectric layer 970. In case the memory die 900 is employed as a first semiconductor die 100, the memory-side metallic barrier liner layer 981L may be employed as a first metallic barrier liner layer 11L. The memory-side metallic barrier liner layer 981L may comprise a first metal material, such as Ti, Ta, or a multilayer stack thereof, and/or a first conductive metal nitride material such as TiN, TaN, WN or a multilayer stack thereof. The thickness of the memory-side metallic barrier liner layer 981L may be in a range from 3 nm to 100 nm, such as from 10 nm to 30 nm, although lesser and greater thicknesses may also be employed.

A memory-side copper seed layer 973L may be deposited over the memory-side metallic barrier liner layer 981L, for example, by a physical vapor deposition process, such as sputtering. In case the memory die 900 is employed as a first semiconductor die 100, the memory-side copper seed layer 973L may be employed as a first copper seed layer 33L. The thickness of the horizontally-extending portions of the memory-side copper seed layer 973L may be less than 90%, and/or less than 80% and/or less than 70%, and/or less than 60%, and/or less than 50%, and/or less than 60%, of the depth of the memory-side pad cavities 979. For example, the thickness of the horizontally-extending portions of the memory-side copper seed layer 973L may be in a range from 100 nm to 4,000 nm, such as from 200 nm to 2,000 nm, and/or from 300 nm to 1,500 nm, although lesser and greater thicknesses may also be employed.

A memory-side copper fill layer 974L may be deposited on the memory-side copper seed layer 973L, for example, by electroplating or electroless plating. The thickness of the memory-side copper fill layer 974L may be selected such that the entire volume of each memory-side pad cavity 979 as provided at the processing steps of FIG. 19A is filled with the combination of the memory-side metallic barrier liner layer 981L, the memory-side copper seed layer 973L, and the memory-side copper fill layer 974L. The memory-side copper fill layer 974L may consist essentially of copper.

Figure 19D:
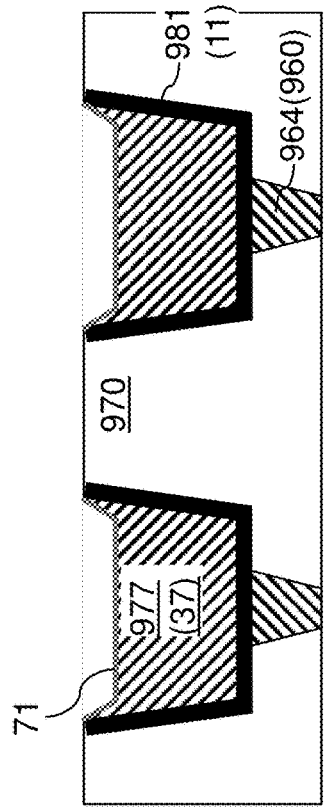
Figure 19C:
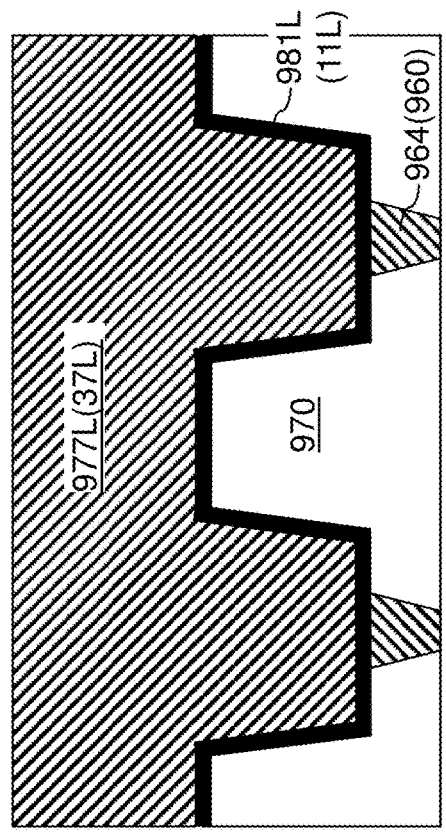

Referring to FIG. 19C, an anneal process may be performed to increase the average grain size in one or more of the memory-side metallic barrier liner layer 981L, the memory-side copper seed layer 973L, and the memory-side copper fill layer 974L. For example, the anneal process may be performed at an elevated temperature of less than 300 degrees Celsius, such as in a range from 100 degrees to 250 degrees, such as from 125 degrees to 200 degrees. The duration of the anneal process at the elevated temperature may be in a range from 10 minutes to 300 minutes, such as from 30 minutes to 120 minutes, although lesser and greater durations may also be employed. The memory-side copper seed layer 973L and the memory-side copper fill layer 974L merge to form a memory-side copper layer 977L. In case the memory die 900 comprises a first semiconductor die 100, the memory-side copper layer 977L may comprise a first copper containing layer 37L.

Referring to FIG. 19D, a first chemical mechanical polishing process may be performed to remove portions of the memory-side metallic barrier liner layer 981L and the memory-side copper layer 977L from above the horizontal plane including the top surface of the memory-side bonding-level dielectric layer 970 (which may be a first silicon oxide layer in case the memory die 900 is a first semiconductor die, or a second silicon oxide layer in case the memory die 900 is a second semiconductor die). Each remaining portion of the memory-side metallic barrier liner layer 981L constitutes a memory-side metallic barrier liner 981. The memory-side metallic barrier liner 981 may be a first metallic barrier liner 11 in case the memory die 900 comprises a first semiconductor die of a bonded assembly to be subsequently formed, or a second metallic barrier liner in case the memory die 900 comprises a second semiconductor die.

Each remaining portion of the memory-side copper layer 977L constitutes a memory-side copper portion 977. The memory-side copper portion 977 may be a first copper containing portion 37 (which in this embodiment consists essentially of copper) in case the memory die 900 comprises a first semiconductor die of a bonded assembly to be subsequently formed, or a second copper portion in case the memory die 900 comprises a second semiconductor die.

According to an aspect of the present disclosure, over-polishing may be performed at a terminal portion of the chemical mechanical polishing process to recess (i.e., dish) surface regions of each memory-side copper portion 977 below the horizontal plane including the top surface of the memory-side bonding-level dielectric layer 970. A vertical recess depth of recessed top surfaces of the memory-side copper portions 977 from the horizontal plane including the top surface of the memory-side bonding-level dielectric layer 970 may be in a range from 3 nm to 50 nm, such as from 10 nm to 20 nm, although lesser and greater recess depths may also be employed. Optionally, a recess etch process or a reverse electroplating process may be performed to further remove additional surface regions of the memory-side copper portions 977. In one embodiment, a surface copper oxide layer 71 may be formed on a physically exposed surface of each memory-side copper portion 977.

Figure 19F:
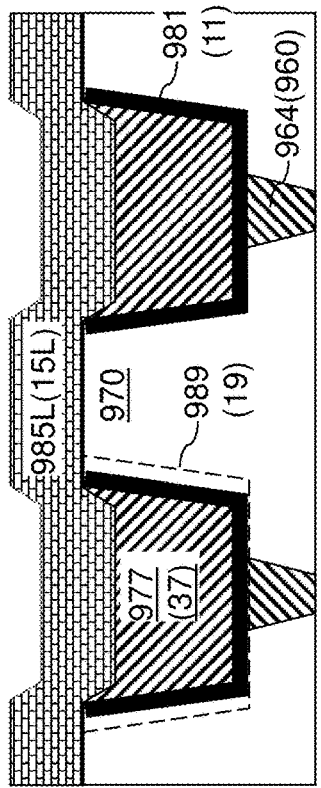
Figure 19H:
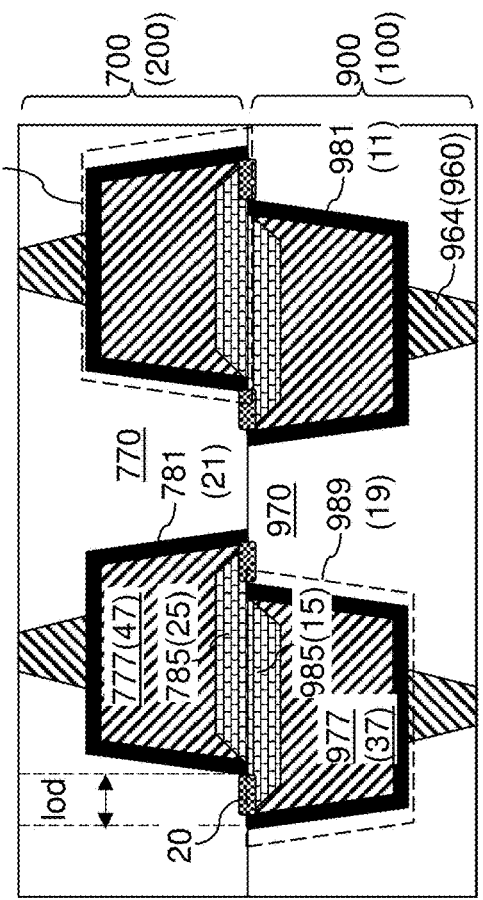
Figure 19E:
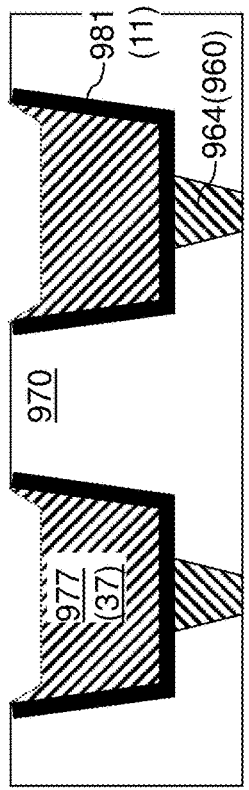

Referring to FIG. 19E, a suitable cleaning process may be performed to remove the surface copper oxide layer 71. For example, copper oxide chemical reduction may be performed by an anneal in a reducing atmosphere, such as a hydrogen atmosphere, and/or by a hydrogen plasma cleaning.

Referring to FIG. 19F and according to an aspect of the present disclosure, a memory-side copper-manganese alloy layer 985L may be deposited over the memory-side copper portions 977, for example, by a physical vapor deposition process, such as sputtering. In case the memory die 900 is employed as a first semiconductor die 100, the memory-side copper-manganese alloy layer 985L may be employed as a first copper-manganese alloy layer 15L. The memory-side copper-manganese alloy layer 985L includes, and/or consists essentially of, a copper-manganese alloy in which atomic percentage of manganese atoms may be in a range from 1% to 20%, such as from 2% to 10%, although lesser and greater atomic percentages may also be employed. The thickness of the memory-side copper-manganese alloy layer 985L may be in a range from 20 nm to 200 nm, although lesser and greater thicknesses may also be employed.

Figure 19G:
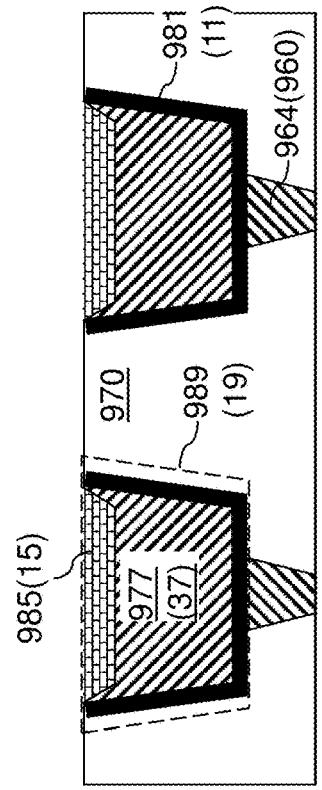

Referring to FIG. 19G, a second chemical mechanical polishing process may be performed to remove portions of the memory-side copper-manganese alloy layer 985L from above the horizontal plane including the top surface of the memory-side bonding-level dielectric layer 970 (which may be a first silicon oxide layer in case the memory die 900 is a first semiconductor die, or a second silicon oxide layer in case the memory die 900 is a second semiconductor die). Each remaining portion of the memory-side copper-manganese alloy layer 985L constitutes a memory-side copper-manganese alloy portion 985. The memory-side copper-manganese alloy portion 985 may be a first copper-manganese alloy portion 15 in case the memory die 900 comprises a first semiconductor die of a bonded assembly to be subsequently formed, or a second copper-manganese alloy portion in case the memory die 900 comprises a second semiconductor die.

Each contiguous combination of a memory-side metallic barrier liner 981, a memory-side copper portion 977, and a memory-side copper-manganese alloy portion 985 constitutes a memory-side bonding pad 989. Each memory-side bonding pad 989 may be formed in the volume of a respective one of the memory-side pad cavities 979. The memory-side bonding pad 989 may be a first bonding pad 19 in case the memory die 900 comprises a first semiconductor die of a bonded assembly to be subsequently formed, or a second bonding pad in case the memory die 900 comprises a second semiconductor die.

Referring to FIG. 19H, the processing steps described with reference to FIGS. 19B-19G may also be performed on the logic die 700 to form a logic-side bonding pad 789 in each volume of the logic-side pad cavities 779. Each logic-side bonding pad 789 may comprise a logic-side metallic barrier liner 781, a logic-side copper portion 777, and a logic-side copper-manganese alloy portion 785. Each logic-side bonding pad 789 may be a second bonding pad 29 in case the logic die 700 comprises the second semiconductor die of a bonded assembly to be subsequently formed, or a first bonding pad in case the logic die 700 comprises the first semiconductor die.

The logic die 700 and the memory die 900 are then bonded as described above by performing a bonding anneal at a temperature of at least 300 degrees Celsius. Each logic-side bonding pad 789 may be bonded to a respective memory-side bonding pad 989, and each memory-side bonding pad 989 may be bonded to a respective logic-side bonding pad 789.

Generally, a first semiconductor die 100 comprising first semiconductor devices (920 or 720) and a first bonding pad 19 embedded within a first silicon oxide layer (970 or 770) may be provided. The first bonding pad 19 comprises a first copper-manganese alloy portion 15 (such as a memory-side copper-manganese alloy portion 985 or a logic-side copper-manganese alloy portion 785), a first metallic barrier liner 11 (such as a memory-side metallic barrier liner 981 or a logic-side metallic barrier liner 781) comprising a first conductive metal or a metal nitride material or their bilayer, and a first copper containing portion 37, which may be a memory-side copper portion 977 or a logic-side copper portion 777.

Likewise, a second semiconductor die 200 comprising second semiconductor devices (720 or 920) and a second bonding pad 29 embedded within a second silicon oxide layer (770 or 970) may be provided. The second bonding pad 29 comprises a second copper-manganese alloy portion 25 (such as a logic-side copper-manganese alloy portion 785 or a memory-side copper-manganese alloy portion 985). In one embodiment, the second bonding pad 29 also comprises a second metallic barrier liner 21 (such as a logic-side metallic barrier liner 781 or a memory-side metallic barrier liner 981) comprising a second conductive metal or metal nitride material and interposed between the second copper-manganese alloy portion 25 and the second silicon oxide layer (770 or 970). In one embodiment, the second bonding pad 29 also comprises a second copper portion 47, which may be a logic-side copper portion 777 or a memory-side copper portion 977.

The second bonding pads 29 can be bonded to the first bonding pad 19 via metal-to-metal bonding while inducing outdiffusion of manganese atoms from at least one of the first copper-manganese alloy portion 15 and the second copper-manganese alloy portion 25 into at least one of the first silicon oxide layer (970 or 770) and the second silicon oxide layer (770 or 970). In one embodiment, at least one of the first silicon oxide layer (970 or 770) and the second silicon oxide layer (770 or 970) directly contacts at least one of the first bonding pad 19 and the second bonding pad 29 when the first semiconductor die 100 is brought into contact with the second semiconductor die 200. For example, a horizontal surface segment of the first bonding pad 19 may contact a horizontal surface segment of the second silicon oxide layer 770, and/or a horizontal surface segment of the second bonding pad 29 may contact a horizontal surface segment of the first silicon oxide layer 970. In this case, manganese atoms from the first copper-manganese alloy portion 15 (such as the memory-side copper-manganese alloy portion 985) may diffuse into a surface portion of the second silicon oxide layer (such as the logic-side bonding-level dielectric layer 770), and/or manganese atoms from the second copper-manganese alloy portion 25 (such as the logic-side copper-manganese alloy portion 785) may diffuse into a surface portion of the first silicon oxide layer (such as the memory-side bonding-level dielectric layer 970).

At least one manganese silicon oxide layer 20 is formed between one of the first bonding pad 19 or the second bonding pad 29, and one of the first silicon oxide layer (970 or 770) or the second silicon oxide layer (770 or 970). Specifically, the at least one manganese silicon oxide layer 20 can be formed at each interface between a combination of the first copper-manganese alloy portion 15 (such as the memory-side copper-manganese alloy portion 983) and the second copper-manganese alloy portion 25 (such as the logic-side copper-manganese alloy portion 783) and a combination of the first silicon oxide layer (such as the memory-side bonding-level dielectric layer 970) and the second silicon oxide layer (such as the logic-side bonding-level dielectric layer 770).

In one embodiment, the first bonding pad 19 comprises a first copper containing portion 37 that is substantially free of manganese and is in contact with the first copper-manganese alloy portion 15. The first copper containing portion 37 laterally surrounds and embeds the first copper-manganese alloy portion 15. In one embodiment, a bonding surface of the first bonding pad 19 comprises a planar surface of the first copper-manganese alloy portion 15. In this case, the at least one manganese silicon oxide layer 20 comprises a horizontally-extending portion through which a horizontal plane including an interface between the first silicon layer (970 or 770) and the second silicon oxide layer (770 or 970) extends.

In one embodiment, the second bonding pad 29 comprises a second copper containing portion 47 that is substantially free of manganese and is in contact with the second copper-manganese alloy portion 25. The second copper portion 47 laterally surrounds and embeds the second copper-manganese alloy portion 25. In one embodiment, a bonding surface of the second bonding pad 29 comprises a planar surface of the second copper containing portion 47 and a planar surface of the second copper-manganese alloy portion 25. In this case, the at least one manganese silicon oxide layer 20 comprises a horizontally-extending portion through which a horizontal plane including an interface between the first silicon layer (970 or 770) and the second silicon oxide layer (770 or 970) extends.

Figure 19I:
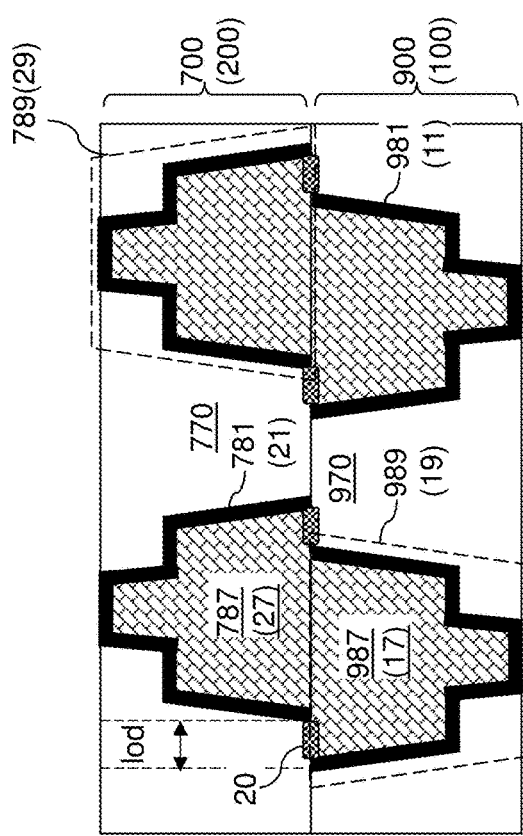

Referring to FIG. 19I, at the completion of the bonding anneal process may the first copper-manganese alloy portion 15 (such as the memory-side copper-manganese alloy portion 985) and the second copper-manganese alloy portion 25 (such as the logic-side copper-manganese alloy portion 785) are dissolved due to out diffusion of manganese out of these alloy portions (15, 25).

In one embodiment, all of the manganese diffuses from the alloy portions (15, 25) into the manganese silicon oxide layers 20. In this embodiment, the first and second copper containing portions (37, 47) comprise substantially pure copper containing less than 0.1 atomic percent manganese. In another embodiment, a first portion of the manganese from the alloy portions (15, 25) diffuses into the first or second silicon oxide layers (770, 970), while a second portion of the manganese diffuses from the alloy portions (15, 25) into the first and second copper portions (37, 47). In this embodiment, the first and second copper containing portions (37, 47) are converted to first and second copper-manganese alloy portions (17, 27). Each of the first copper-manganese alloy portion 17 and the second copper-manganese alloy portion 27 may comprise a homogenized copper-manganese alloy, or may comprise a copper-manganese alloy having a compositional gradient therein.

Figure 20A:
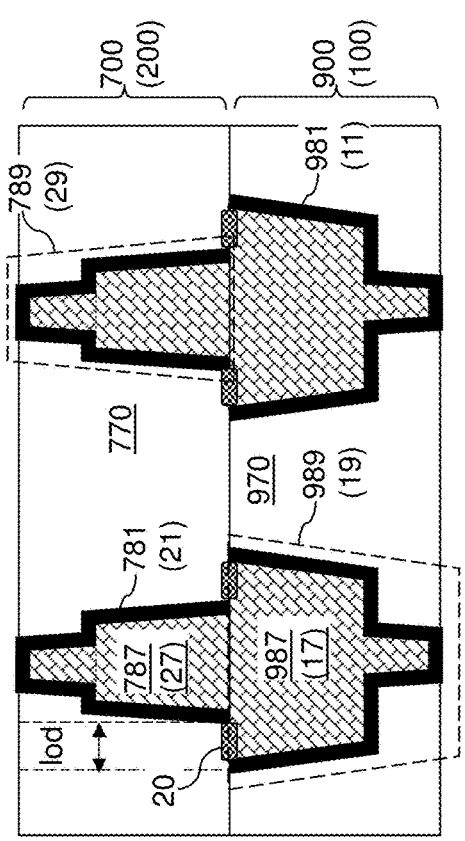
FIGS. 20A-20C are vertical cross-sectional views of a region around bonded pairs of bonding pads in additional configurations of the third exemplary structure including a bonded assembly according to the third embodiment of the present disclosure.
Figure 20B:
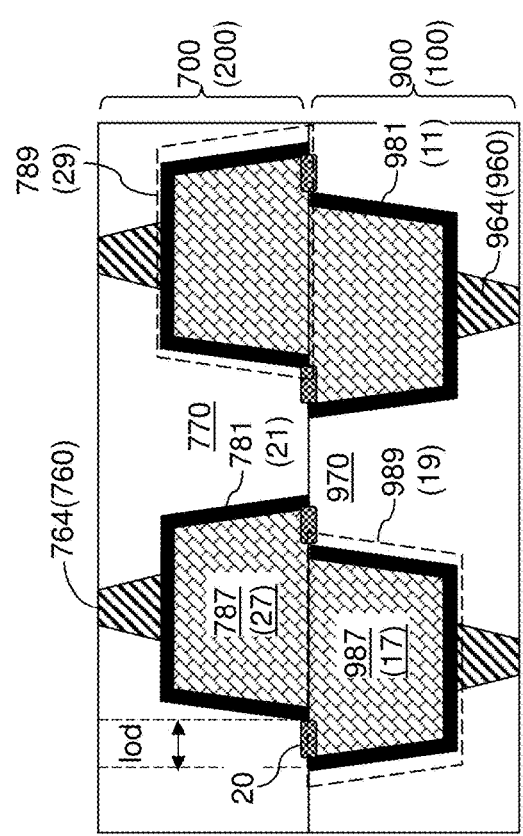
Figure 20C:
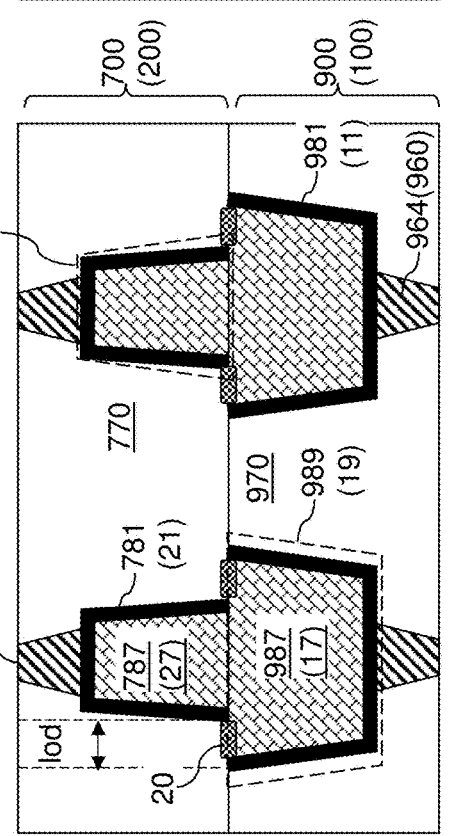
Figure 21E:
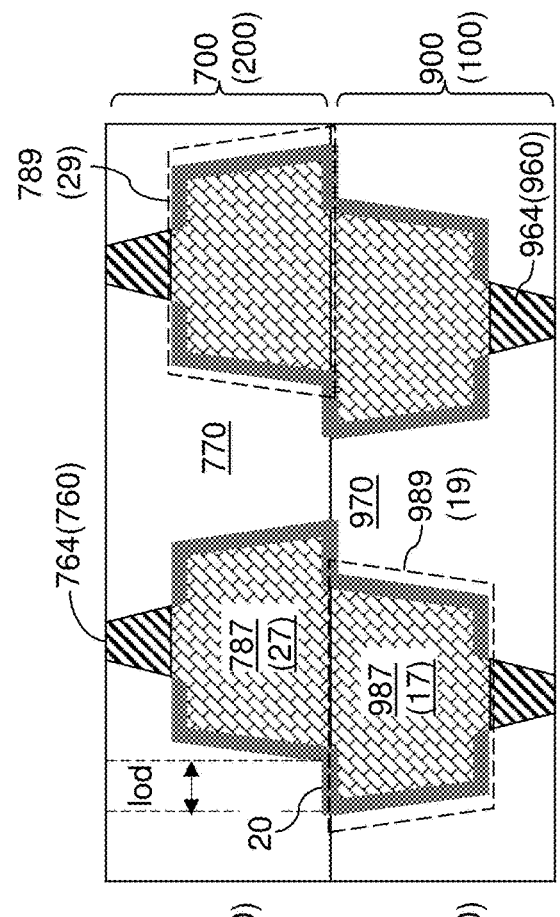
Figure 21D:
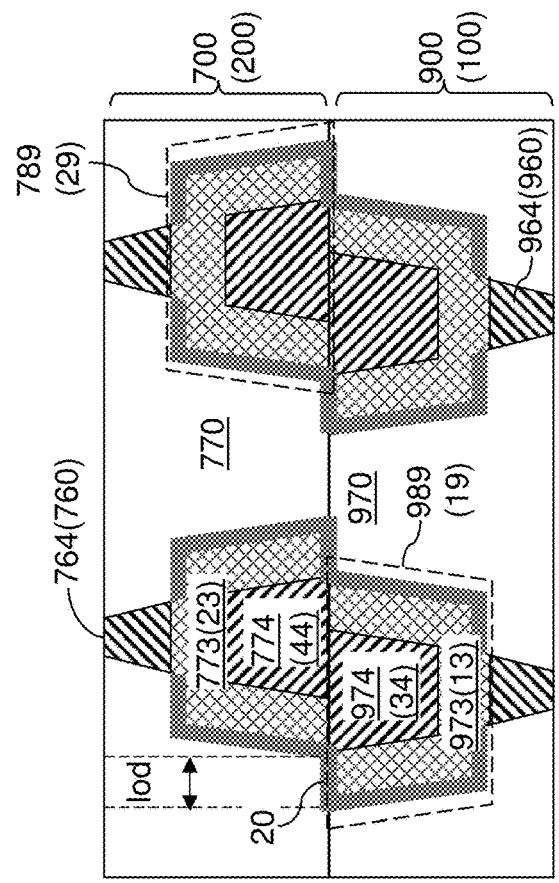
Figure 22A:
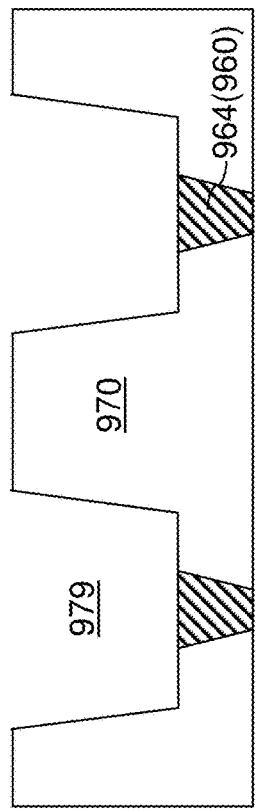
FIGS. 22A-22E are sequential vertical cross-sectional views of a region around memory-side pad cavities during formation of memory-side bonding pads and formation of a second configuration of the fourth exemplary structure including a bonded assembly according to the fourth embodiment of the present disclosure.
Figure 22B:
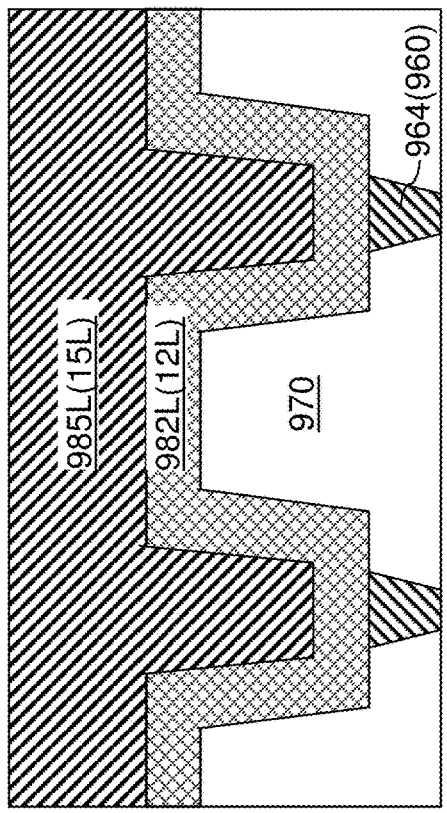
Figure 22C:
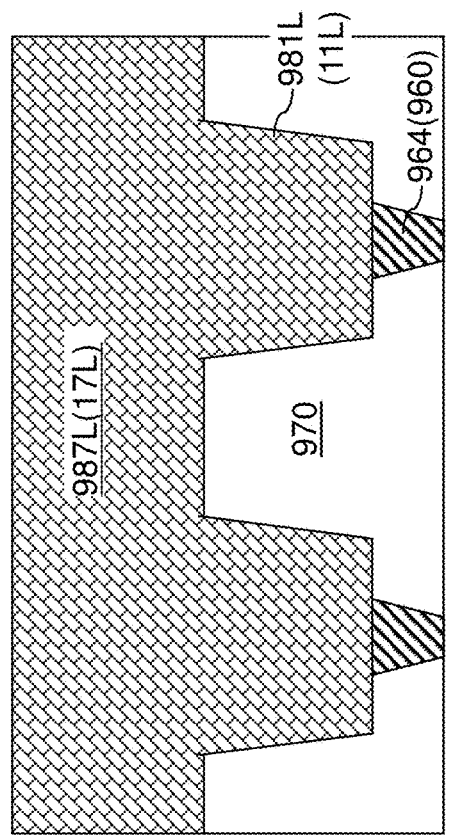
Figure 22E:
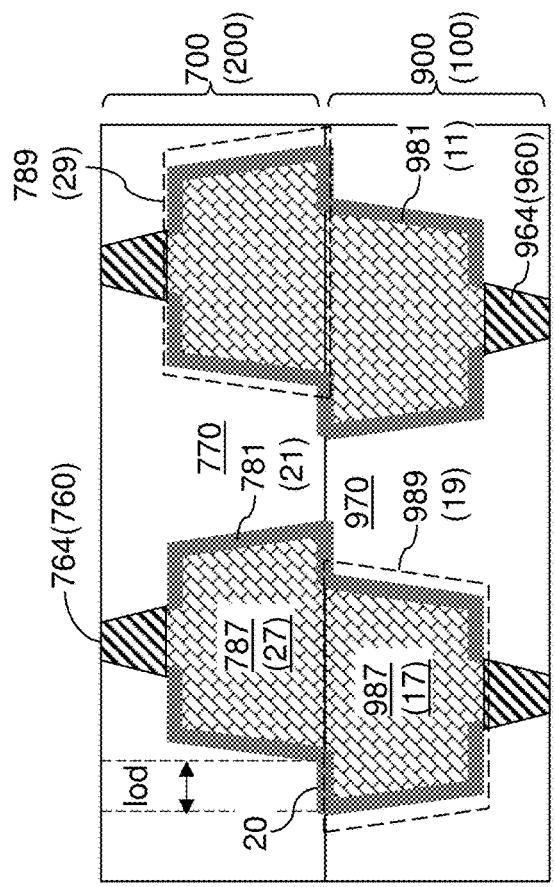
Figure 22D:
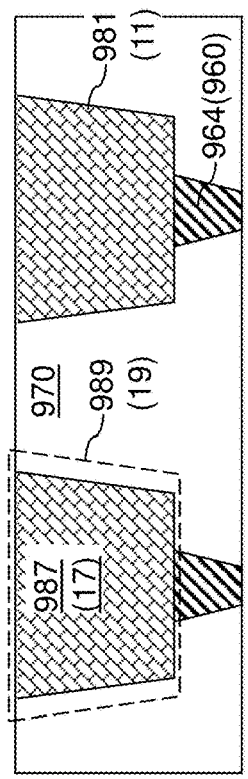

FIGS. 20A-20C are vertical cross-sectional views of a region around bonded pairs of bonding pads in additional configurations of the third exemplary structure including a bonded assembly according to the third embodiment of the present disclosure.

Referring to FIG. 20A, a first alternative configuration of the third exemplary structure may be derived from any of the configurations of the third exemplary structure by forming a first bonding pad 19 and/or a second bonding pad 29 such that the first and/or second bonding pad(s) (19, 29) include (s) a respective copper containing via portion as well as a copper containing pad portion. The first alternative configuration of the third exemplary structure may be provided by omitting formation of the memory-side bonding via structures 964 and/or logic-side bonding via structures 764, and by forming the memory-side bonding pad 989 within the entirety of a volume of a memory-side pad cavity 979 as provided at the processing steps of FIG. 15 and/or by forming the logic-side bonding pad 789 within the entirety of a volume of a logic-side pad cavity 779 as provided at the processing steps of FIG. 16.

Referring to FIG. 20B, a second alternative configuration of the third exemplary structure may be derived from any of the configurations of the third exemplary structure by forming first bonding pads 19 and second bonding pads 29 such that the first bonding pads 19 are larger than the second bonding pads 29. In this embodiment, formation of the copper-manganese alloy portions in the second bonding pads 29 may be omitted, and the copper-manganese alloy portions are formed only in the first bonding pads 19. In this embodiment, the entire bonding surface of the second bonding pads 29 contacts the wider bonding surface of the respective first bonding pads 19. Thus, only the bonding surface of the first bonding pads 19 contacts the opposite silicon oxide layer (e.g., layer 770). In this embodiment, at least one manganese silicon oxide layer 20 comprises a pair of manganese silicon oxide layer 20 that are laterally spaced apart from each other by the second copper-manganese alloy portion 27, in contact with the first copper-manganese alloy portion, and in contact with the second silicon oxide layer (770 or 970) which laterally surrounds the second copper-manganese alloy portion 27.

Referring to FIG. 20C, a third alternative configuration of the third exemplary structure may be provided by combining the features of the first alternative configuration of the third exemplary structure and the second alternative configuration of the third exemplary structure. Thus, the first bonding pads 19 are larger than the second bonding pads 29 and the first and/or second bonding pad(s) (19, 29) include a respective copper containing via portion as well as a copper containing pad portion.

In the fourth embodiment, the metallic barrier liners (11, 21) are omitted, and the at least one manganese silicon oxide layer 20 surrounds each bonding pad (19, 29). Thus, the manganese silicon oxide layer 20 functions as a diffusion barrier for each bonding pad. Specifically, the manganese atoms outdiffuse from the copper-manganese alloy portion into the adjacent silicon oxide layer which embeds the respective bonding pad to form a thin manganese silicon oxide diffusion barrier layer which is located between the bonding pad and the silicon oxide layer surrounding the bonding pad.

FIGS. 21A-21E are sequential vertical cross-sectional views of a region around memory-side pad cavities during formation of memory-side bonding pads and formation of a first configuration of a fourth exemplary structure including a bonded assembly according to the fourth embodiment of the present disclosure.

The first configuration of the fourth exemplary structure illustrated in FIGS. 21A-21E may be derived from the first configuration of the third exemplary structure illustrated in FIGS. 17A-17E by omitting formation of at least one of a first metallic barrier liner layer 11L (such as a memory-side metallic barrier liner layer 981L) and a second metallic barrier liner layer. As such, a first metallic barrier liner 11 in a first bonding pad 19 may be omitted, and/or a second metallic barrier liner 21 in a second bonding pad 29 may be omitted. In one embodiment, the first bonding pads 19 may be free of any metallic barrier liner, and the second bonding pad 29 may be free of any metallic barrier liner.

FIGS. 22A-22E are sequential vertical cross-sectional views of a region around memory-side pad cavities during formation of memory-side bonding pads and formation of a second configuration of the fourth exemplary structure including a bonded assembly according to the fourth embodiment of the present disclosure.

The second configuration of the fourth exemplary structure illustrated in FIGS. 22A-22E may be derived from the second configuration of the third exemplary structure illustrated in FIGS. 18A-18E by omitting formation of at least one of a first metallic barrier liner layer 11L (such as a memory-side metallic barrier liner layer 981L) and a second metallic barrier liner layer. As such, a first metallic barrier liner 11 in a first bonding pad 19 may be omitted, and/or a second metallic barrier liner 21 in a second bonding pad 29 may be omitted. In one embodiment, the first bonding pads 19 may be free of any metallic barrier liner, and the second bonding pad 29 may be free of any metallic barrier liner.

Figure 23A:
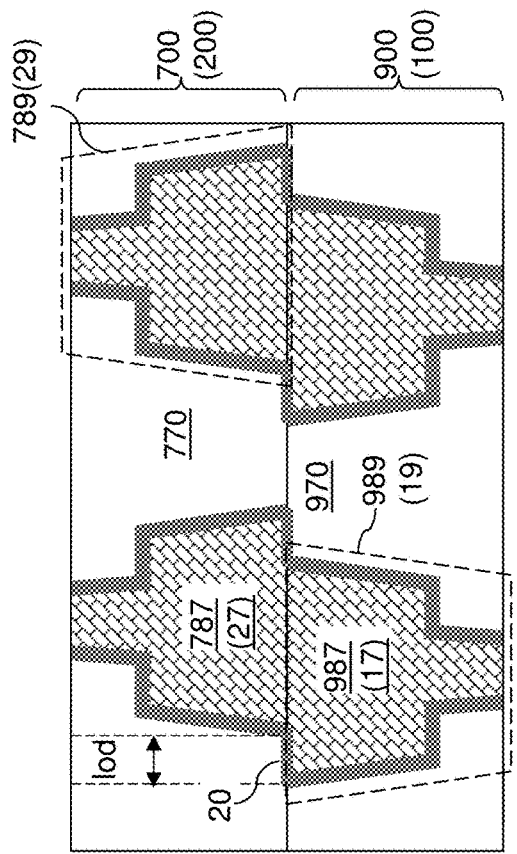
FIGS. 23A-23C are sequential vertical cross-sectional views of a region around bonded pairs of bonding pads in additional configurations of the fourth exemplary structure including a bonded assembly according to the fourth embodiment of the present disclosure.
Figure 23C:
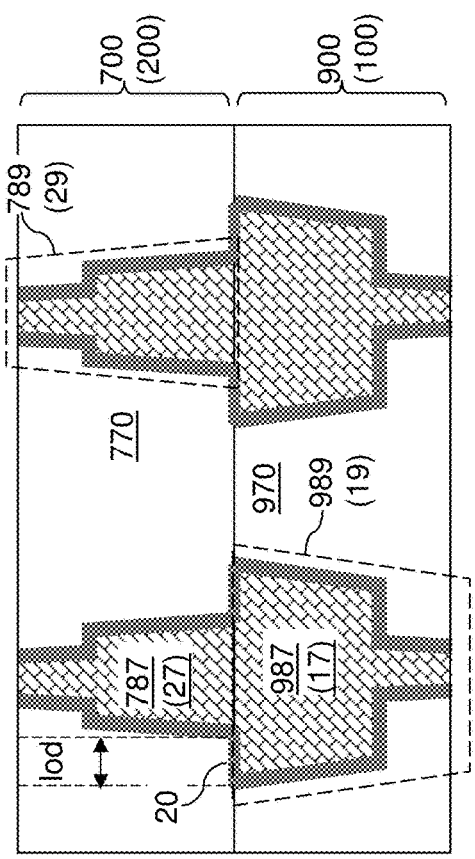
Figure 23B:
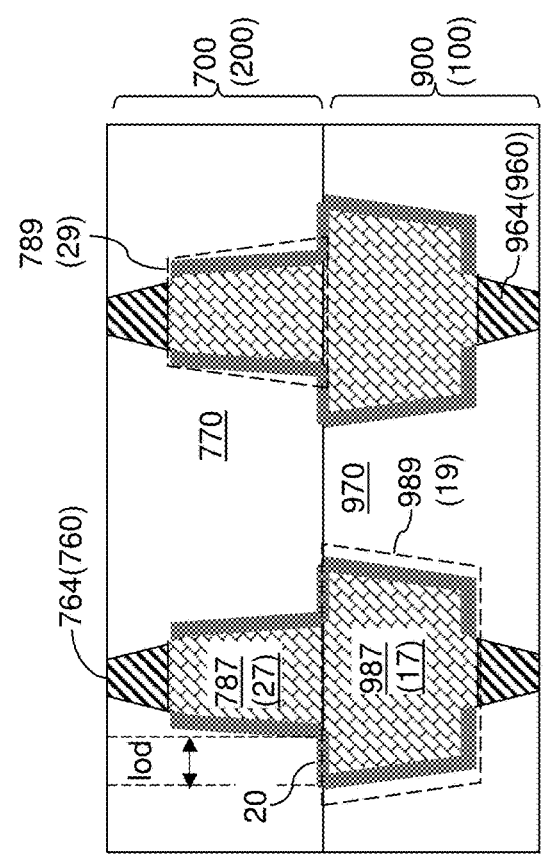

FIGS. 23A-23C are sequential vertical cross-sectional views of a region around bonded pairs of bonding pads in additional configurations of the fourth exemplary structure including a bonded assembly according to the fourth embodiment of the present disclosure.

The alternative configurations of the fourth exemplary structure illustrated in FIGS. 23A-23C may be derived from the alternative configurations of the third exemplary structure illustrated in FIGS. 20A-20C by omitting formation of at least one of a first metallic barrier liner layer 11L (such as a memory-side metallic barrier liner layer 981L) and a second metallic barrier liner layer. As such, a first metallic barrier liner 11 in a first bonding pad 19 may be omitted, and/or a second metallic barrier liner 21 in a second bonding pad 29 may be omitted. In one embodiment, the first bonding pads 19 may be free of any metallic barrier liner, and the second bonding pad 29 may be free of any metallic barrier liner.

Generally, in each configuration of the fourth exemplary structure of the present disclosure, the at least one manganese silicon oxide layer 20 may be formed as a single continuous manganese silicon oxide layer 20 that laterally surrounds at least one or both of the first bonding pad 19 and the second bonding pad 29. The at least one manganese silicon oxide layer 20 comprises a horizontally-extending portion through which a horizontal plane including an interface between the first silicon layer (970 or 770) and the second silicon oxide layer (770 or 970) extends. Further, the at least one manganese silicon oxide layer 20 comprises a vertically-extending or tapered portion contacting a sidewall of one of the first copper containing portion 17 and the second copper containing portion 27. Further, the at least one manganese silicon oxide layer 20 comprises an additional horizontally-extending portion contacting a peripheral portion of a backside surface of the one of the first copper containing portion 17 and the second copper containing portion 27. In one embodiment, a center portion of the backside surface of the one of the first copper containing portion 17 and the second copper containing portion 27 that is not in direct contact with the at least one manganese silicon oxide layer 20 is in direct contact with a metal interconnect structure (960 or 760).

Each of the bonded assemblies illustrated in FIGS. 21E, 22E, and 23A-23C comprises: a first semiconductor die 100 comprising first semiconductor devices (920 or 720) and a first bonding pad 19 embedded within a first silicon oxide layer (970 or 770), wherein the first bonding pad 19 comprises a first copper-manganese alloy portion 17; a second semiconductor die 200 comprising second semiconductor devices (720 or 920) and a second bonding pad 29 that is embedded within a second silicon oxide layer (770 or 970) and is bonded to the first bonding pad 19 via metal-to-metal bonding, wherein the second bonding pad 29 comprises a second copper-manganese alloy portion 27; and at least one metal silicon oxide layer 20 interposed between the first bonding pad 19 and the second silicon oxide layer (770 or 970).

In one embodiment, the at least one metal silicon oxide layer comprises at least one manganese silicon oxide layer 20. The at least one manganese silicon oxide layer 20 is located at a bonding interface between the first semiconductor 100 die and the second semiconductor die 200.

In the various configurations of the fourth exemplary structure, a single continuous manganese silicon oxide layer 20 laterally surrounds the first bonding pad 19. The single continuous manganese silicon oxide layer 20 comprises a horizontally-extending portion through which a horizontal plane including an interface between the first silicon oxide layer (such as the memory-side bonding-level dielectric layer 970) and the second silicon oxide layer (such as the logic-side bonding-level dielectric layer 770) extends. Further, the single continuous manganese silicon oxide layer 20 comprises a vertically-extending or tapered portion contacting a sidewall of the first copper containing portion 17. Further, the at least one manganese silicon oxide layer 20 comprises an additional horizontally-extending portion contacting a peripheral portion of a backside surface of the first copper containing portion 17. In one embodiment, a center portion of the backside surface of the first copper containing portion 17 that is not in direct contact with the at least one manganese silicon oxide layer 20 is in direct contact with a respective memory-side metal interconnect structure 960.

Alternatively or additionally, the single continuous manganese silicon oxide layer 20 laterally surrounds the second bonding pad 29 in the same manner as the first bonding pad 19. In one embodiment, the at least one manganese silicon oxide layer 20 comprises a single continuous manganese silicon oxide layer 20 contacting each surface of the first combination of the first bonding pad 19 and the second bonding pad 29 except a surface of the first bonding pad 19 that contacts a first metal interconnect structure (such as a memory-side metal interconnect structure 960) located on a backside of the first bonding pad 19 and except a surface of the second bonding ad that contacts a second metal interconnect structure (such as a logic-side metal interconnect structure 760) located on a backside of the second bonding pad 29.

In the third and fourth embodiments, a manganese-copper alloy in the bonding pad is used to form the manganese silicon oxide layer 20 which functions as a diffusion barrier. However, in other embodiments, the self-forming diffusion barrier layer may include metals other than manganese in addition to or instead of manganese. For example, an alloy of copper and one or more other metals, such as manganese, aluminum, magnesium and/or titanium may be formed in the bonding pad. The alloy outdiffuses atoms of one or more other metal besides copper to form a metal silicon oxide diffusion barrier layer having the configuration of layer 20 described above with respect to the third or the fourth embodiment. The diffusion barrier may comprise a metal silicate layer 20, where the metal comprises one or more of Mn, Al, Mg or Ti.

Referring to various embodiments and drawings related the third exemplary structure and the fourth exemplary structure, a bonded assembly is provided, which comprises: a first semiconductor die 100 comprising first semiconductor devices (920 or 720) and a first bonding pad 19 embedded within a first silicon oxide layer (970 or 770), wherein the first bonding pad 19 comprises a first copper containing portion 17; a second semiconductor die 200 comprising second semiconductor devices (720 or 920) and a second bonding pad 29 that is embedded within a second silicon oxide layer (770 or 970) and is bonded to the first bonding pad 19 via metal-to-metal bonding, wherein the second bonding pad 29 comprises a second copper containing portion 27; and at least one metal silicon oxide layer 20 interposed between the first bonding pad 19 and the second silicon oxide layer (770 or 970).

In one embodiment, the at least one metal silicon oxide layer comprises at least one manganese silicon oxide layer 20. The at least one manganese silicon oxide layer 20 is located at a bonding interface between the first semiconductor 100 die and the second semiconductor die 200. In one embodiment, the at least one manganese silicon oxide layer 20 comprises a horizontally-extending portion through which a horizontal plane including an interface between the first silicon oxide layer (970 or 770) and the second silicon oxide layer (770 or 970) extends.

In one embodiment, one of the first bonding pad 19 and the second bonding pad 29 comprises a metallic barrier liner (11 or 21) comprising a conductive metal or metal nitride material, and the at least one manganese silicon oxide layer 20 is in contact with the metallic barrier liner (11 or 21). In one embodiment, the metallic barrier liner (11 or 21) is in contact with an entirety of sidewalls and a backside surface of one of the first copper containing portion 17 and the second copper containing portion 27.

In one embodiment, the at least one manganese silicon oxide layer 20 comprises a vertically-extending or tapered portion contacting a sidewall of one of the first copper containing portion 17 and the second copper containing portion 27, and a horizontally-extending portion contacting a peripheral portion of a backside surface of the one of the first copper containing portion 17 and the second copper containing portion 27. In one embodiment, a center portion of the backside surface of the one of the first copper containing portion 17 and the second copper containing portion 27 that is not in direct contact with the at least one manganese silicon oxide layer 20 is in direct contact with a metal interconnect structure (960 or 760).

In one embodiment, the at least one manganese silicon oxide layer 20 comprises a single continuous manganese silicon oxide layer 20 contacting each surface of the first bonding pad 19 and the second bonding pad 29 except a surface of the first bonding pad 19 that contacts a first metal interconnect structure located on a backside of the first bonding pad 19 and except a surface of the second bonding ad that contacts a second metal interconnect structure located on a backside of the second bonding pad 29.

In one embodiment, the at least one manganese silicon oxide layer 20 comprises: a first manganese silicon oxide layer 20 in contact with the first copper containing portion 17 and the second silicon oxide layer (770 or 970); and a second manganese silicon oxide layer 20 in contact with the second copper containing portion 27 and the first silicon oxide layer (970 or 770).

In one embodiment, the at least one manganese silicon oxide layer 20 comprises a pair of manganese silicon oxide layer 20 that are laterally spaced apart from each other by the second copper containing portion 27, are in contact with the first copper containing portion 17, and are in contact with the second silicon oxide layer (770 or 970) which laterally surrounds the second copper containing portion 27.

In the third embodiment, the first bonding pad 19 and the second bonding pad 29 each comprises at least one metallic barrier liner (11 or 21) comprising a respective conductive metal or metal nitride material; a backside surface of the first bonding pad 19 contacts a first metal interconnect structure (760 or 960) embedded in the first semiconductor die 100; a backside surface of the second bonding pad 29 contacts a second metal interconnect structure (960 or 760) embedded in the second semiconductor die 200: and a combination of the first copper containing portion 17 and the second copper containing portion 27 is encapsulated by a combination of the at least one manganese silicon oxide layer 20, the at least one metallic barrier liner (11 or 21), the first metal interconnect structure (960 or 760), and the second metal interconnect structure (760 or 960).

In the fourth embodiment, a backside surface of the first bonding pad 19 contacts a first metal interconnect structure (960 or 760) embedded in the first semiconductor die 100; a backside surface of the second bonding pad 29 contacts a second metal interconnect structure (760 or 960) embedded in the second semiconductor die 200; and a combination of the first copper containing portion 17 and the second copper containing portion 27 is encapsulated by a combination of the at least one manganese silicon oxide layer 20, the first metal interconnect structure (960 or 760), and the second metal interconnect structure (760 or 960).

In one embodiment, at least one of the first copper containing portion 17 and the second copper containing portion 27 consists essentially of copper (i.e., comprises essentially pure copper). In another embodiment at least one of the first copper containing portion 17 and the second copper containing portion 27 comprises a copper-manganese alloy.

Manganese diffuses with high mobility in copper-manganese alloy materials, and readily combines with silicon oxide to form manganese silicon oxide. Manganese silicon oxide functions as an effective diffusion barrier material that prevents or reduces diffusion of copper therethrough. The thickness of the at least one manganese silicon oxide layer 20 may be in a range from 1 nm to 20 nm, such as from 2 nm to 10 nm, although lesser and greater thicknesses may also be employed. The at least one manganese silicon oxide layer 20 is self-aligned such that any interface between the bonding pad (19, 29) and an adjacent silicon oxide layer (770, 970) includes the manganese silicon oxide layer 20 which acts as a diffusion barrier to copper atoms.

Although the foregoing refers to particular embodiments, it will be understood that the disclosure is not so limited. It will occur to those of ordinary skill in the art that various modifications may be made to the disclosed embodiments and that such modifications are intended to be within the scope of the disclosure. Compatibility is presumed among all embodiments that are not alternatives of one another. The word "comprise" or "include" contemplates all embodiments in which the word "consist essentially of" or the word "consists of" replaces the word "comprise" or "include," unless explicitly stated otherwise. Where an embodiment using a particular structure and/or configuration is illustrated in the present disclosure, it is understood that the present disclosure may be practiced with any other compatible structures and/or configurations that are functionally equivalent provided that such substitutions are not explicitly forbidden or otherwise known to be impossible to one of ordinary skill in the art. All of the publications, patent applications and patents cited herein are incorporated herein by reference in their entirety.

The invention claimed is:

1. A bonded assembly, comprising:
a first semiconductor die comprising first semiconductor devices and a first bonding pad embedded within a first silicon oxide layer, wherein the first bonding pad comprises a first copper containing portion;
a second semiconductor die comprising second semiconductor devices and a second bonding pad that is embedded within a second silicon oxide layer and is bonded to the first bonding pad via metal-to-metal bonding, wherein the second bonding pad comprises a second copper containing portion having a front side surface bonded to a front side surface of the first copper containing portion; and
at least one metal silicon oxide layer interposed between the first bonding pad and the second silicon oxide layer, wherein the at least one metal silicon oxide layer contacts a sidewall of at least one of the first bonding pad and the second bonding pad.

2. The bonded assembly of claim 1, wherein the at least one metal silicon oxide layer comprises at least one manganese silicon oxide layer.

3. The bonded assembly of claim 2, wherein:
the at least one manganese silicon oxide layer is located at a bonding interface between the first semiconductor die and the second semiconductor die, and
the at least one manganese silicon oxide layer comprises a horizontally-extending portion through which a horizontal plane including an interface between the first silicon oxide layer and the second silicon oxide layer extends.

4. The bonded assembly of claim 2, wherein one of the first bonding pad and the second bonding pad further comprises a metallic barrier liner comprising a conductive metal or metal nitride material, and the at least one manganese silicon oxide layer is in contact with the metallic barrier liner.

5. The bonded assembly of claim 4, wherein the metallic barrier liner is in contact with an entirety of sidewalls and backside surface of one of the first copper containing portion and the second copper containing portion.

6. The bonded assembly of claim 2, wherein the at least one manganese silicon oxide layer comprises:

a vertically-extending or tapered portion contacting the sidewall of one of the first copper containing portion and the second copper containing portion; and a horizontally-extending portion contacting a peripheral portion of a backside surface of the one of the first copper containing portion and the second copper containing portion.

7. The bonded assembly of claim 6, wherein a center portion of the backside surface of the one of the first copper containing portion and the second copper containing portion that is not in direct contact with the at least one manganese silicon oxide layer is in direct contact with a metal interconnect structure.

8. The bonded assembly of claim 2, wherein the at least one manganese silicon oxide layer comprises a single continuous manganese silicon oxide layer contacting each surface the first bonding pad and the second bonding pad except a surface of the first bonding pad that contacts a first metal interconnect structure located on a backside of the first bonding pad and except a surface of the second bonding ad that contacts a second metal interconnect structure located on a backside of the second bonding pad.

9. The bonded assembly of claim 2, wherein the at least one manganese silicon oxide layer comprises:

a first manganese silicon oxide layer in contact with the first copper containing portion and the second silicon oxide layer; and a second manganese silicon oxide layer in contact with the second copper containing portion and the first silicon oxide layer.

10. The bonded assembly of claim 2, wherein the at least one manganese silicon oxide layer comprises a pair of manganese silicon oxide layers that are laterally spaced apart from each other by the second copper containing portion, are in contact with the first copper containing portion, and are in contact with the second silicon oxide layer which laterally surrounds the second copper containing portion.

11. The bonded assembly of claim 2, wherein:

the first bonding pad and the second bonding pad each comprise at least one metallic barrier liner comprising a respective conductive metal or metal nitride material;

a backside surface of the first bonding pad contacts a first metal interconnect structure embedded in the first semiconductor die;

a backside surface of the second bonding pad contacts a second metal interconnect structure embedded in the second semiconductor die: and a combination of the first copper containing portion and the second copper containing portion is encapsulated by a combination of the at least one manganese silicon oxide layer, the at least one metallic barrier liner, the first metal interconnect structure, and the second metal interconnect structure.

12. The bonded assembly of claim 2, wherein:

a backside surface of the first bonding pad contacts a first metal interconnect structure embedded in the first semiconductor die;

a backside surface of the second bonding pad contacts a second metal interconnect structure embedded in the second semiconductor die; and a combination of the first copper containing portion and the second copper containing portion is encapsulated by a combination of the at least one manganese silicon oxide layer, the first metal interconnect structure, and the second metal interconnect structure.

13. The bonded assembly of claim 2, wherein at least one of the first copper containing portion and the second copper containing portion consists essentially of copper.

14. The bonded assembly of claim 1, wherein at least one of the first copper containing portion and the second copper containing portion comprises a copper-manganese alloy.

15. The bonded assembly of claim 1, wherein the second silicon oxide layer is in direct contact with the first silicon oxide layer.

16. The bonded assembly of claim 1, wherein the second silicon oxide layer is bonded to the first silicon oxide layer by dielectric-to-dielectric bonding.

17. The bonded assembly of claim 1, wherein the at least one metal silicon oxide layer is in direct contact with the first silicon oxide layer.

18. The bonded assembly of claim 1, wherein the at least one metal silicon oxide layer is in direct contact with the second silicon oxide layer.

19. The bonded assembly of claim 1, wherein the at least one metal silicon oxide layer contacts all the sidewalls of the first bonding pad.

20. The bonded assembly of claim 1, wherein the at least one metal silicon oxide layer contacts a surface segment of the first silicon oxide layer that is parallel to and is vertically spaced from a bonding interface between the first semiconductor die and the second semiconductor die.

* * * * *